(12) United States Patent
Hashimoto et al.

(10) Patent No.: US 7,323,735 B2
(45) Date of Patent: *Jan. 29, 2008

(54) METHOD OF MANUFACTURING SEMICONDUCTOR INTEGRATED CIRCUIT DEVICE HAVING CAPACITOR ELEMENT

(75) Inventors: Naotaka Hashimoto, Koganei (JP); Yutaka Hoshino, Higashimurayama (JP); Shuji Ikeda, Koganei (JP)

(73) Assignee: Renesas Technology Corp., Tokyo (JP)

( * ) Notice: Subject to any disclaimer, the term of this patent is extended or adjusted under 35 U.S.C. 154(b) by 49 days.

This patent is subject to a terminal disclaimer.

(21) Appl. No.: 11/172,931

(22) Filed: Jul. 5, 2005

(65) Prior Publication Data

US 2005/0242405 A1 Nov. 3, 2005

Related U.S. Application Data

(60) Continuation of application No. 10/756,305, filed on Jan. 14, 2004, which is a continuation of application No. 10/270,193, filed on Oct. 15, 2002, now Pat. No. 6,737,712, which is a continuation of application No. 09/998,628, filed on Dec. 3, 2001, now Pat. No. 6,476,453, which is a continuation of application No. 09/835,419, filed on Apr. 17, 2001, now Pat. No. 6,396,111, which is a division of application No. 09/434,385, filed on Nov. 5, 1999, now Pat. No. 6,245,611, which is a continuation of application No. 09/066,763, filed on Apr. 28, 1998, now Pat. No. 6,030,865, which is a division of application No. 08/682,243, filed on Jul. 17, 1996, now Pat. No. 5,780,910.

(30) Foreign Application Priority Data

Jul. 18, 1995 (JP) .................... 7-181513

(51) Int. Cl.
*H01L 27/108* (2006.01)

(52) U.S. Cl. .............. 257/296; 257/298; 257/393; 257/E27.098; 257/E27.099

(58) Field of Classification Search ........ 257/296–298, 257/300, 393, E27.098, E27.099
See application file for complete search history.

(56) References Cited

U.S. PATENT DOCUMENTS 4,984,200 A  1/1991  Saitoo et al.

(Continued)

FOREIGN PATENT DOCUMENTS

EP       0342466       11/1989

(Continued)

OTHER PUBLICATIONS

Verhaar, et al., "A 25 µm² bulk Full CMOS SRAM Cell Technology with Fully Overlapping contacts", Philips Research Laboratories, 1990 IEEE, 18.2.1-18.2.4.

(Continued)

*Primary Examiner*—Kenneth Parker
*Assistant Examiner*—Matthew E. Warren
(74) *Attorney, Agent, or Firm*—Antonelli, Terry, Stout & Kraus, LLP.

(57) ABSTRACT

In a complete CMOS SRAM having a memory cell composed of six MISFETs formed over a substrate, a capacitor element having a stack structure is formed of a lower electrode covering the memory cell, an upper electrode, and a capacitor insulating film (dielectric film) interposed between the lower electrode and the upper electrode. One electrode (the lower electrode) of the capacitor element is connected to one storage node of a flip-flop circuit, and the other electrode (the upper electrode) is connected to the other storage node. As a result, the storage node capacitance of the memory cell of the SRAM is increased to improve the soft error resistance.

6 Claims, 60 Drawing Sheets

U.S. PATENT DOCUMENTS

| | | | |
|---|---|---|---|
| 5,072,286 A | 12/1991 | Minami et al. | |
| 5,126,285 A | 6/1992 | Kosa et al. | |
| 5,162,259 A | 11/1992 | Kolar et al. | |
| 5,194,749 A | 3/1993 | Meguro et al. | |
| 5,237,187 A | 8/1993 | Suwanai et al. | |
| 5,239,196 A | 8/1993 | Ikeda et al. | |
| 5,324,961 A | 6/1994 | Rodder | |
| 5,388,067 A | 2/1995 | Sato et al. | |
| 5,426,324 A | 6/1995 | Raieevakumar | |
| 5,483,083 A | 1/1996 | Meguro et al. | |
| 5,523,966 A | 6/1996 | Idei et al. | |
| 5,530,807 A | 6/1996 | Baker et al. | |
| 5,631,863 A | 5/1997 | Fechner et al. | |
| 5,635,731 A | 6/1997 | Ashida | |
| 5,652,457 A | 7/1997 | Ikeda et al. | |
| 5,684,315 A | 11/1997 | Uchiyama et al. | |
| 5,780,910 A * | 7/1998 | Hashimoto et al. | 257/393 |
| 5,834,851 A | 11/1998 | Ikeda et al. | |
| 5,858,845 A | 1/1999 | Cheffings | |
| 2001/0023965 A1 | 9/2001 | Ikeda et al. | |

FOREIGN PATENT DOCUMENTS

| | | |
|---|---|---|
| JP | 62-154296 | 7/1987 |
| JP | 02-087392 | 3/1990 |
| JP | 2-103795 | 4/1990 |
| JP | 3-114256 | 5/1991 |
| JP | 3-183162 | 8/1991 |
| JP | 3-234058 | 10/1991 |
| JP | 4-180262 | 6/1992 |
| JP | 05-275645 | 10/1993 |
| JP | 6-151771 | 5/1994 |
| JP | 7-161844 | 6/1995 |
| KR | 1993-0005215 | 3/1993 |
| KR | 1994-0016879 | 7/1994 |
| WO | WO 02/061840 | 8/2002 |

OTHER PUBLICATIONS

Office Action dated Jun. 25, 2002, in corresponding Japanese Patent Application.

Korean Office Action, dated Apr. 27, 2005 for Application No. 10-2004-0048902.

* cited by examiner

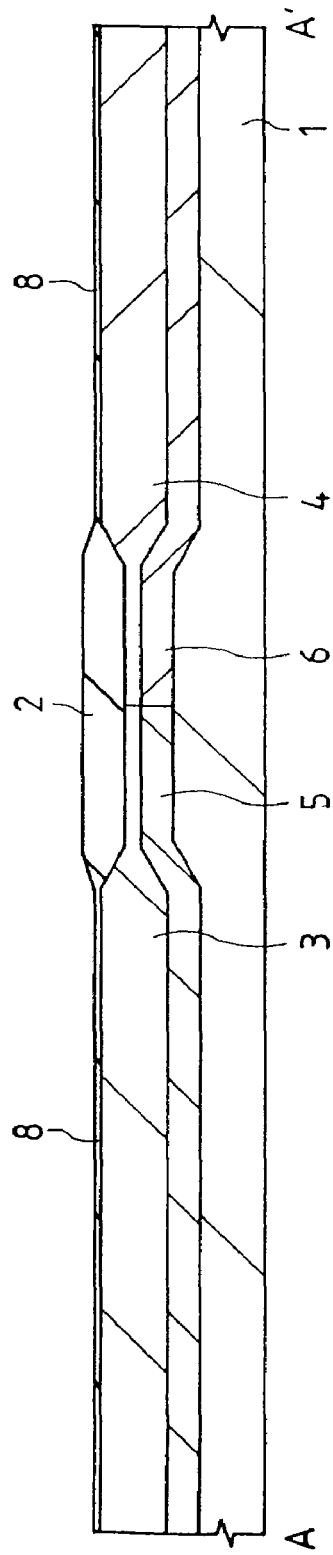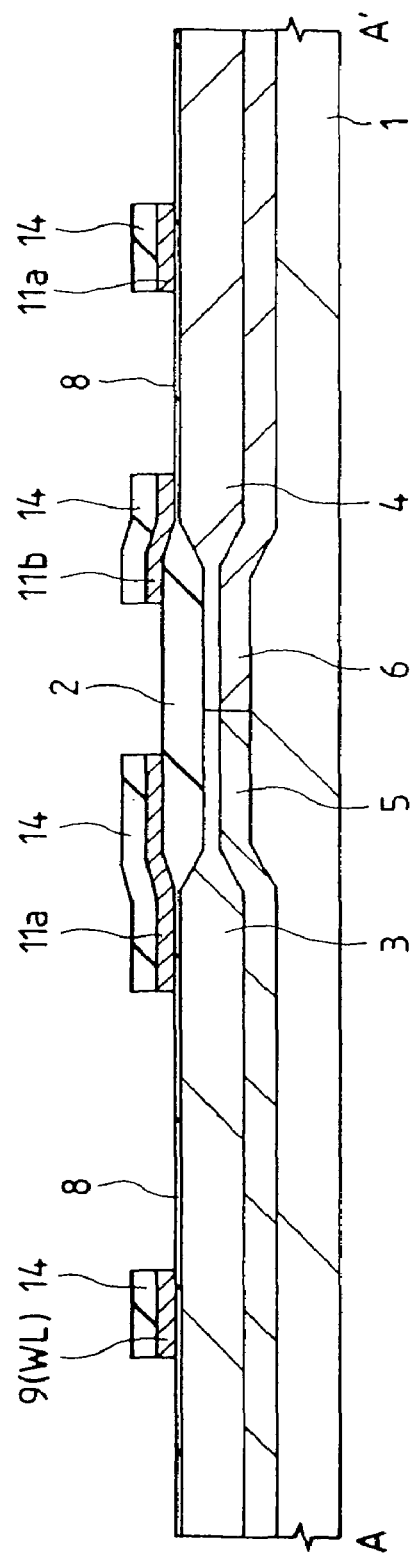

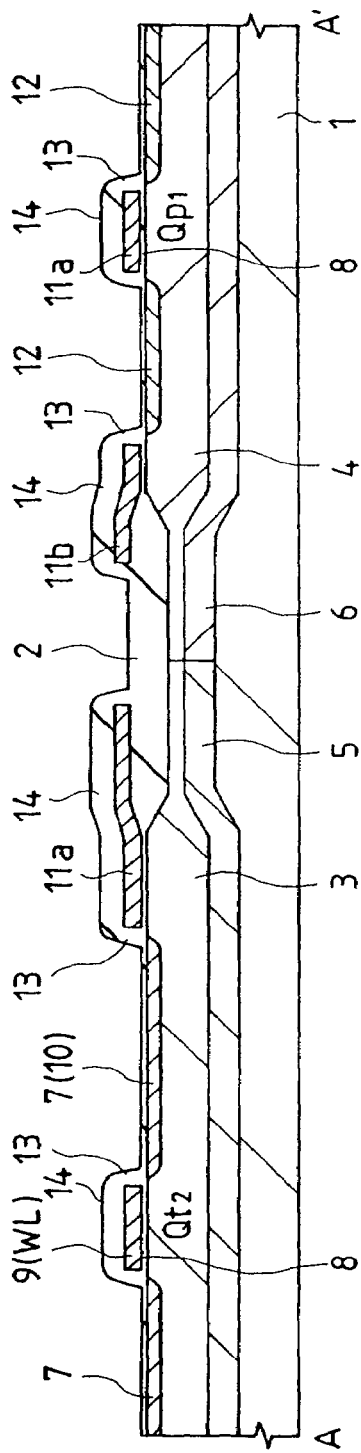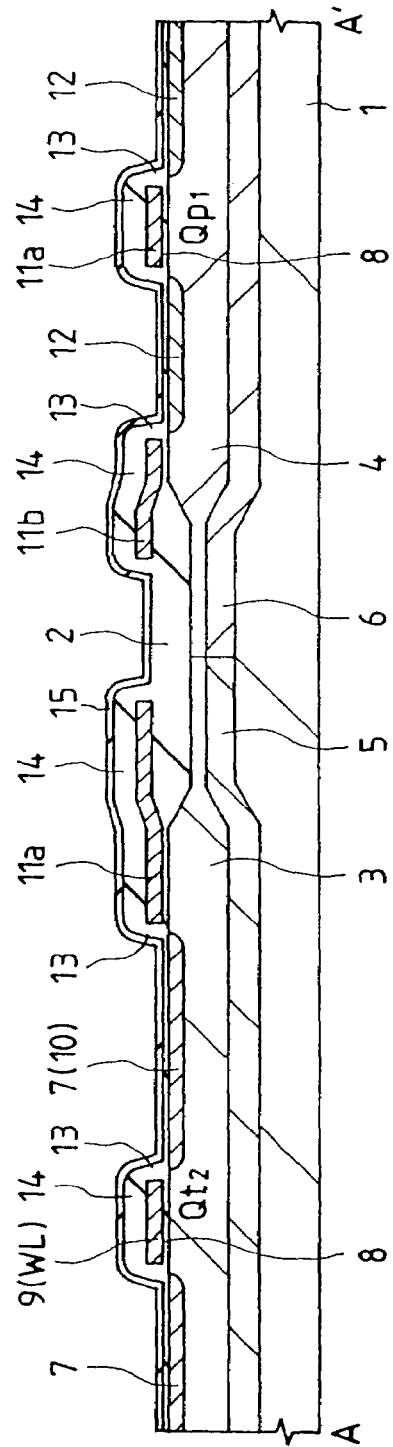

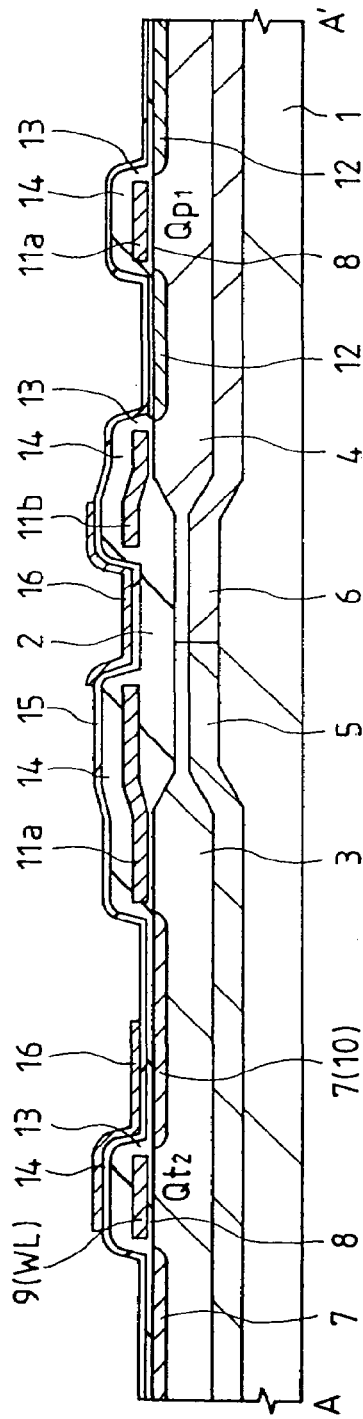
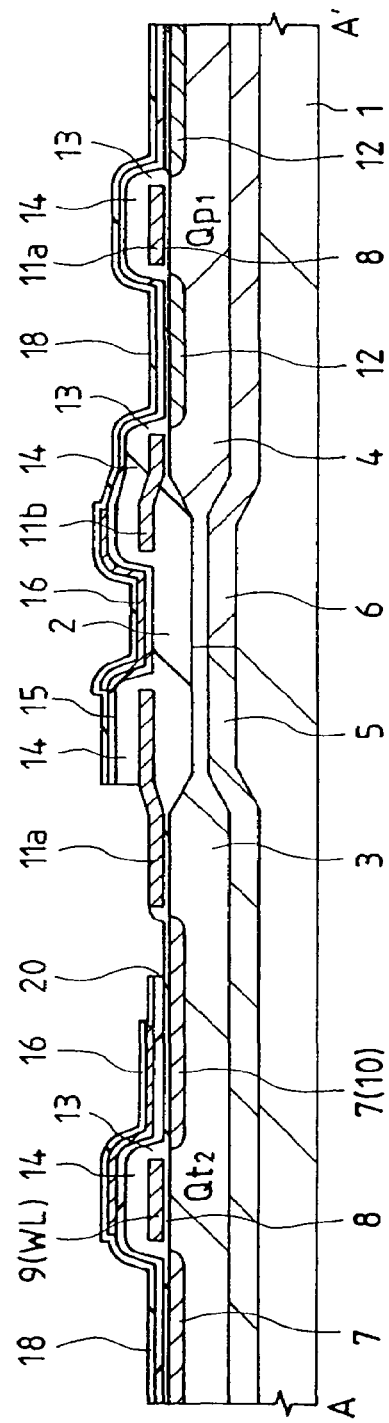

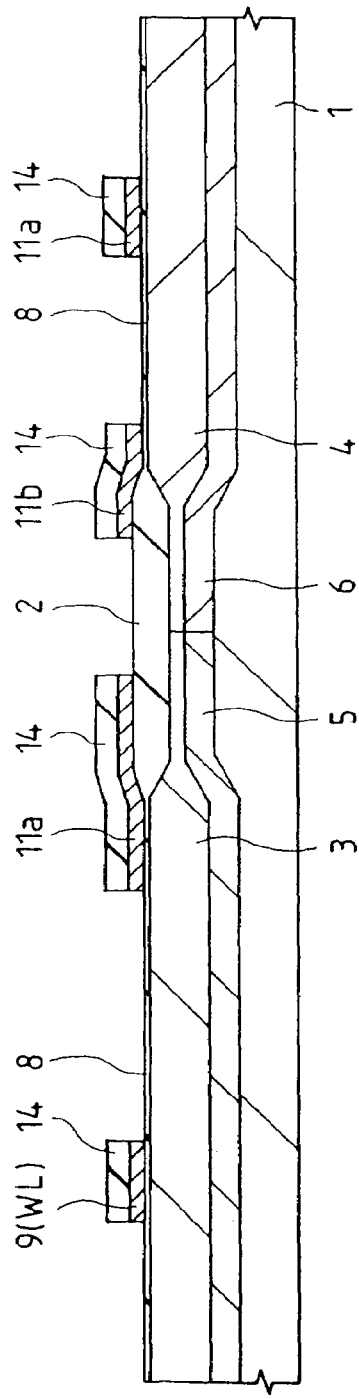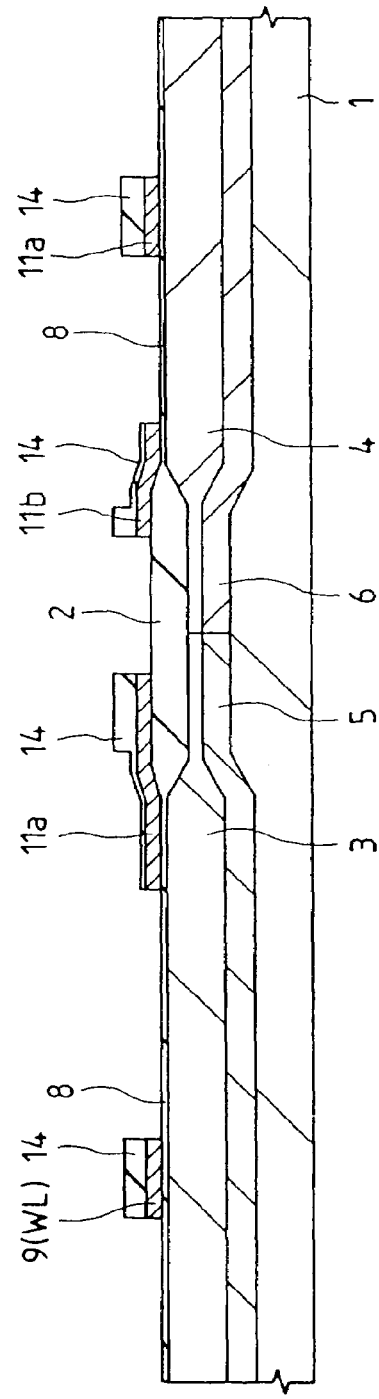

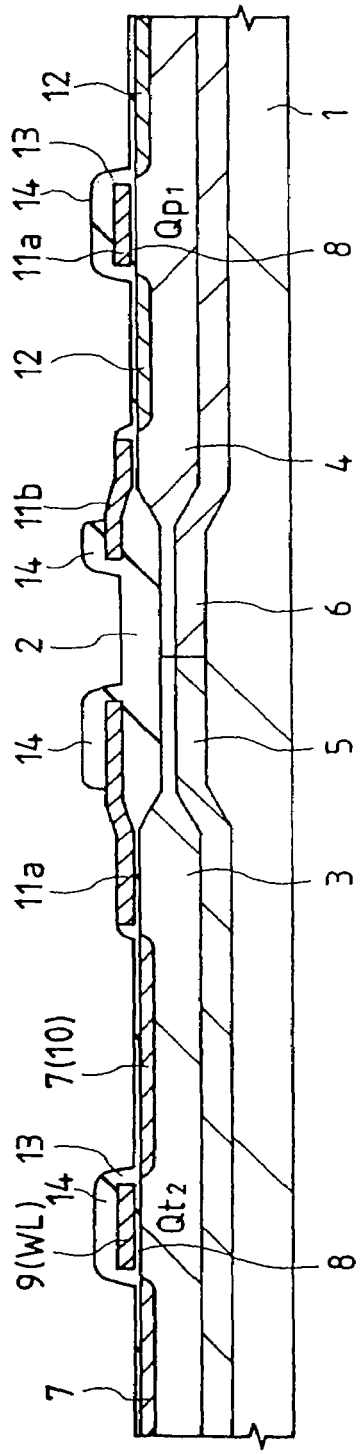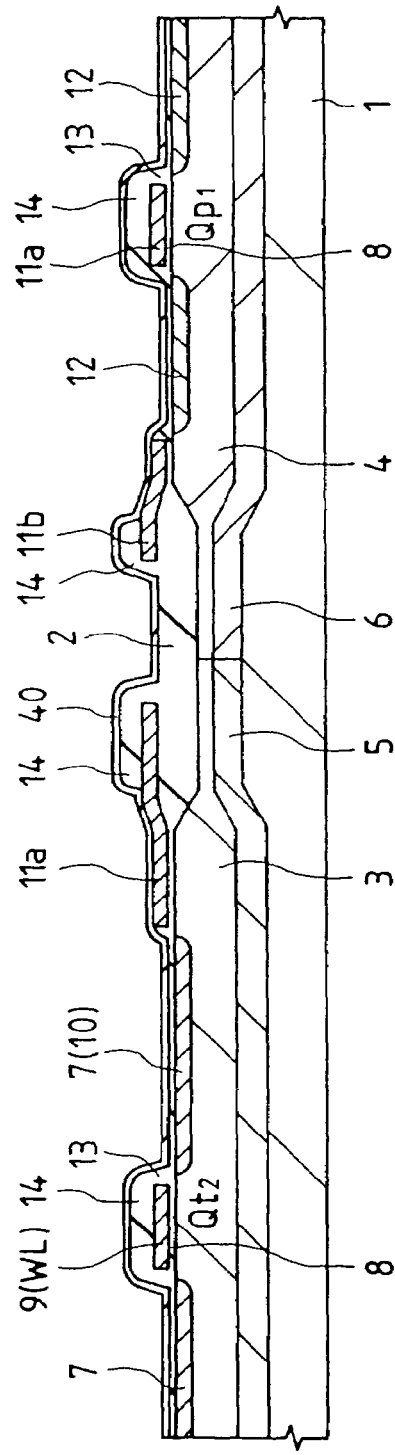

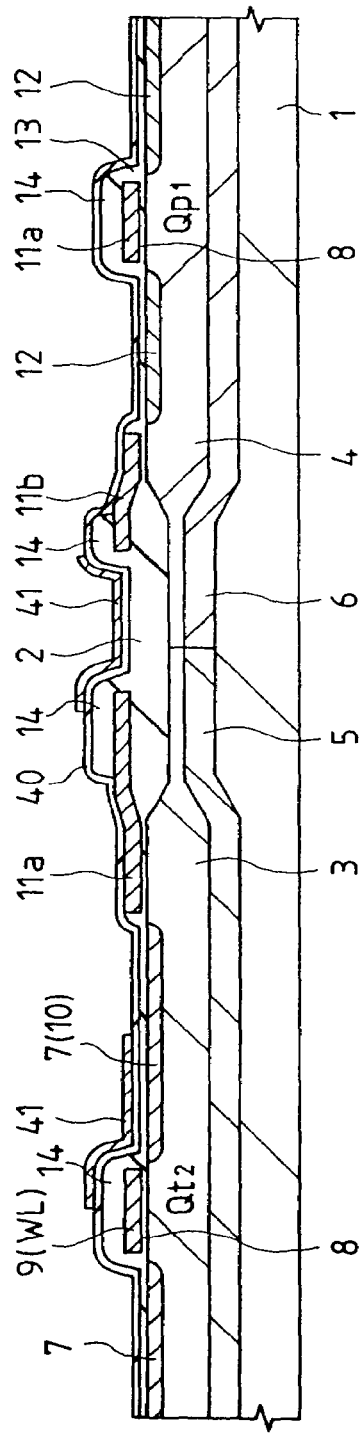
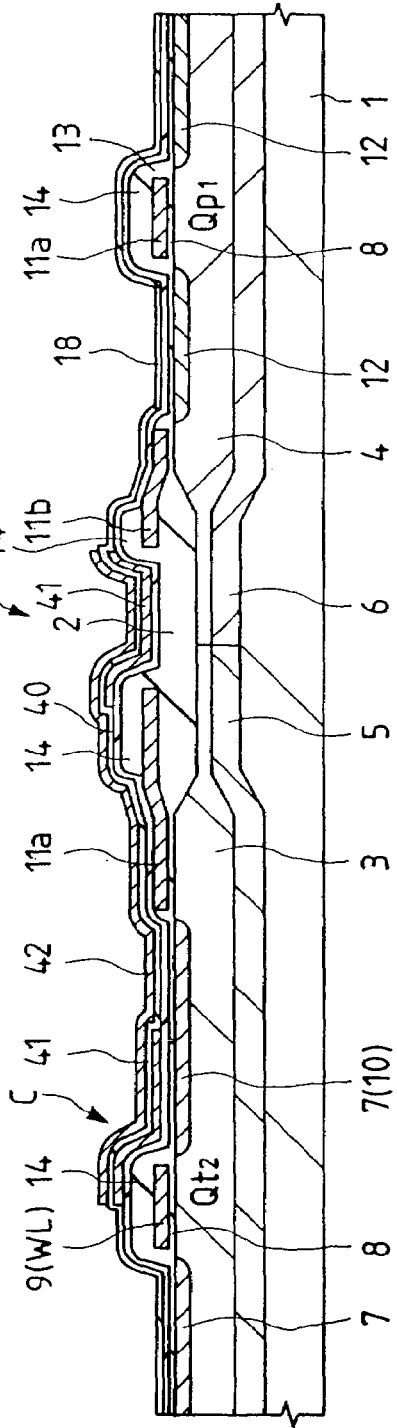

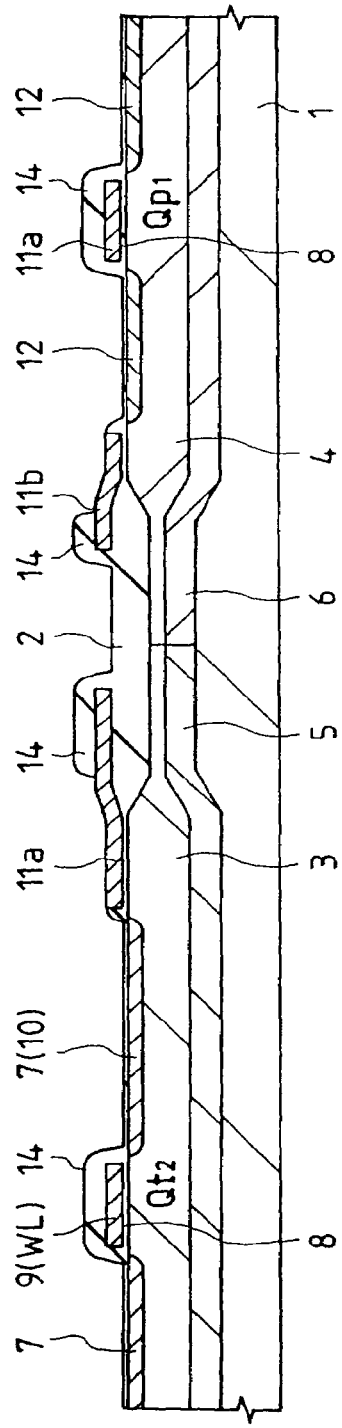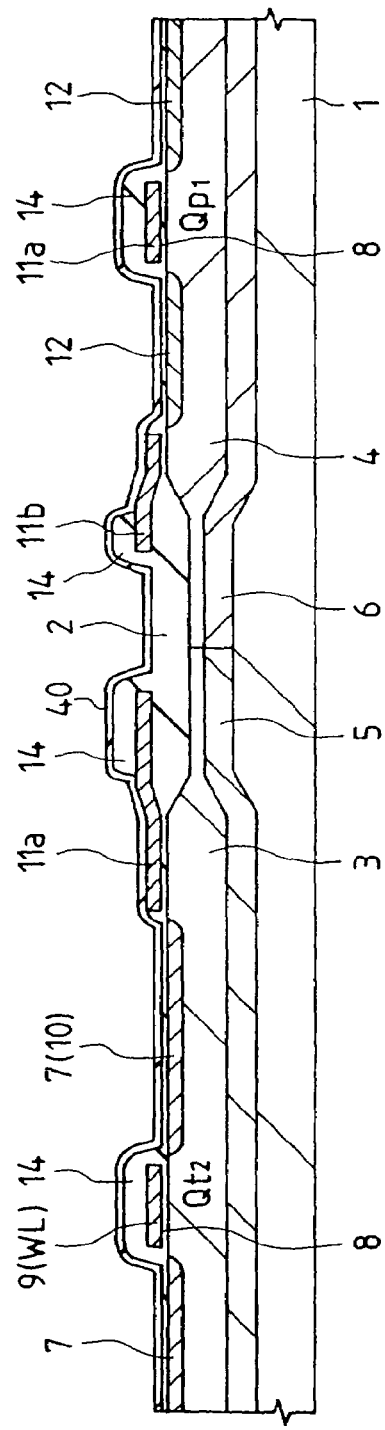

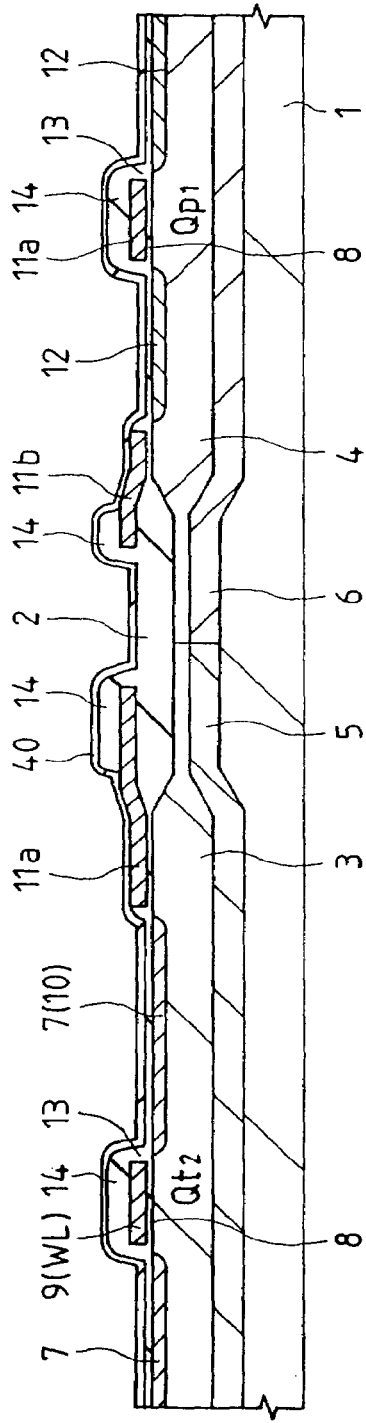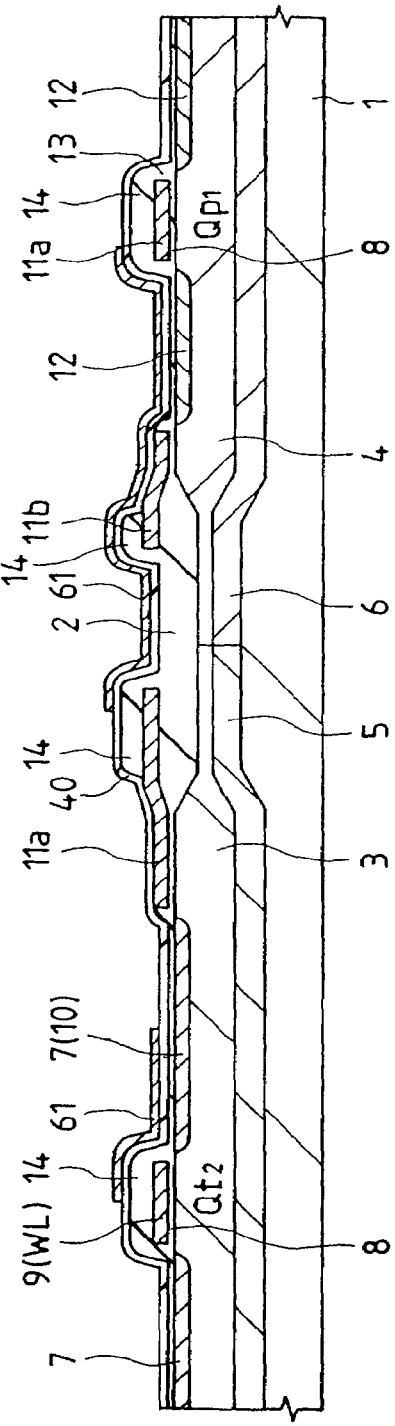

METHOD OF MANUFACTURING SEMICONDUCTOR INTEGRATED CIRCUIT DEVICE HAVING CAPACITOR ELEMENT

This application is a Continuation application of application Ser. No. 10/756,305, filed Jan. 14, 2004, which is a Continuation application of application Ser. No. 10/270,193, filed Oct. 15, 2002 now U.S. Pat. No. 6,737,712, which is a Continuation application of Ser. No. 09/998,628, filed Dec. 3, 2001 now U.S. Pat. No. 6,476,453, which is a Continuation application of Ser. No. 09/835,419, filed Apr. 17, 2001 now U.S. Pat. No. 6,396,111, which is a Divisional application of Ser. No. 09/434,385, filed Nov. 5, 1999 now U.S. Pat. No. 6,245,611, which is a Continuation application of Ser. No. 09/066,763, filed Apr. 28, 1998 now U.S. Pat. No. 6,030,865, which is a Divisional application of Ser. No. 08/682,243, filed Jul. 17, 1996 now U.S. Pat. No. 5,780,910, the contents of which are incorporated herein by reference in their entirety.

FIELD OF THE INVENTION

The present invention relates to a semiconductor integrated circuit device and a technique for manufacturing the same and, more particularly, to a technique which is effective when applied to a semiconductor integrated circuit device having an SRAM (Static Random Access Memory).

BACKGROUND OF THE INVENTION

The CMOS SRAM, in which are combined a high resistance load type or complete CMOS (Complementary Metal-Oxide-Semiconductor) type memory cell and a peripheral circuit composed of a complementary MISFET (Metal-Insulator-Semiconductor Field-Effect-Transistor) (CMOS-FET), has been used for a cache memory of a computer or workstation of the prior art.

The memory cell of the CMOS SRAM is composed of a flip-flop circuit for storing information of 1 bit, and two transfer MISFETs. The flip-flop circuit of the high resistance load type is composed of a pair of driver MISFETs and a pair of resistance elements, whereas the flip-flop circuit of the complete CMOS type is composed of a pair of driver MISFETs and a pair of load MISFETs.

In recent years, the SRAM of this kind has been required to miniaturize the memory cell size to increase the capacity and speed and to lower the operating voltage to reduce the power consumption of the system. However, to meet the requirement, a problem that the resistance to soft error due to alpha rays (d-ray) must be solved.

The soft error due to alpha rays is a phenomenon that alpha rays (He nuclei) contained in cosmic rays or emitted from radioactive atoms contained in the resin materials of LSI packages, come into the memory cell to break the information retained in the information storage section.

An alpha particle has an energy of 5 eV and produces an electron-hole pair when it is incident upon the silicon (Si) substrate. When an alpha ray comes into a storage node at a "High" potential level, of the memory cell, the electron produced by the alpha-ray, flows to the storage nodes so that the hole flows to the substrate. As a result, the charge and potential of the storage node instantly decrease to invert the information of the memory cell with a certain probability.

In the case of an SRAM, the increase in the storage node capacitance of the memory cell is effective in improving the aforementioned resistance to soft error due to alpha rays.

U.S. Pat. No. 5,483,083 discloses a TFT (Thin Film Transistor) complete CMOS SRAM in which the load MISFETs are made of two-layered polycrystalline silicon film formed over the driver MISFET. In the SRAM, as disclosed, the gate electrode of one of the load MISFETs is partially extended to above the source or drain region of the other of the load MISFETs, and a-capacitor element is formed of the gate electrode, the source or drain region and a insulating film interposed between the former two so that the storage node capacitance may be increased.

SUMMARY OF THE INVENTION

Thus, in the high resistance load SRAM and the TFT complete CMOS SRAM, countermeasures have been taken in the prior art to increase the storage node capacitance of the memory cell.

It has been considered that in the case of the so-called bulk CMOS SRAM, out of the complete CMOS SRAM, in which all the six MISFETs consisting a memory cell are formed in the semiconductor substrate, any countermeasure to increase the storage node capacitance is unnecessary.

The reason will be described in the following. A bulk CMOS SRAM having load MISFETs formed in a semiconductor substrate has a high current driving ability and a large storage node capacitance because the area of the load MISFETs is relatively large. As a result, sufficient charge can be fed to the storage node even if the potential of the storage node is fluctuated by the incidence of a alpha ray.

However, we have found out the following fact. In the bulk CMOS SRAM, too, the current driving ability of the load MISFETs drops if the miniaturization of the memory cell size further advances. If the operation voltage further drops, the amount of charge stored in the storage node drops, so that the potential fluctuation of the storage node due to alpha rays cannot be suppressed, deteriorating the soft error resistance.

An object of the present invention is to provide a technique capable of improving the soft error resistance of an SRAM adopting the bulk CMOS type.

Another object of the present invention is to provide a technique capable of promoting the miniaturization of the SRAM adopting the bulk CMOS type.

The foregoing and other objects and novel features of the present invention will become apparent from the following description to be made with reference to the accompanying drawings.

The representatives of the invention to be disclosed herein will be summarized in the following.

According to the semiconductor integrated circuit device of the present invention, in a complete CMOS SRAM in which the gate electrodes of a pair of driver MISFETs, a pair of load MISFETs and a pair of transfer MISFETs constituting a memory cell are composed of a first conductive film formed over the principal face of a semiconductor substrate, a capacitor element is composed of a second conductive film formed over the memory cell, an insulating film (dielectric film) formed over the second conductive film, and a third conductive film formed over the insulating film, the second conductive film and one of the storage nodes of the memory cell are electrically mutually connected, and the third conductive film and the other storage node of the memory cell are electrically connected.

In the semiconductor integrated circuit device, the one electrode of the capacitor element and the one storage node are electrically connected to each other through one of a pair of metal wiring lines composed of a first metal film formed over the third conductive film, and the other electrode of the capacitor element and the other storage node are electrically connected to each other through the other of the paired metal wiring lines.

In the semiconductor integrated circuit device of the present invention: the second conductive film constituting the one electrode of the capacitor element and the third conductive film constituting the other electrode of the capacitor element are individually composed of n-type polycrystalline silicon films; the one electrode of the capacitor element is electrically connected to the drain region of one of the paired driver MISFETs through a first contact hole and to one of the paired metal wiring lines through a second contact hole made above the first contact hole; and the other electrode of the capacitor element is electrically connected to the drain region of the other of the paired driver MISFETs through a third contact hole and to the other of the paired metal wiring lines through a fourth contact hole made above the third contact hole.

In the semiconductor integrated circuit device of the present invention: the second conductive film constituting the one electrode of the capacitor element and the third conductive film constituting the other electrode of the capacitor element are individually composed of n-type polycrystalline silicon films; the one electrode of the capacitor element is electrically connected to the one metal wiring line at the side wall of a fifth contact hole for connecting one of the paired metal wiring lines to the drain region of one of the paired driver MISFETs electrically; and the other electrode of the capacitor element is electrically connected to the other metal wiring line at the side wall of a sixth contact hole for connecting the other of the paired metal wiring lines and the drain region of the other of the paired driver MISFETs electrically.

In the semiconductor integrated circuit device of the present invention: the second conductive film constituting the one electrode of the capacitor element and the third conductive film constituting the other electrode of the capacitor element are composed of an n-type polycrystalline silicon film and a p-type polycrystalline silicon film respectively; the one electrode composed of the n-type polycrystalline silicon film is electrically connected to the drain region of the one of the paired driver MISFETs through a seventh contact hole and to the one of the paired metal wiring lines through an eighth contact hole made above the seventh contact hole; and the other electrode composed of the p-type polycrystalline silicon film is electrically connected to the drain region of the other of the paired load MISFETs through a ninth contact hole and to the other of the paired metal wiring lines through a tenth contact hole made above the ninth contact hole.

In the semiconductor integrated circuit device of the present invention, a reference voltage line for feeding a reference voltage to the source regions of the paired driver MISFETs and a power voltage line for feeding a power voltage to the source regions of the paired load MISFETs are composed of the first metal film.

In the semiconductor integrated circuit device of the present invention: a pair of complementary data lines are composed of a second metal film formed over the first metal film; one of the paired complementary data lines is electrically connected to the source region of one of the paired transfer MISFETs through one of a pair of pad layers composed of the first metal film; and the other of the paired complementary data lines is electrically connected to the source region of the other of the paired transfer MISFETs through the other of the paired pad layers.

In the semiconductor integrated circuit device of the present invention, the capacitor element having the second conductive film, an insulating film formed over the second conductive film and a third conductive film formed over the insulating film is formed in the peripheral circuit of the SRAM.

In the semiconductor integrated circuit device of the present invention, the MISFETs constituting the peripheral circuit of the SRAM and the metal wiring lines formed over the third conductive film are electrically connected through the pad layers composed of the second conductive film or the third conductive film.

A process for manufacturing a semiconductor integrated circuit device of the present invention, comprises:
(a) the step of forming the gate electrodes of the driver MISFETs, the load MISFETs and the transfer MISFETs, of a first conductive film over the principal face of a semiconductor substrate;
(b) the step of forming a pair of electrodes and a capacitor insulating film (dielectric film) of a capacitor element, of a second conductive film over the first conductive film, an insulating film over the second conductive film, and a third conductive film over the insulating film; and
(c) the step of forming a pair of metal wiring lines by patterning a first metal film, formed over the third conductive film, to connect one electrode of the capacitor element and one storage node of the memory cell electrically through one of the paired metal wiring lines and to connect the other electrode of the capacitor element and the other storage node of the memory cell electrically through the other of the paired metal wiring lines.

A semiconductor integrated circuit device manufacturing process of the present invention, comprises:
(a) the step of forming the paired driver MISFETs, the paired load MISFETs and the paired transfer MISFETs, and then making a first contact hole reaching the drain region of one of the paired driver MISFETs by etching a first insulating film formed over these MISFETs;
(b) the step of forming one electrode of the capacitor element by patterning the second conductive film of an n-type polycrystalline silicon film, formed over the first dielectric film, to connect one electrode of the capacitor element and the drain region of the one of the driver MISFETs electrically through the first contact hole;
(c) the step of forming the capacitor insulating film (dielectric film) over the one electrode of the capacitor element, and then making a second contact hole reaching the drain region of the other of the paired driver MISFETs and the gate electrode common to the one of the driver MISFETs and one of the paired load MISFETs by etching the capacitor insulating film;
(d) the step of forming the other electrode of the capacitor element by patterning the third conductive film of an n-type polycrystalline silicon film, formed over the capacitor element, to mutually connect the other electrode of the capacitor element, the drain region of the other of the driver MISFETs, and the gate electrode common to the one of the driver MISFETs and the one of the load MISFETs, electrically through the second contact hole;
(e) the step of making a third contact hole reaching the one electrode of the capacitor element, a fourth contact hole reaching the other electrode of the capacitor element, a fifth contact hole reaching the drain region of the one of the driver MISFETs and the gate electrode common to the other of the paired load MISFETs and the other of the driver MISFETs, and a sixth contact hole reaching the drain region of the other of the load MISFETs; and (f) the step of forming, by patterning the first metal film formed over the interlayer insulating film: a first metal wiring line, one end of which is electrically connected through the third contact hole to one electrode of the capacitor element and the other end of which is electrically connected through the fifth contact hole to the drain region of the one of the driver MISFETs and the gate electrode common to the other of the load MISFETs and the other of the driver MISFETs; and a second metal wiring line, one end of which is electrically connected through the fourth contact hole to the other electrode of the capacitor element and the other end of which is electrically connected through the sixth contact hole to the drain region of the other of the load MISFETs.

A semiconductor integrated circuit device manufacturing process of the present invention comprises:

(a) the step of making a seventh contact hole reaching the source region of one of the paired transfer MISFETs and an eighth contact hole reaching the source region of the other of the paired transfer MISFETs;

(b) the step of forming a first pad layer electrically connected to the source region of the one of the transfer MISFETs through the seventh contact hole, and a second pad layer electrically connected to the source region of the other of the transfer MISFETs through the eighth contact hole, by patterning the first metal film;

(c) the step of making a ninth contact hole reaching the first pad layer and a tenth contact hole reaching the second pad layer, by etching a second interlayer insulating film formed over the first metal film; and (d) the step of forming one of complementary data lines electrically connected to the first pad layer through the ninth contact hole and the other of the complementary data lines electrically connected to the second pad layer through the tenth contact hole, by etching a second metal film formed over the second interlayer insulating film.

A semiconductor integrated circuit device manufacturing process of the present invention comprises:

(a) the step of forming, after all of the paired driver MISFETs, the paired load MISFETs and the paired transfer MISFETs have been formed, a first insulating film over all of the MISFETs and then forming one electrode of the capacitor element by patterning the second conductive film of an n-type polycrystalline silicon film, formed over the first insulating film;

(b) the step of forming the other electrode of the capacitor element, after the capacitor insulating film has been formed over the one electrode of the capacitor element, by patterning the third conductive film of an n-type polycrystalline silicon film formed over the insulating film;

(c) the step of making, by etching the first interlayer insulating film formed over the other electrode of the capacitor element: a first contact hole reaching the drain region of one of the paired driver MISFETs through one electrode of the capacitor element; a second contact hole reaching the drain region of one of the paired load MISFETs and the gate electrode connected the other of the paired load MISFETs and the other of the paired driver MISFETs; a third contact hole reaching the drain region of the other of the driver MISFETs and the gate electrode common to the one of the driver MISFETs and the one of the load MISFETs through the other electrode of the capacitor element; and a fourth contact hole reaching the drain region of the other of the load MISFETs; and (d) the step of forming, by patterning the first metal film formed over the interlayer insulating film: a first metal wiring line, one end of which is electrically connected through the first contact hole to one electrode of the capacitor element and the drain region of the one of the driver MISFETs, and the other end of which is electrically connected through the second contact hole to the drain region of the one of the load MISFETs and the gate electrode common to the other of the load MISFETs and the other of the driver MISFETs; and a second metal wiring line, one end of which is electrically connected through the third contact hole to the other electrode of the capacitor element, the drain region of the other of the driver MISFETs and the gate electrode common to the one of the load MISFETs and the one of the driver MISFETs, and the other end of which is electrically connected through the fourth contact hole to the drain region of the other of the load MISFETs.

A semiconductor integrated circuit device manufacturing process of the present invention comprises:

(a) the step of forming the paired driver MISFETs, the paired load MISFETs and paired transfer MISFETs, and then making a first contact hole reaching the drain region of the other of the paired load MISFETs by etching the first insulating film formed over all of the MISFETs;

(b) the step of forming one electrode of the capacitor element by patterning the second conductive film composed of a p-type polycrystalline silicon film formed over the first insulating film to connect one electrode of the capacitor element and the drain region of the other of the load MISFETs electrically through the first contact hole;

(c) the step of forming the insulating film over the one electrode of the capacitor element, and making a second contact hole reaching the drain region of the one of the paired driver MISFETs, by etching the insulating film;

(d) the step of forming the other electrode of the capacitor element by patterning the third conductive film of an n-type polycrystalline silicon film formed over the insulating film to connect the other electrode of the capacitor element and the drain region of the one of the driver MISFETs electrically through the second contact hole;

(e) the step of making, by etching the first interlayer insulating film formed over the other electrode of the capacitor element: a third contact hole reaching the one electrode of the capacitor element; a fourth contact hole reaching the other electrode of the capacitor element; a fifth contact hole reaching the drain region of the one of the driver MISFETs and the gate electrode common to the other of the load MISFETs and the other of the paired driver MISFETs; and a sixth contact hole reaching the drain region of the other of the driver MISFETs, the one of the paired load MISFETs and the one of the driver MISFETs; and (f) the step of forming, by patterning the first metal film formed over the interlayer insulating film: a first metal wiring line one end of which is electrically connected through the fourth contact hole to the other electrode of the capacitor element and the other end of which is electrically connected through the sixth contact hole to the drain region of the one of the load MISFETs and the gate electrode common to the other of the load MISFETs and the other of the driver MISFETs; and a second metal wiring line one end of which is electrically connected through the third contact hole to the one electrode of the capacitor element and the other end of which is electrically connected through the sixth contact hole to the drain region of the other of the driver MISFETs and the gate electrode common to the one of the load MISFETs and the one of the driver MISFETs.

A semiconductor integrated circuit device manufacturing process of the present invention comprises: the step of thinning, prior to the step of making contact holes reaching both the gate electrode common to the one of the paired driver MISFETs and the one of the paired load MISFETs and the gate electrode common to the other of the paired driver MISFETs and the other of the paired load MISFETs by etching the first interlayer insulating film, a portion of the insulating film covering the individual ones of the gate electrodes.

According to the means described above, one of the electrodes of the capacitor element composed of the second conductive film, the third conductive film and the insulating film interposed between the two conductive films, is connected to one storage node, and the other electrode is connected to the other storage node, so that sufficient charge is fed to the storage nodes through the capacitor element. As a result, even when the memory cell is miniaturized or when the operating voltage is lowered, the potential fluctuation of the storage nodes due to alpha rays is suppressed to improve the soft error resistance of the memory cell.

By constructing a capacitor element of the peripheral circuit using the two-layered conductive film deposited on the semiconductor substrate, according to the means described above, the area occupied by the elements can be made smaller than that of the capacitor element using a diffused layer (pn junction) formed over the semiconductor substrate, so that the area of the peripheral circuit can be reduced to raise the degree of integration of the SRAM.

By connecting the semiconductor regions of the MISFETs and the wiring lines through the pad layers which are formed at the same step as that of the electrodes of the capacitor element, according to the means described above, the mask aligning margin at the time when the connection is made over the semiconductor region by etching using a photoresist as the mask can be reduced to reduce the area of the MISFETs and thereby to raise the degree of integration of the SRAM.

By thinning a portion of the insulating film covering the gate electrodes prior to the step of making contact holes reaching the gate electrodes, according to the means described above, the gate electrodes can be exposed by etching in a short time, so that the remaining regions can be prevented from being over-etched to prevent the erosion of the field dielectric film.

BRIEF DESCRIPTION OF THE DRAWINGS

FIG. 5 is a section of an essential portion of the semiconductor substrate and shows a first manufacturing process of the memory cell of the SRAM of the present invention;

FIG. 7 is a section of an essential portion of the semiconductor substrate and shows the first manufacturing process of the memory cell of the SRAM of the present invention;

FIG. 9 is a section of an essential portion of the semiconductor substrate and shows the first manufacturing process of the memory cell of the SRAM of the present invention;

FIG. 10 is a section of an essential portion of the semiconductor substrate and shows the first manufacturing process of the memory cell of the SRAM of the present invention;

FIG. 12 is a section of an essential portion of the semiconductor substrate and shows the first manufacturing process of the memory cell of the SRAM of the present invention;

FIG. 14 is a section of an essential portion of the semiconductor substrate and shows the first manufacturing process of the memory cell of the SRAM of the present invention;

FIG. 24 is a section of an essential portion of the semiconductor substrate and shows a second manufacturing process of the memory cell of the SRAM of the present invention;

FIG. 25 is a section of an essential portion of the semiconductor substrate and shows the second manufacturing process of the memory cell of the SRAM of the present invention;

FIG. 26 is a section of an essential portion of the semiconductor substrate and shows the second manufacturing process of the memory cell of the SRAM of the present invention;

FIG. 27 is a section of an essential portion of the semiconductor substrate and shows the second manufacturing process of the memory cell of the SRAM of the present invention;

FIG. 28 is a section of an essential portion of the semiconductor substrate and shows the second manufacturing process of the memory cell of the SRAM of the present invention;

FIG. 30 is a section of an essential portion of the semiconductor substrate and shows the second manufacturing process of the memory cell of the SRAM of the present invention;

FIG. 38($b$) is a section of an essential portion of a one-chip microcomputer in which the memory cells of the SRAM of the present invention and the memory cells of a DRAM are mixedly provided;

FIG. 38($c$) shows an equivalent circuit diagram of a memory cell of a DRAM;

FIG. 40 is a section of an essential portion of the semiconductor substrate and shows a third manufacturing process of the memory cell of the SRAM of the present invention;

FIG. 41 is a section of an essential portion of the semiconductor substrate and shows the third manufacturing process of the memory cell of the SRAM of the present invention;

FIG. 45 is a section of an essential portion of the semiconductor substrate and shows the third manufacturing process of the memory cell of the SRAM of the present invention;

FIG. 54 is a section of an essential portion of the semiconductor substrate and shows a fourth manufacturing process of the memory cell of the SRAM of the present invention;

FIG. 55 is a section of an essential portion of the semiconductor substrate and shows the fourth manufacturing process of the memory cell of the SRAM of the present invention;

DESCRIPTION OF THE PREFERRED EMBODIMENTS

The present invention will be described in detail in the following in connection with its embodiments with reference to the accompanying drawings. Incidentally, throughout the drawings for explaining the embodiments, what have identical functions will be designated by identical reference symbols, and their repeated descriptions will be omitted.

Embodiment 1

Figure 4:
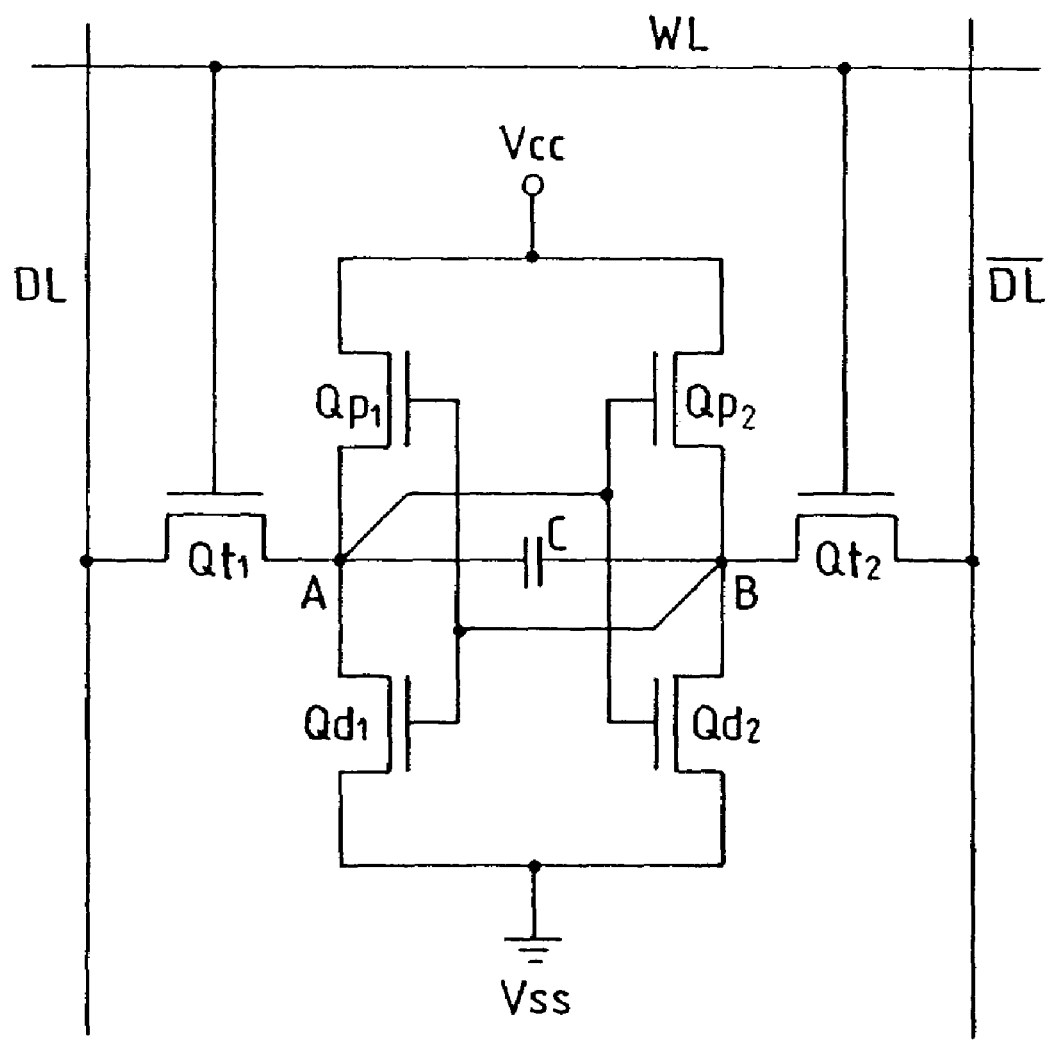
FIG. 4 is an equivalent circuit diagram of the memory cell of the SRAM of the present invention.

FIG. 4 is an equivalent circuit diagram of a memory cell of an SRAM of the present embodiment. As shown, this memory cell is constructed of a pair of driver MISFETs $Qd_1$ and $Qd_2$, a pair of load MISFETs $Qp_1$ and $Qp_2$ and a pair of transfer MISFETs $Qt_1$ and $Qt_2$, which are arranged at the intersections of a pair of complementary data lines (i.e., a data line DL and a data line/(bar) DL) and a word line WL. The driver MISFETs $Qd_1$ and $Qd_2$ and the transfer MISFETs $Qt_1$ and $Qt_2$ are of n-channel type, whereas the load MISFETs $Qp_1$ and $Qp_2$ are of p-channel type. In other words, the memory cell is of complete CMOS type using the four n-channel MISFETs and the two p-channel MISFETs.

Of the six MISFETs constituting the aforementioned memory cell, the paired driver MISFETs $Qd_1$ and $Qd_2$ and the paired load MISFETs $Qp_1$ and $Qp_2$ constitute together a flip-flop circuit serving as an information storage unit for storing information of 1 bit. One (storage node A) of the input/output terminals of the flip-flop circuit is connected to the source region of the transfer MISFET $Qt_1$, and the other input/output terminal (storage node B) is connected to the source region of the transfer MISFET $Qt_1$.

The drain region of the transfer MISFET $Qt_1$ is connected to the data line DL whereas the drain region of the transfer MISFET $Qt_2$ is connected to the data line /DL. On the other hand, one terminal (the source regions of the load MISFETs $Qp_1$ and $Qp_2$) of the flip-flop circuit is connected to a power supply voltage of a first voltage (Vcc), whereas the other terminal (the source regions of the driver MISFETs $Qd_1$ and $Qd_2$) is connected to a reference voltage of a second voltage (Vss). The power supply voltage (Vcc) is 3 V, for example, whereas the reference voltage (Vss) is 0 V (GND), for example. The first voltage and the second voltage are in the relation, the first voltage>the second voltage.

The SRAM of the present embodiment is characterized in that the memory cell is provided with a capacitor element C having a stack structure, as will be detailed in the following, one electrode of which is connected to one storage node (storage node A) of the flip-flop circuit and the other electrode of which is connected to the other storage node (storage node B).

Figure 1:
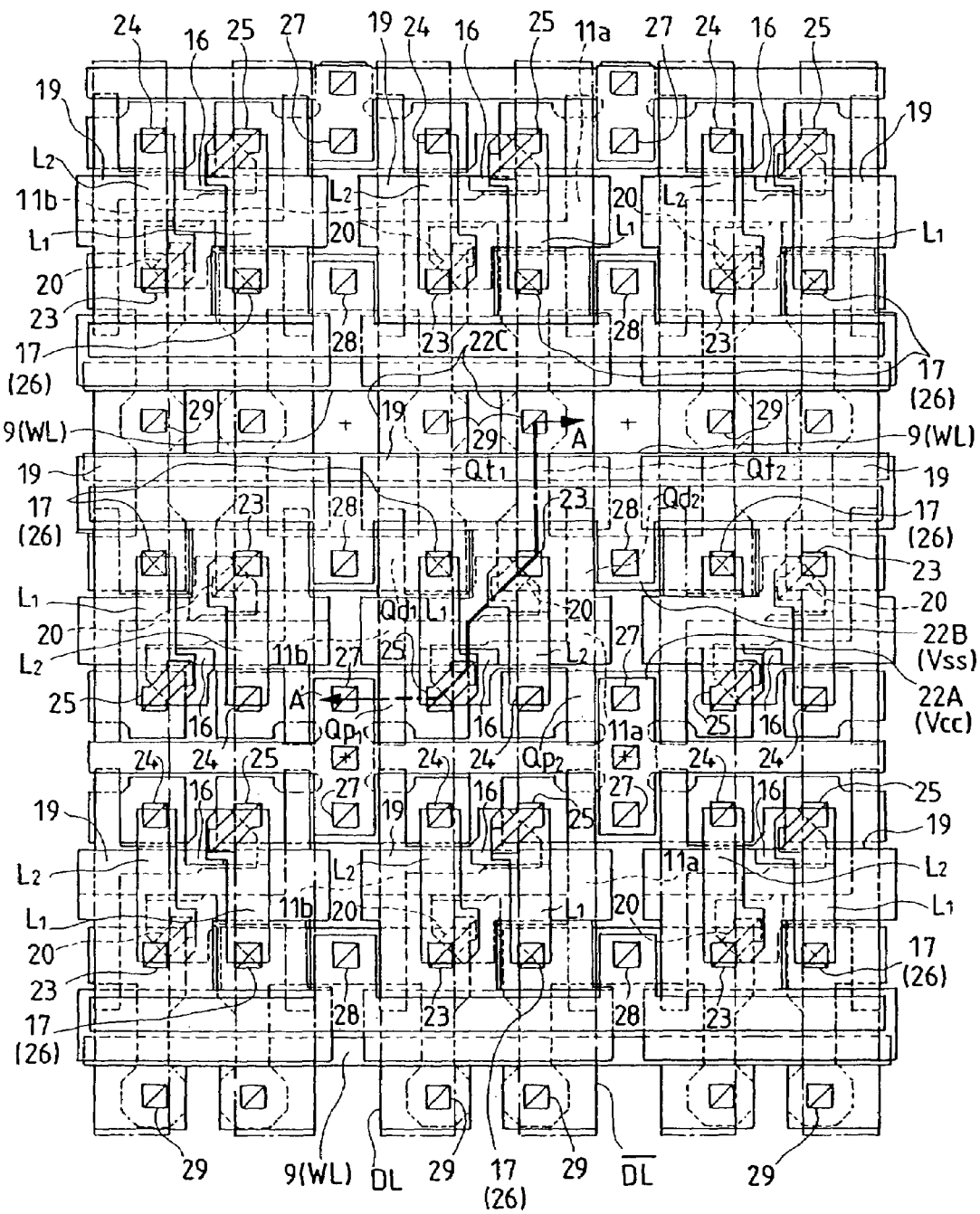
FIG. 1 is a top plan view showing (about nine) memory cells of an SRAM of one embodiment of the present invention.
Figure 2A:
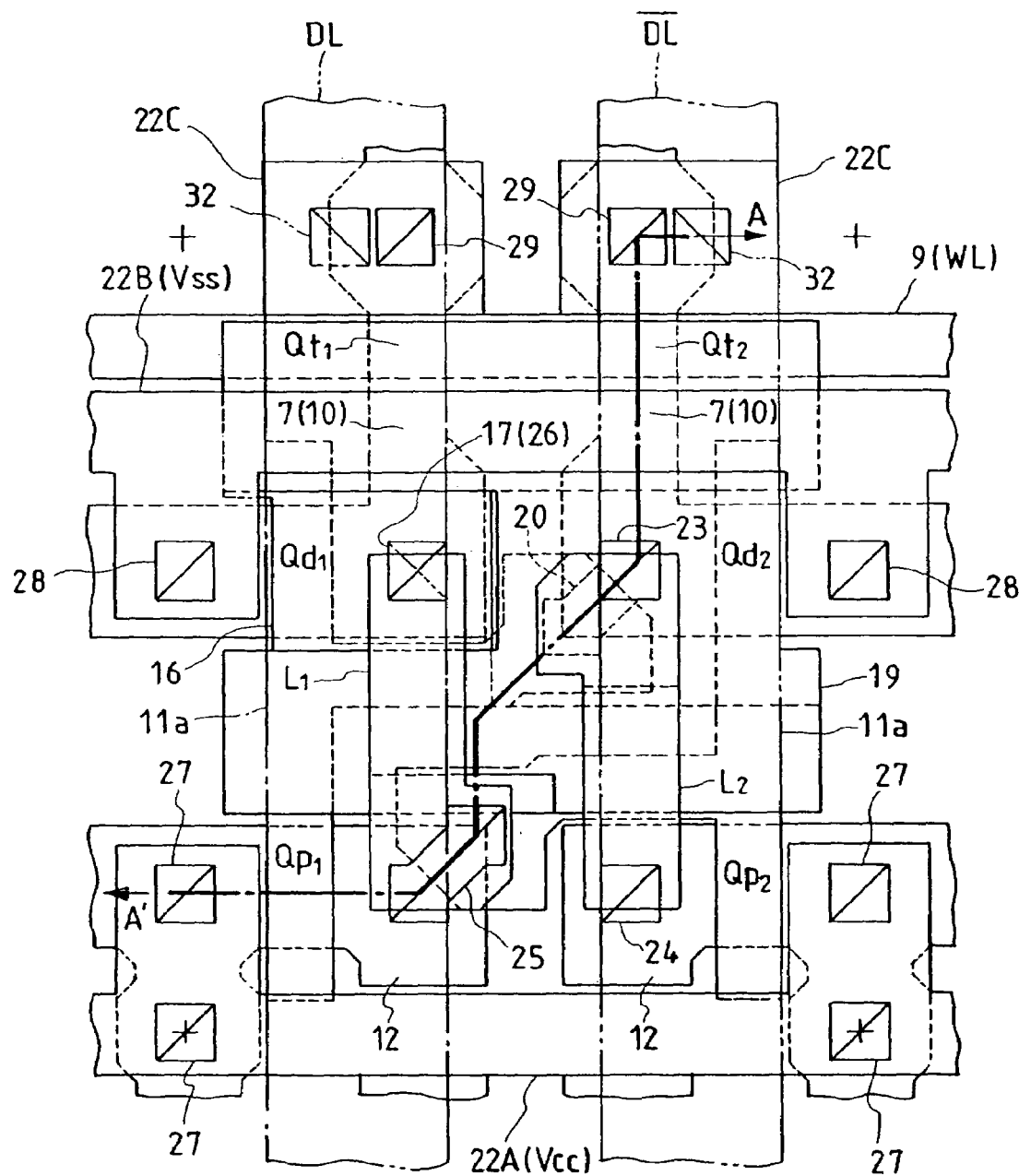
FIGS. 2(a) to 2(e) are enlarged top plan views showing a memory cell of the SRAM of the embodiment of the present invention.

Here will be described the specific construction of the memory cell with reference to FIG. 1 (a top plan view showing about nine memory cells), FIG. 2(a) (an enlarged top plan view showing about one memory cell), and FIGS. 2(b) to 2(e) and FIG. 3 (sections taken along line A-A' of FIG. 1 and FIG. 2(a)). Incidentally, FIG. 1 and FIG. 2(a) show only the conductive films constituting the memory cells and the contact holes mutually connecting the conductive films, but not the insulating films for isolating the conductive films from each other. FIGS. 2(b) to 2(e) are enlarged top plan views of the conductive films of FIG. 2(a).

The six MISFETs constituting the memory cell are formed in the active region which is surrounded by a field insulating film 2 over the principal face of a semiconductor substrate 1 made of single crystal silicon. The driver MISFETs $Qd_1$ and $Qd_2$ and the transfer MISFETs $Qt_1$ and $Qt_2$ of n-channel type are formed in the active region of a p-type well 3, and the load MISFETs $Qp_1$ and $Qp_2$ of p-channel type are formed in the active region of an n-type well 4. A p-type buried layer 5 is formed in the semiconductor substrate 1 below the p-type well, and an n-type buried layer 6 is formed in the semiconductor substrate 1 below the n-type well 4.

The paired transfer MISFETs $Qt_1$ and $Qt_2$ comprises: an n-type semiconductor region 7 (source region and drain region) formed in the active region of the p-type well 3; a gate insulating film 8 composed of a silicon oxide film formed over the surface of that active region; and a gate electrode 9 composed of a first-level layer n-type polycrystalline silicon film (a multilayer polycide film composed of a polycrystalline silicon film and a refractory metal silicide film) formed over that gate insulating film. The gate electrodes of the transfer MISFETs $Qt_1$ and $Qt_2$ are formed integrally with the word line WL.

The paired driver MISFETs $Qd_1$ and $Qd_2$ comprises: an n-type semiconductor region 10 (source region and drain region) formed in the active region of the p-type well 3; the gate insulating film 8 formed over the surface of that active region; and gate electrodes 11a and 11b made of a first level layer n-type polycrystalline silicon film (polycide film) formed over that gate insulating film 8. The drain region (the n-type semiconductor region 10) of the driver MISFET $Qd_1$ is formed in the active region similarly to the source region (the n-type semiconductor region 7) of the transfer MISFET $Qt_1$, and the drain region (the n-type semiconductor region 10) of the driver MISFET $Qd_2$ is formed in the active region similarly to the source region (the n-type semiconductor region 7) of the transfer MISFET $Qt_2$.

Figure 2B:
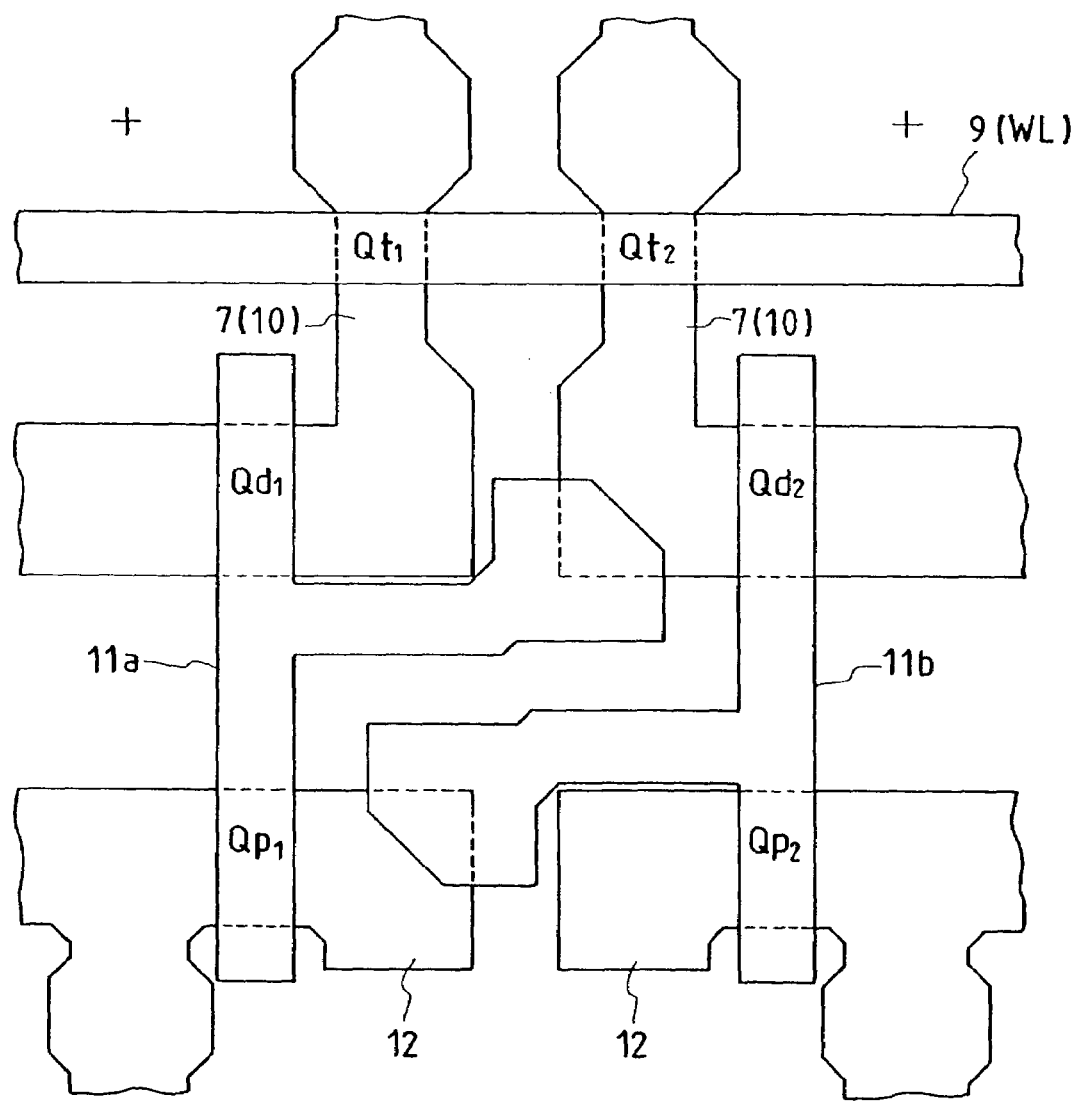

The paired load MISFETs $Qp_1$ and $Qp_2$ comprises: a p-type semiconductor region 12 (source region and drain region) formed in the active region of the n-type well 4; the gate insulating film formed over the surface of that active region; and the gate electrodes 11a and 11b made of the first level layer n-type polycrystalline silicon film (polycide film) formed over that gate insulating film 8. The gate electrode 11a of the load MISFET $Qp_1$ is formed integrally with the gate electrode 11a of the driver MISFET $Qd_1$, and the gate electrode 11b of the load MISFET $Qp_2$ is formed integrally with the gate electrode 11b of the driver MISFET $Qd_2$ (as shown in FIG. 2(b)). The driver MISFET Qd is provided in a first direction between the transfer MISFET Qt and the load MISFET Qp.

Figure 2C:
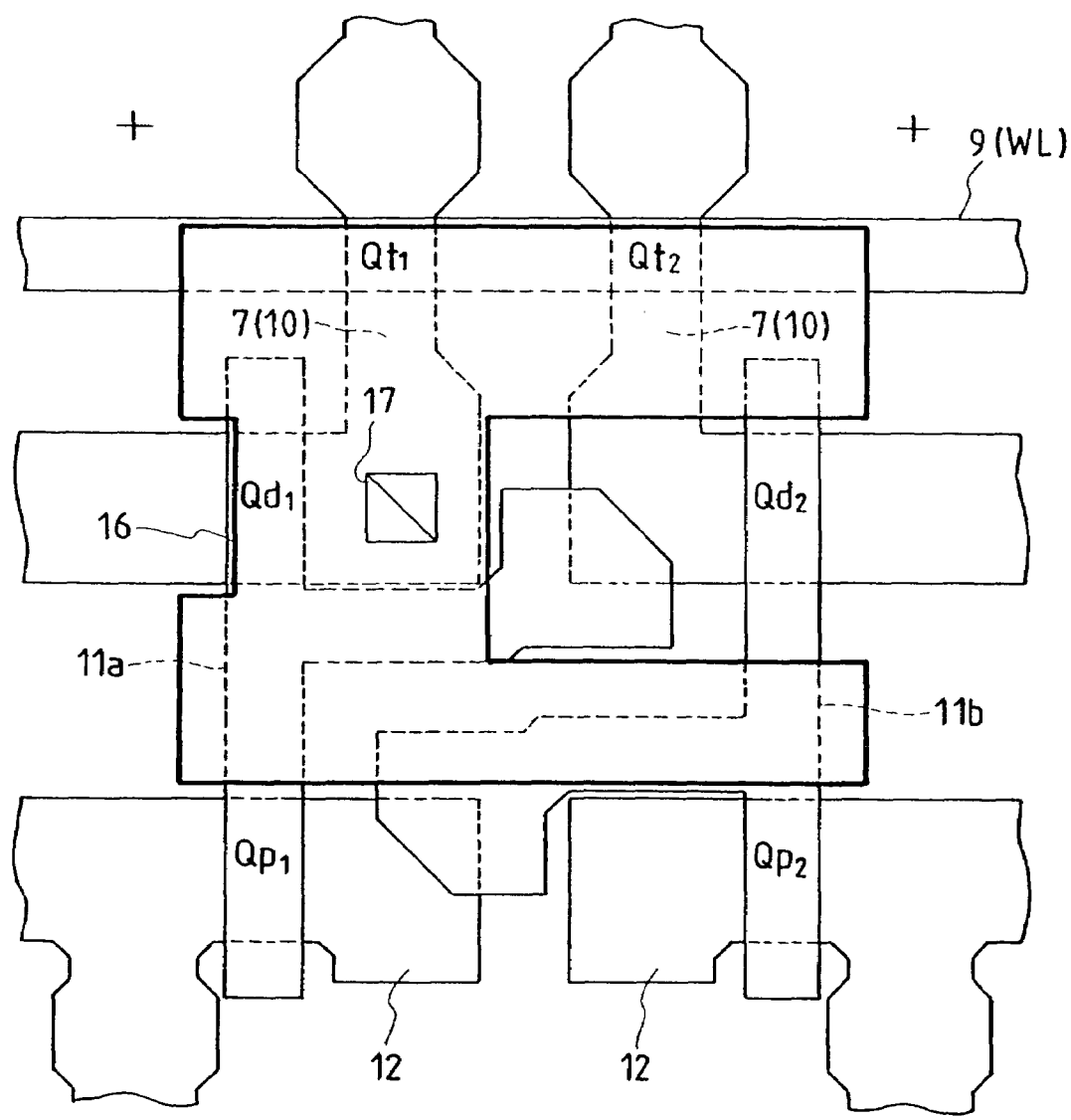

Over the memory cell thus composed of the six MISFETs, there is formed through insulating films 14 and 15 of a silicon oxide film a lower electrode 16 of a capacitor element C. This lower electrode 16 is composed of a second-level layer n-type polycrystal-line silicon film covering the memory cell widely. The lower electrode 16 is connected through a contact hole 17 to the drain region (the n-type semiconductor region 10 and the storage node A) of the driver MISFET $Qd_1$ (as shown in FIG. 2(C)).

Figure 2D:
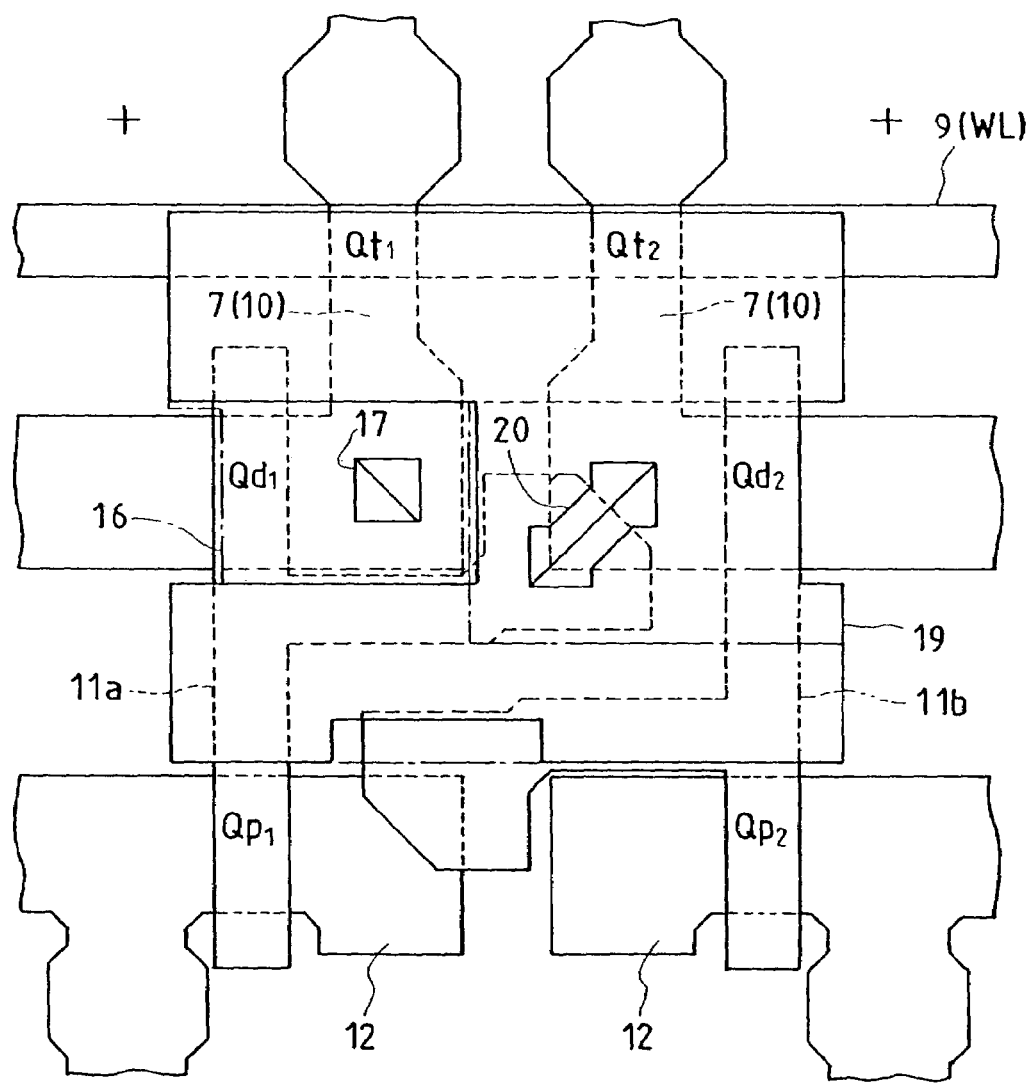

Over the lower electrode 16, there is formed through a capacitor insulating film 18 of a silicon oxide film an upper electrode 19 of the capacitor element C. This upper electrode 19 is composed of a third-level layer n-type polycrystalline silicon film covering the memory cell widely. The upper electrode 19 is connected through a contact hole 20 to the gate electrode 11a common to the driver MISFET $Qd_1$ and the load MISFET $Qp_1$ and to the drain region (the n-type semiconductor region 10 and the storage node B) of the driver MISFET $Qd_2$ (as shown in FIG. 2(d)). Incidentally, the capacitor insulating film 18 should not be limited to the silicon nitride film but may be composed of a multilayer film of a silicon nitride film and a silicon oxide film.

Thus, in the SRAM of the present embodiment, the capacitor element C having a stack structure is constructed of the lower electrode 16 and the upper electrode 19 covering the memory cell widely and the capacitor element insulating film 18 sandwiched between those electrodes, and one electrode (the lower electrode 16) of the capacitor element C is connected to one storage node A of the flip-flop circuit whereas the other electrode (the upper electrode 19) is connected to the other storage node B. Specifically, the lower electrode 16 and the upper electrode 19 are so formed as to cover the memory cell widely and as to extend over the word line 9 (WL) to the region between the driver MISFETs $Qd_1$ and $Qd_2$ and the load MISFETs $Qp_1$ and $Qp_2$. As a result, the capacitance of the capacitor element C can be increased.

Thanks to this construction, the storage nodes A and B can be fed with sufficient charge through the capacitor element C so that the potential fluctuations of the storage nodes A and B due to alpha rays can be suppressed to improve the soft error resistance of the memory cell even if the memory cell is miniaturized or even if the operating voltage is dropped.

Figure 2E:
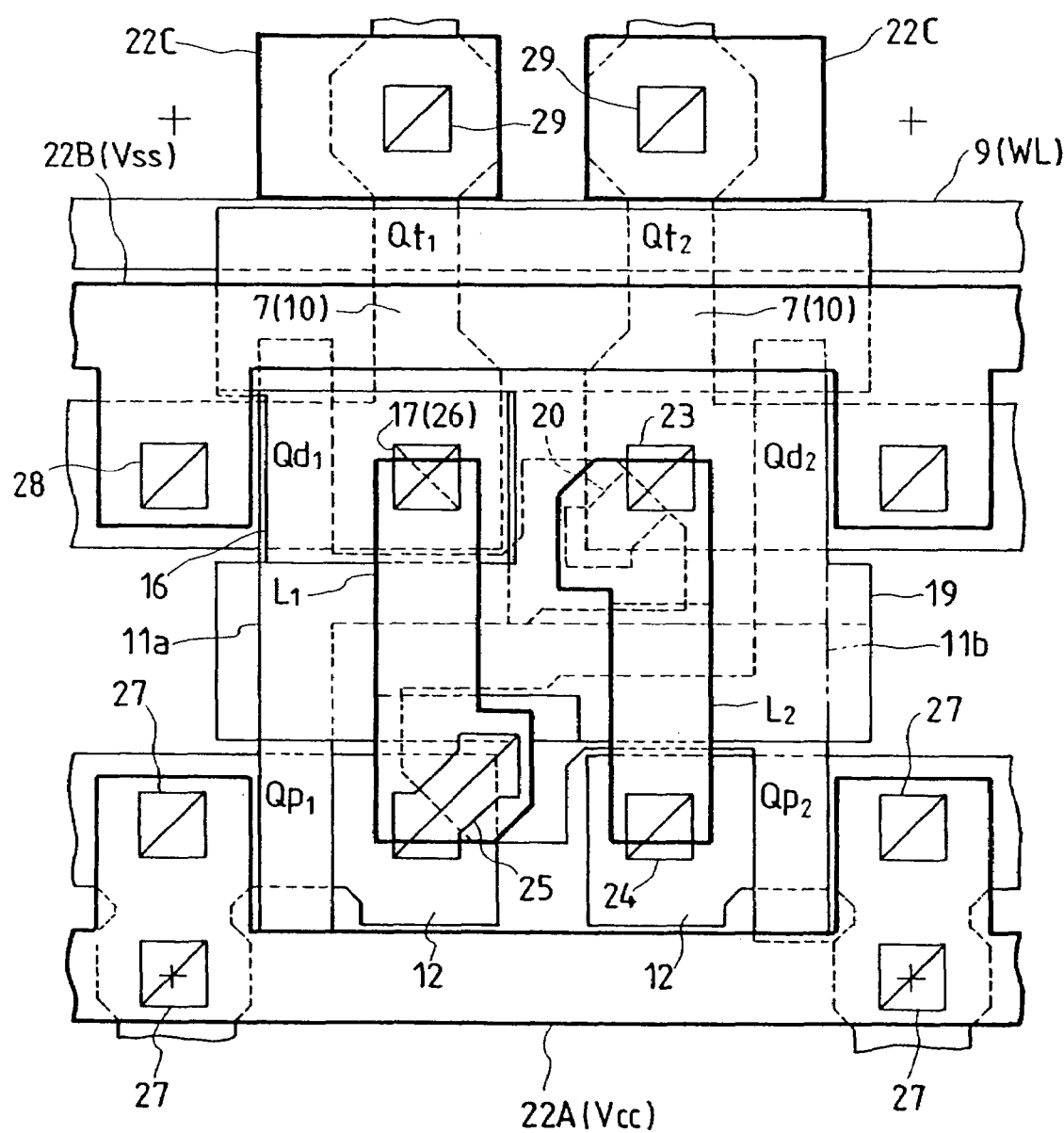

Over the capacitor element C, there are formed through a first-level layer interlayer insulating film 21 of a BPSG (Boro Phospho Silicate Glass) film a pair of local wiring lines $L_1$ and $L_2$, a power voltage line 22A, a reference voltage line 22B and a pair of pad layers 22C, which are composed of a first-level layer aluminum (Al) alloy film (as shown in FIG. 2(e)).

One end portion of one ($L_2$) of the paired local wiring lines $L_1$ and $L_2$ is connected through a contact hole 23 to the upper electrode 19 of the capacitor element C and further through the contact hole 20 to the drain region (the n-type semiconductor region 10) of the driver MISFET $Qd_2$ and the gate electrode 11a common to the driver MISFET $Qd_1$ and the load MISFET $Qp_1$. The other end portion of the local wiring line $L_2$ is connected through a contact hole 24 to the drain region (the p-type semiconductor region 12) of the load MISFET $Qp_2$. In other words, the drain region (the n-type semiconductor region 10 and the storage node B) of the driver MISFET $Qd_2$, the drain region (the p-type semiconductor region 12) of the load MISFET $Qp_2$ and the gate electrode 11a common to the driver MISFET $Qd_1$ and the load MISFET $Qp_1$ are connected to each other through the local wiring line $L_2$ and the upper electrode 19.

On the other hand, one end portion of the other local wiring line $L_1$ is connected through a contact hole 25 to the drain region (the p-type semiconductor region 12) of the load MISFET $Qp_1$ and the gate electrode 11b common to the driver MISFET $Qd_2$ and the load MISFET $Qp_2$. The other end portion of the local wiring line $L_1$ is connected through a contact hole 26 to the lower electrode 16 of the capacitor element C and further through the contact hole 17 to the drain region (the n-type semiconductor region 10) of the driver MISFET $Qd_1$. In other words, the drain region (the n-type semiconductor region 10 and the storage node A) of the driver MISFET $Qd_1$, the drain region (the p-type semiconductor region 12) of the load MISFET $Qp_1$ and the gate electrode 11b common to the driver MISFET $Qd_2$ and the load MISFET $Qp_2$ are connected to each other through the local wiring line $L_1$ and the lower electrode 16. In short, the local wiring lines $L_1$ and $L_2$ extend in the first direction to electrically connect the drain region of the driver MISFET Qd and the drain region of the load MISFET Qp.

Of the power voltage line 22A, the reference voltage line 22B and the paired pad layers 22C belonging to the same layer as that of the local wiring lines $L_1$ and $L_2$, the power voltage line 22A is connected through a contact hole 27 to the source regions (the p-type semiconductor region 12) of the load MISFETs $Qp_1$ and $Qp_2$ to supply these source regions (the p-type semiconductor region 12) to the power voltage (Vcc). The reference voltage line 22B is connected through a contact hole 28 to the source regions (the n-type semiconductor region 10) of the driver MISFETs $Qd_1$ and $Qd_2$ to supply these source regions (the n-type semiconductor region 10) with the reference voltage (Vss). Moreover, one of the paired pad layers 22C is connected through a contact hole 29 to the drain region (the n-type semiconductor region 7) of the transfer MISFET $Qt_1$, whereas the other is connected through the contact hole 29 to the drain region (the n-type semiconductor region 7) of the transfer MISFET $Qt_2$. The power voltage line 22A and the reference voltage line 22B extend in a second direction perpendicular to the first direction to supply the power supply voltage (Vcc) and the reference voltage (Vss) to the memory cells arranged in the second direction.

Over the local wiring lines $L_1$ and $L_2$, the power voltage line 22A, the reference voltage line 22B and the pad layers 22C, there are formed through the second-level layer interlayer insulating film 31 of a silicon oxide film a pair of complementary data lines (the data line DL and the data line /DL) made of the second-level Al alloy film. The data line DL is connected through a contact hole 32 to the pad layers 22C and further through the contact hole 29 to the drain region (the n-type semiconductor region 7) of the transfer MISFET $Qt_1$. On the other hand, the data line /DL is connected through the contact hole 32 to the pad layers 22C and further through the contact hole 29 to the drain region (the n-type semiconductor region 7) of the transfer MISFET $Qt_2$ (as shown in FIG. 2(a)).

Here will be described a process for manufacturing the memory cells of the SRAM of the present embodiment thus constructed. Of the individual Figures (i.e., FIGS. 5 to 22) showing the memory cell manufacturing process, sections are taken along lines A-A' of FIGS. 1 and 2. In the top plan views, only the conductive films and the contact holes are shown but the insulating films are not shown.

<Step of Forming Element Isolation-Well>

Figure 6:
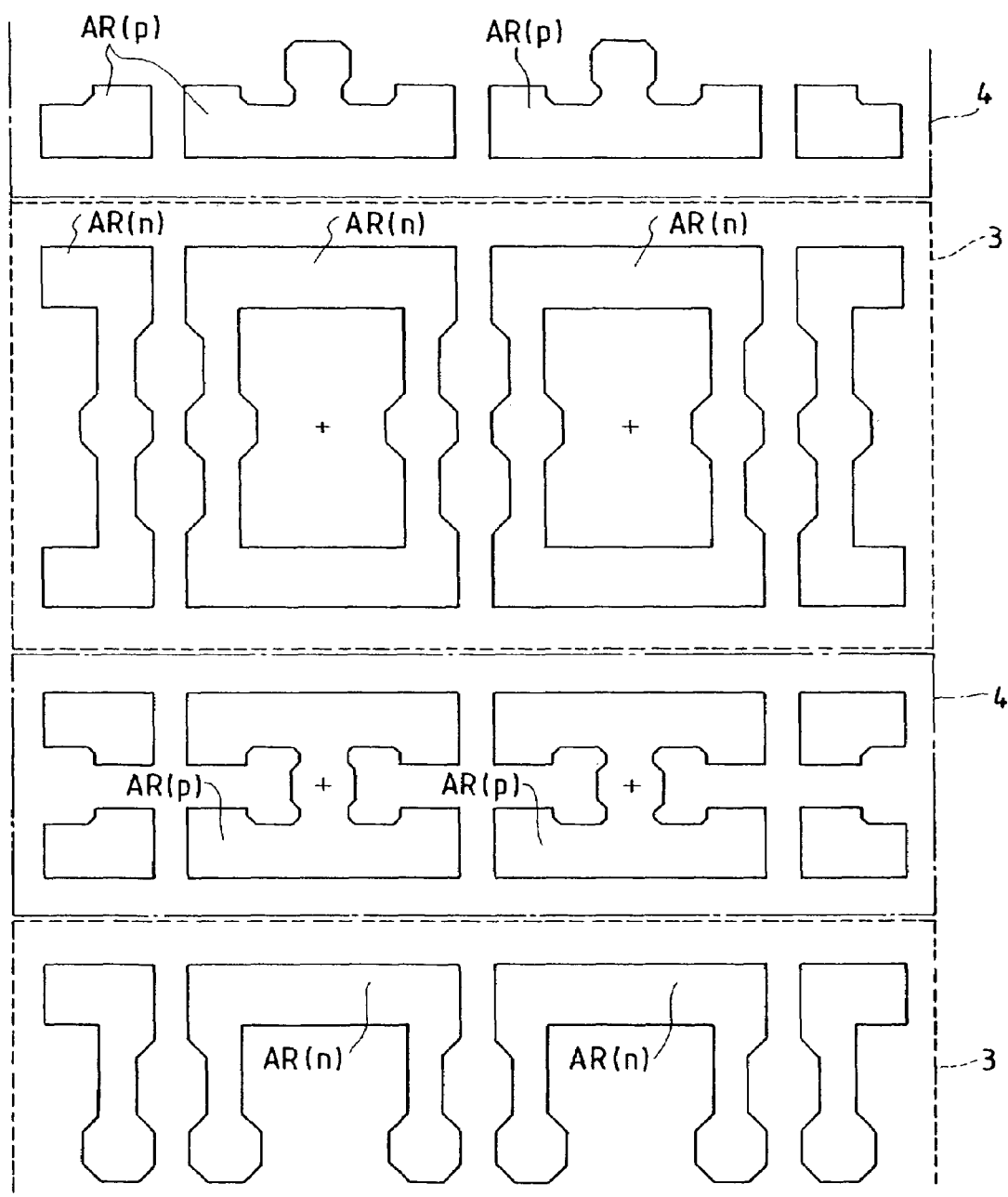
FIG. 6 is a top plan view of a semiconductor substrate and shows the first manufacturing process of the memory cell of the present invention.

First of all, the element isolating field insulating film 2 having a thickness of about 400 nm is formed over the principal face of the semiconductor substrate 1 made of p⁻-type single crystal silicon, as shown in FIG. 5, by a well-known LOCOS method using a silicon nitride film as the thermal oxidation mask. Next, the p-type buried layer 5 and the n-type buried layer 6 are formed in the semiconductor substrate 1 by an ion implantation method using a photoresist as the mask. After this, the p-type well 3 is formed over the p-type buried layer 5, and the n-type well 4 is formed over the n-type buried layer 6. Next, the surfaces of the active regions of the p-type well 3 and the n-type well 4 are thermally oxidized to form the gate insulating film 8. FIG. 6 shows a top plan pattern (for about nine memory cells) of the active regions (AR) of the p-type well 3 and the n-type well 4. Incidentally, in FIG. 6, the p-type well 3 and the n-type well 4 are indicated by broken lines and single-dotted lines for easy understanding of their locations.

<Step of Forming First-Level Layer Gate>

Figure 8:
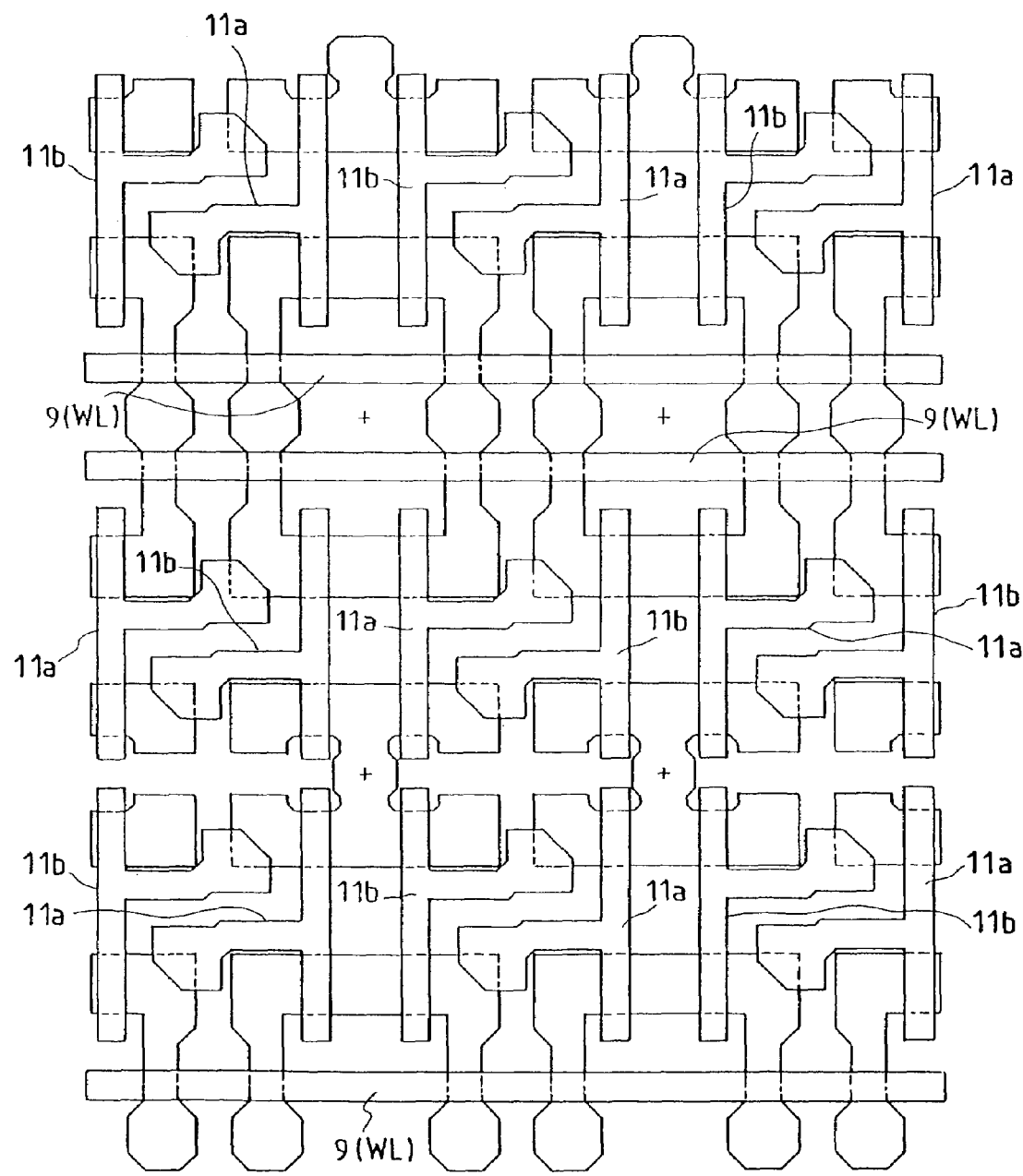
FIG. 8 is a top plan view of the semiconductor substrate and shows the first manufacturing process of the memory cell of the SRAM of the present invention.

Next, as shown in FIG. 7, there are formed: the gate electrode 9 (the word line WL) of the transfer MISFETs $Qt_1$ and $Qt_2$; the gate electrode 11a which is common to the load MISFET $Qp_1$ and the driver MISFET $Qd_1$; and the gate electrode 11b which is common to the load MISFET $Qp_2$ and the driver MISFET $Qd_2$. The gate electrode 9 (or the word line WL) and the gate electrodes 11a and 11b are formed by depositing an n-type polycrystalline silicon film (polycide film) having a thickness of about 100 nm over the semiconductor substrate 1 by a CVD (Chemical Vapor Deposition) method, by depositing the silicon oxide film 14 having a thickness of about 120 nm thereover by a CVD method, and by patterning the silicon oxide film 14 and the n-type polycrystalline silicon film (polycide film) by a etching method using a photoresist as the mask. FIG. 8 shows a top plan pattern (for about nine memory cells) of the gate electrode 9 (the word line WL) and the gate electrodes 11a and 11b.

<Step of Forming Diffused Layer>

Next, as shown in FIG. 9, side wall spacers 13 are formed on the side walls of the gate electrode 9 (the word line WL) and the gate electrodes 11a and 11b by patterning, by RIE (Reactive Ion Etching), the silicon oxide film deposited over the semiconductor substrate 1 by a CVD method. Next, by an ion implantation method using a photoresist as the mask, the p-type well 3 is doped with phosphor (P) or arsenic (As) to form the n-type semiconductor region 7 (the source and drain regions of the transfer MISFETs $Qt_1$ and $Qt_2$) and the n-type semiconductor region 10 (the source and drain regions of the driver MISFETs $Qd_1$ and $Qd_2$), and the n-type well 4 is doped with boron (B) to form the p-type semiconductor region 12 (the source and drain regions of the load MISFETs $Qp_1$ and $Qp_2$). Incidentally, the source regions and the drain regions of those MISFETs may have an LDD (Lightly Doped Drain) structure which is composed of a heavily doped semiconductor region and a lightly doped semiconductor region.

<Step of Forming Contact Holes for Second-Level Layer Gate>

Figure 11:
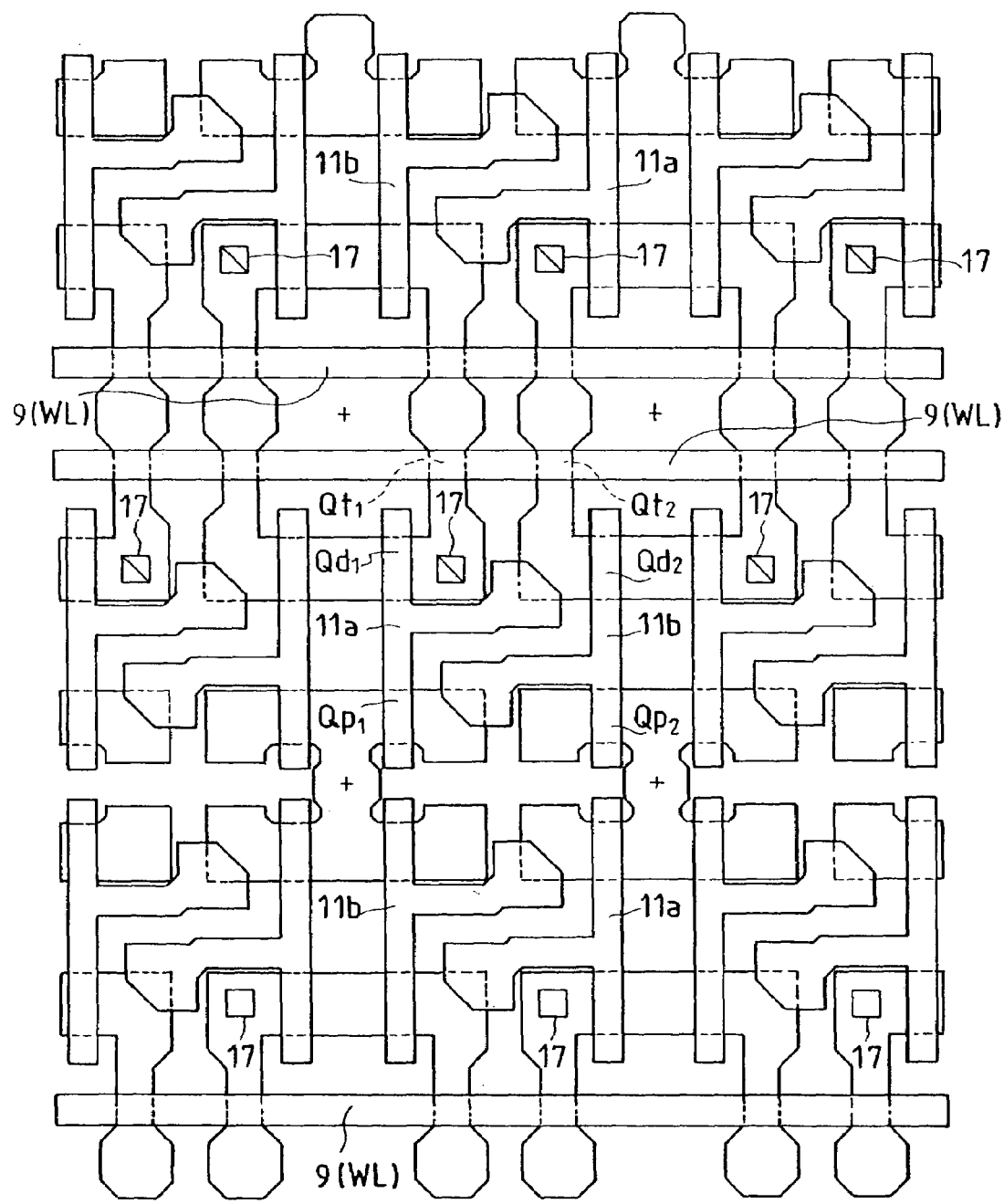
FIG. 11 is a top plan view of the semiconductor substrate and shows the first manufacturing process of the memory cell of the SRAM of the present invention.

Next, as shown in FIG. 10, the silicon oxide film 15 having a thickness of about 50 nm is deposited over the semiconductor substrate 1 by a CVD method, and this silicon oxide film 15 and the underlying insulating film (the insulating film formed in the same layer as that of the gate insulating film 9) are etched by using a photoresist as the mask to form the contact holes 17 reaching the drain region (the n-type semiconductor region 10) of the driver MISFET $Qd_1$, as shown in FIG. 11.

<Step of Forming Second-Level Layer Gate>

Figure 13:
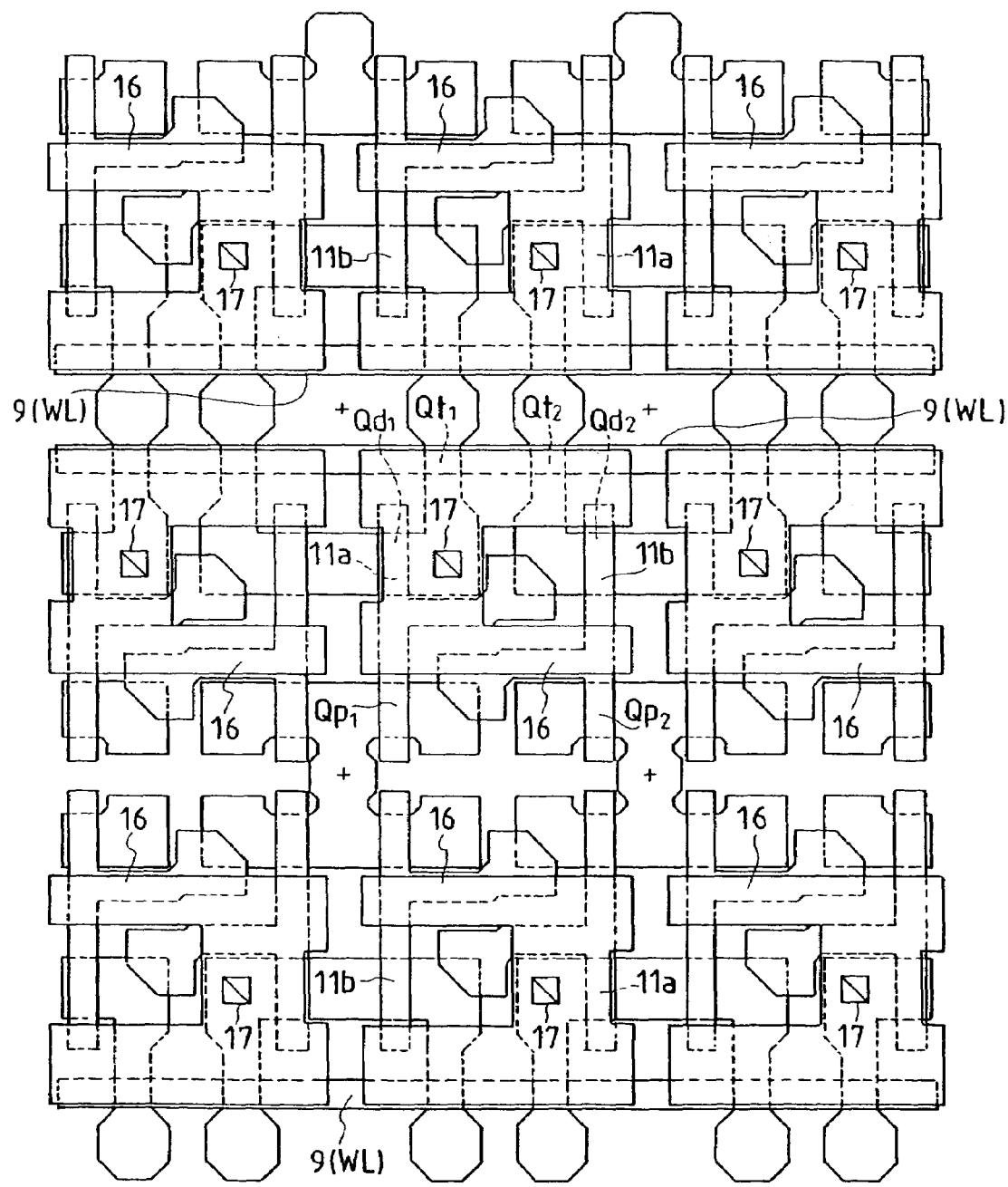
FIG. 13 is a top plan view of the semiconductor substrate and shows the first manufacturing process of the memory cell of the SRAM of the present invention.

Next, as shown in FIGS. 12 and 13, an n-type polycrystalline silicon film having a thickness of about 50 nm is deposited on the semiconductor substrate 1 and is patterned by an etching method using a photoresist as the mask to form the lower electrode 16 of the capacitor element C. This lower electrode 16 is connected through the contact hole 17 to the drain region (the n-type semiconductor region 10 and the storage node A) of the driver MISFET $Qd_1$.

<Step of Forming Capacitor Insulating Film and Step of Forming Contact Holes for Third-Level Layer Gate>

Figure 15:
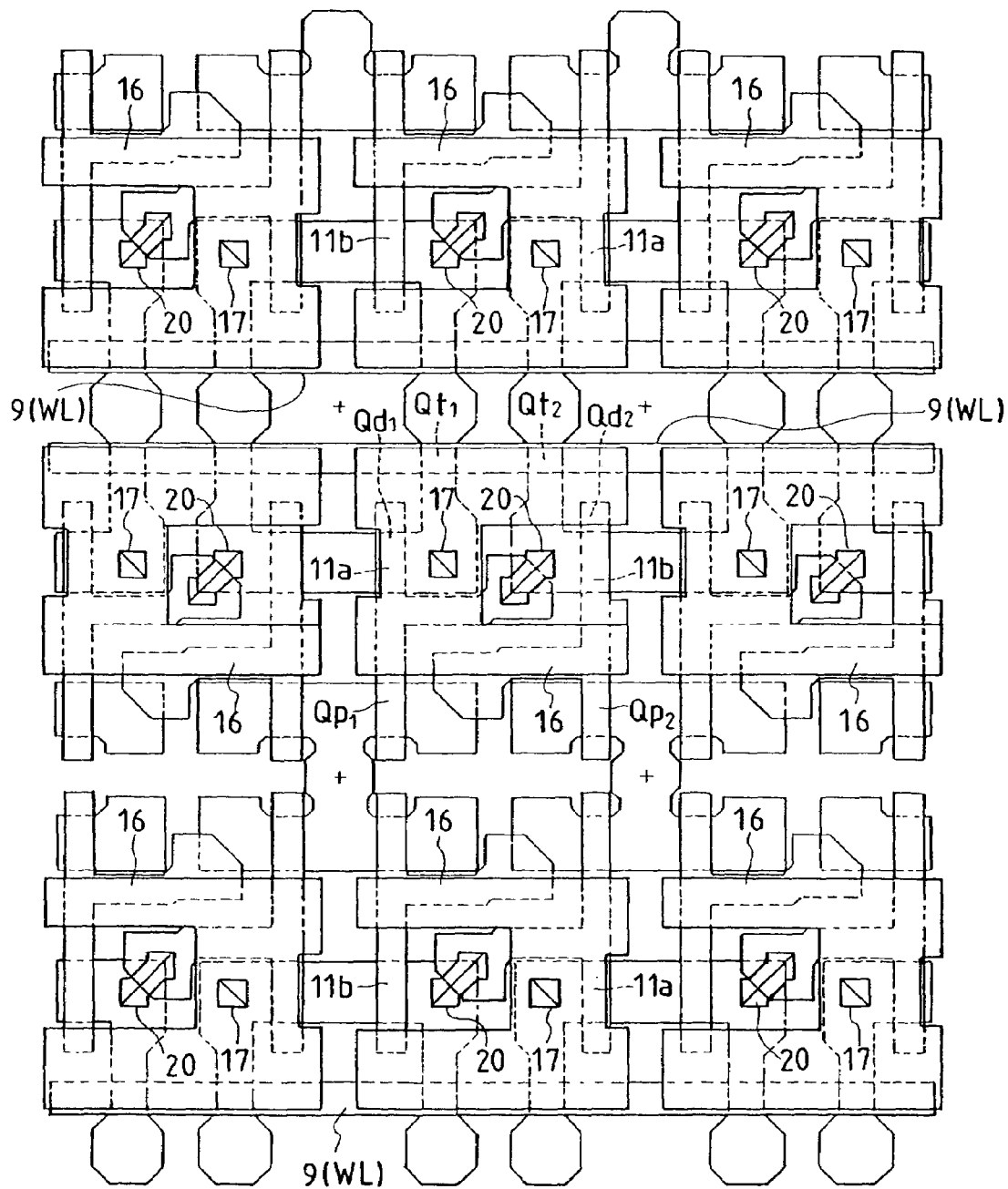
FIG. 15 is a top plan view of the semiconductor substrate and shows the first manufacturing process of the memory cell of the SRAM of the present invention.

Next, as shown in FIGS. 14 and 15, the capacitor element insulating film 18 of a silicon nitride film having a thickness of about 15 nm is deposited over the semiconductor substrate 1 by a CVD method and is etched together with the underlying silicon oxide films 15 and 14 and insulating film (in the same layer as that of the gate insulating film 9) by using a photoresist as the mask to form the contact hole 20 reaching the gate electrode 11a common to the load MISFET $Qp_1$ and the driver MISFET $Qd_1$ and the drain region (the n-type semiconductor region 10) of the driver MISFET $Qd_2$.

<Step of Forming Third-Level Layer Gate>

Figure 16:
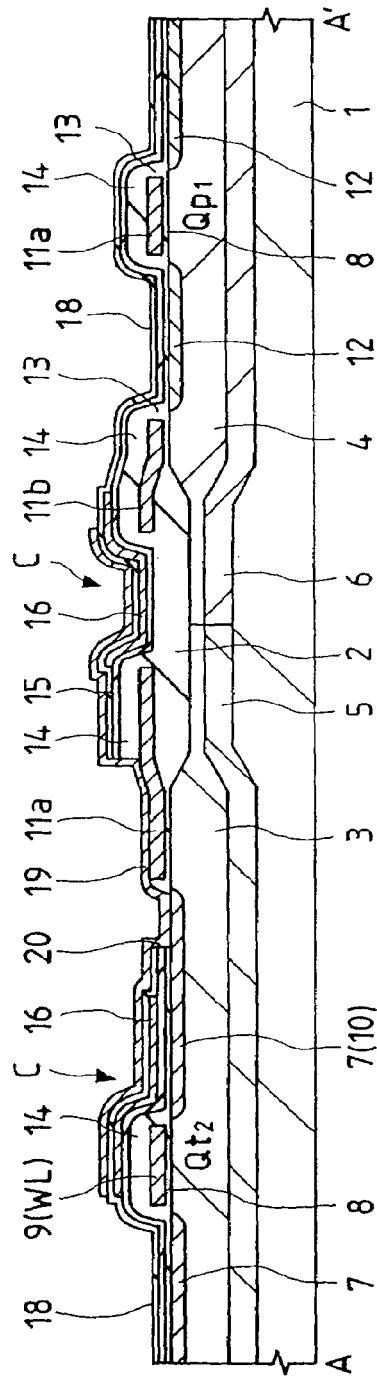
FIG. 16 is a section of an essential portion of the semiconductor substrate and shows the first manufacturing process of the memory cell of the SRAM of the present invention.
Figure 17:
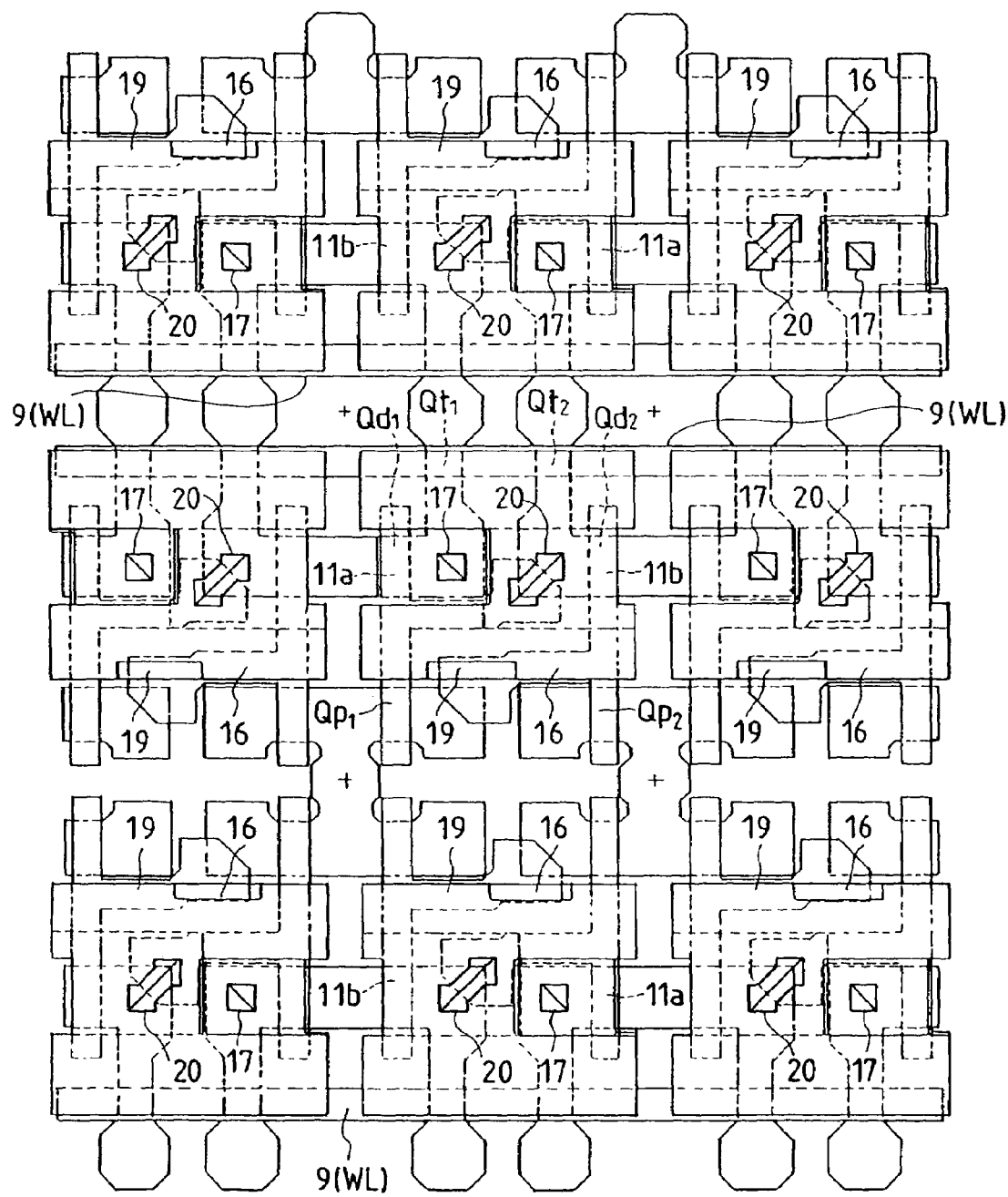
FIG. 17 is a top plan view of the semiconductor substrate and shows the first manufacturing process of the memory cell of the SRAM of the present invention.
Figure 18:
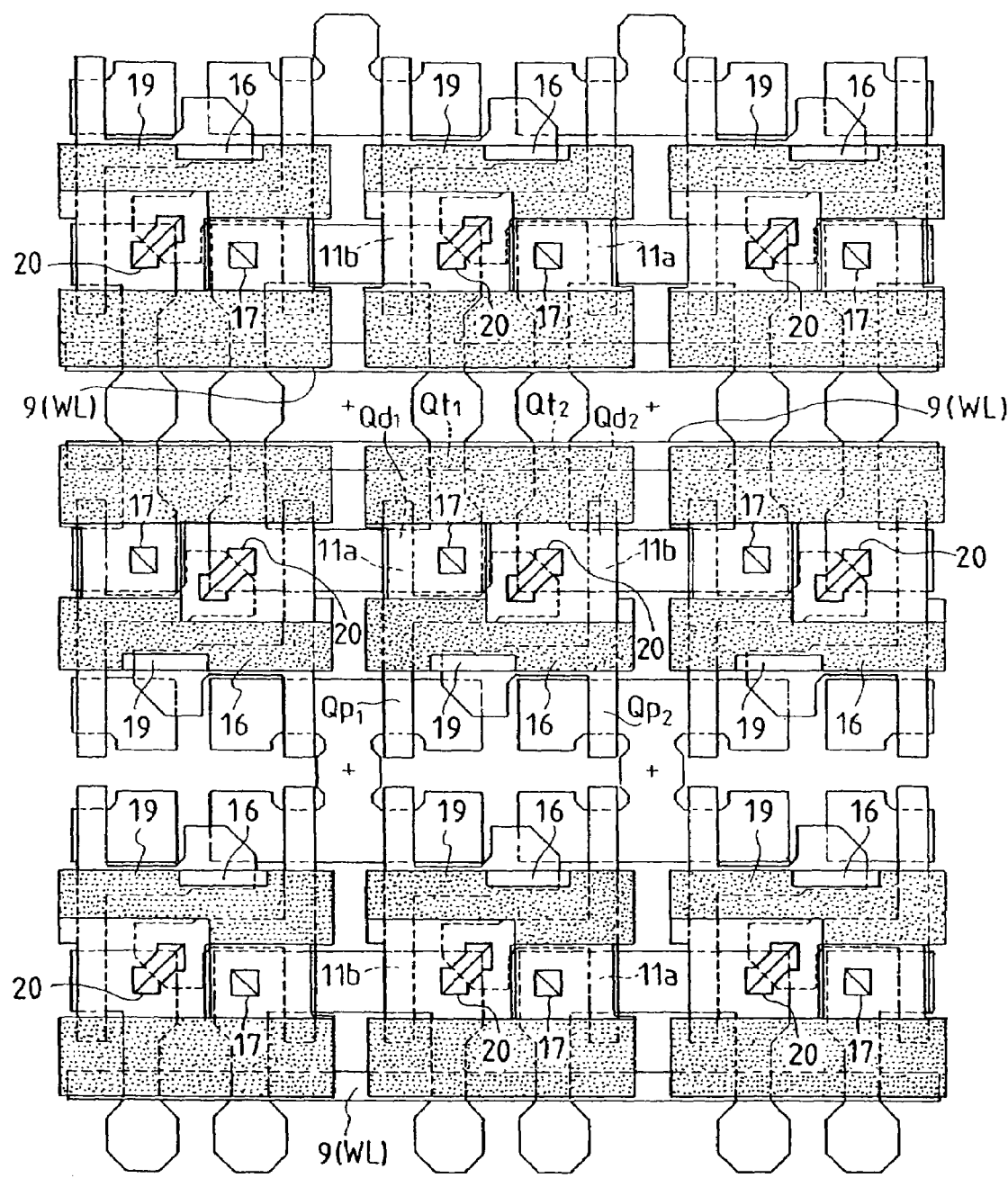
FIG. 18 is a top plan view of the semiconductor substrate and shows the first manufacturing process of the memory cell of the SRAM of the present invention.

Next, as shown in FIGS. 16 and 17, the n-type polycrystalline silicon film having a thickness of about 50 nm is deposited on the semiconductor substrate 1 and is patterned by an etching method using a photoresist as the mask to form the upper electrode 19 of the capacitor element C. This upper electrode 19 is connected through the contact hole 20 to the gate electrode 11a common to the load MISFET $Qp_1$ and the driver MISFET $Qd_1$ and the drain region (the n-type semiconductor region 10 and the storage node B) of the driver MISFET $Qd_2$. The region indicated by the gray patterns of FIG. 18 are the ones (where the capacitor element C of the embodiment is to be formed) where the lower electrodes 16 and the upper electrodes 19 overlap with each other.

<Step of Forming Contact Holes for First-Level Layer Wiring Line>

Figure 19:
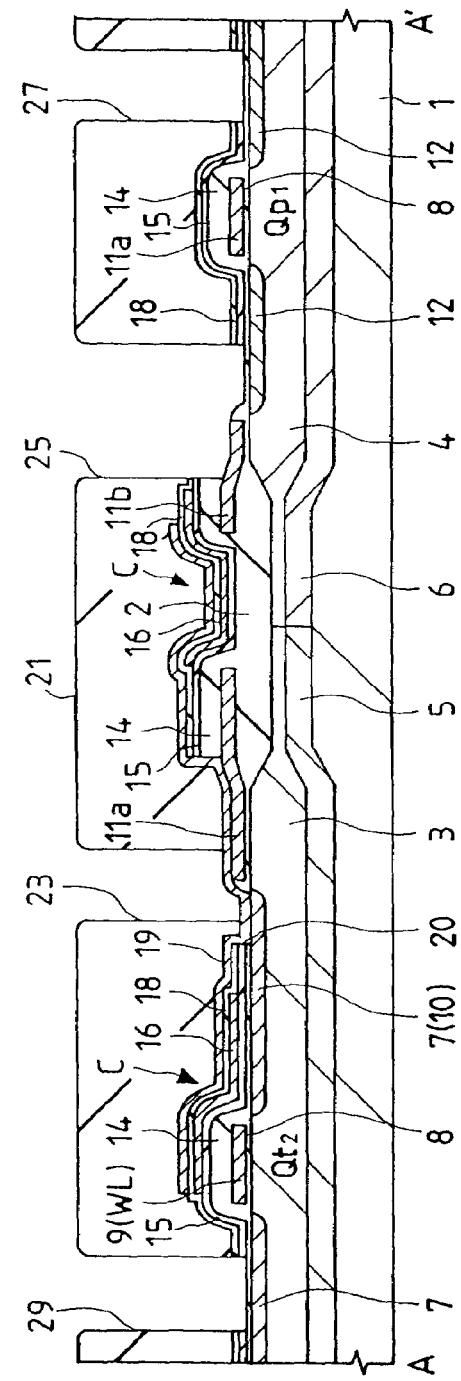
FIG. 19 is a section of an essential portion of the semiconductor substrate and shows the first manufacturing process of the memory cell of the SRAM of the present invention.
Figure 20:
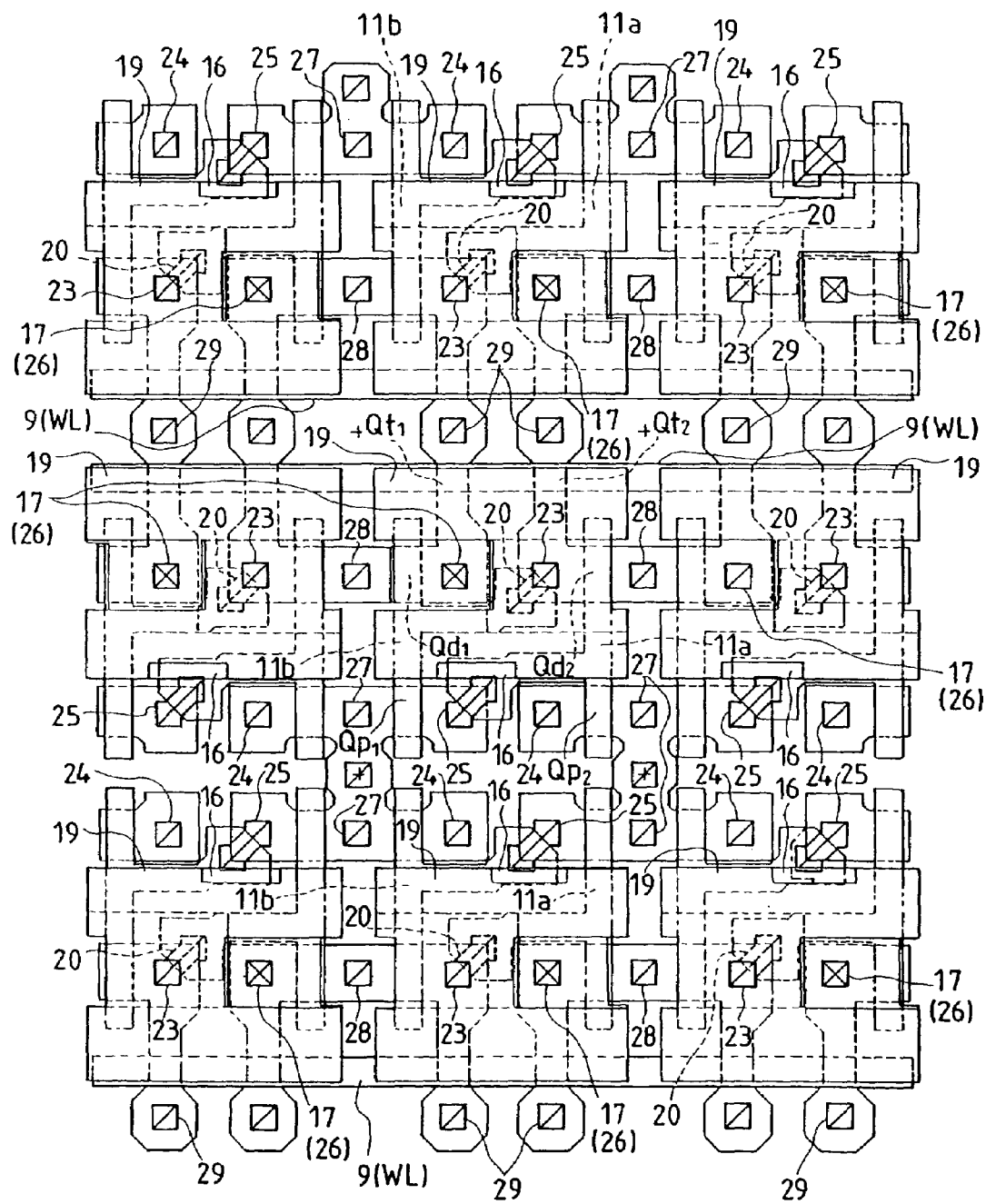
FIG. 20 is a top plan view of the semiconductor substrate and shows the first manufacturing process of the memory cell of the SRAM of the present invention.

Next, as shown in FIGS. 19 and 20, the interlayer insulating film 21 of a BPSG film having a thickness of about 500 nm is deposited on the semiconductor substrate 1 by a CVD method, and the surface of the insulating film 21 is flattened by reflow. After this, the interlayer insulating film 21 and the underlying capacitor element insulating film 18, silicon oxide films 15 and 14 and insulating film (in the same layer as that of the gate insulating film 9) are etched by using a photoresist as the mask to make the contact hole 24 reaching the drain region (or the p-type semiconductor region 12) of the load MISFET $Qp_2$, the contact hole 24 reaching the gate electrode 11b common to the load MISFET $Qp_2$ and the driver MISFET $Qd_2$ and the drain region (the p-type semiconductor region 12) of the load MISFET $Qp_1$, the contact hole 26 reaching the lower electrode 16 of the capacitor element C, the contact hole 27 reaching the source regions (the p-type semiconductor region 12) of the load MISFETs $Qp_1$ and $Qp_2$, the contact hole 28 reaching the source region (the n-type semiconductor region 10) of the driver MISFETs $Qd_1$ and $Qd_2$, and the contact hole reaching the source regions (the n-type semiconductor region 7) of the transfer MISFETs $Qt_1$ and $Qt_2$.

<Step of Forming First-Level Layer Wiring Line>

Figure 21:
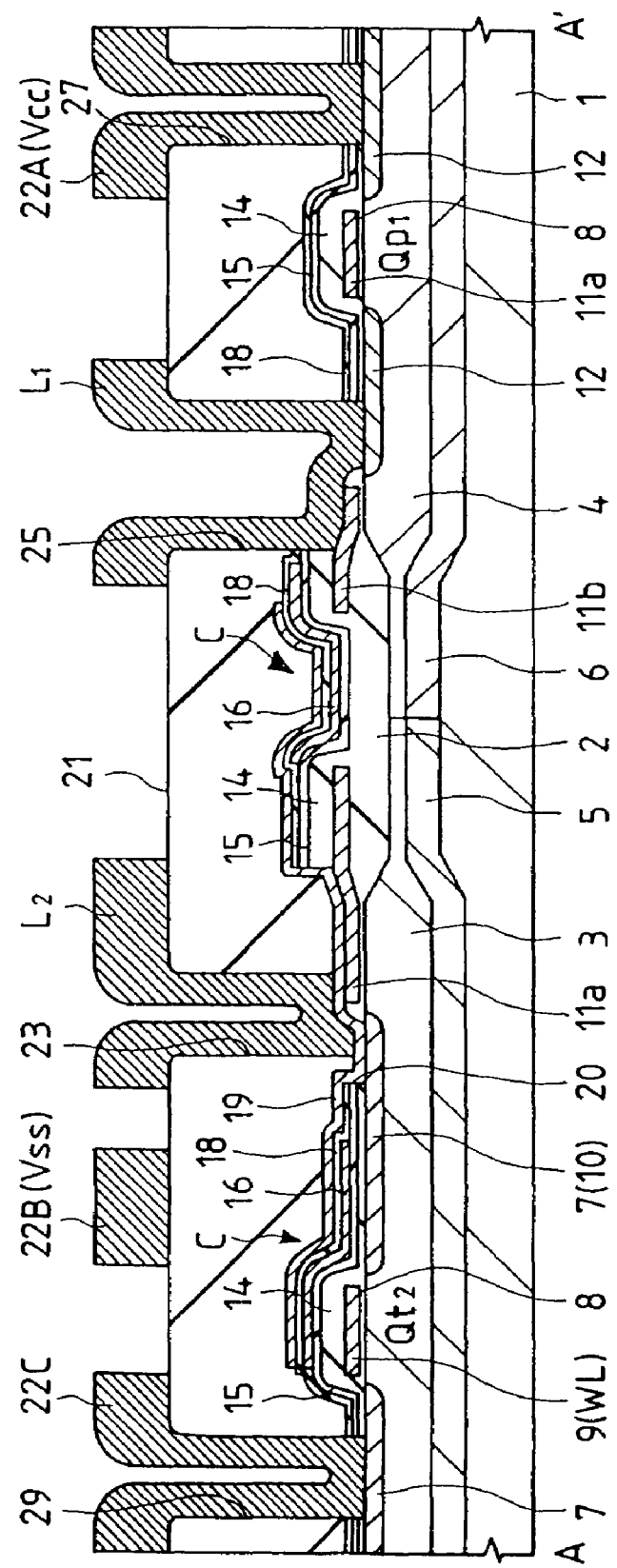
FIG. 21 is a section of an essential portion of the semiconductor substrate and shows the first manufacturing process of the memory cell of the SRAM of the present invention.
Figure 22:
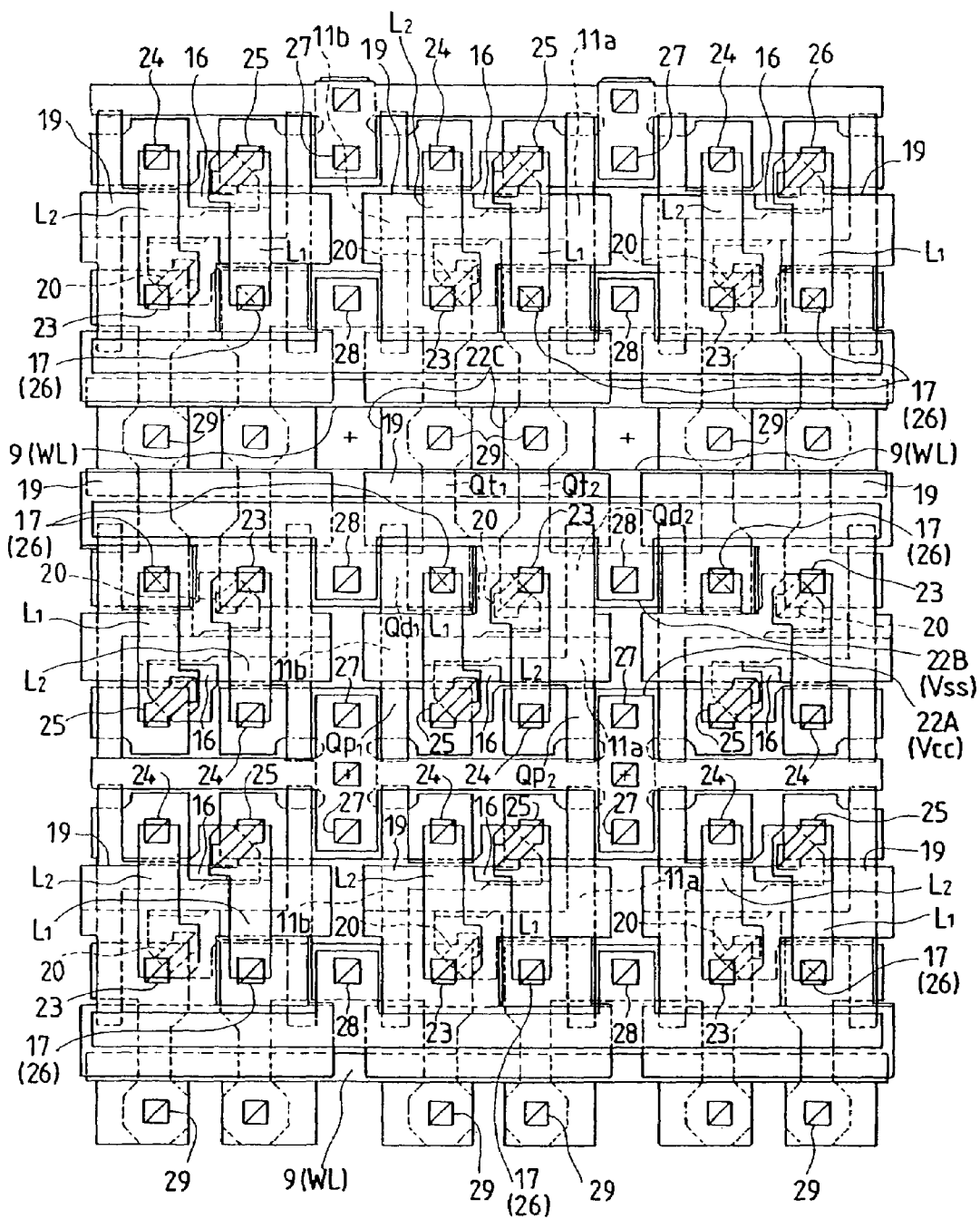
FIG. 22 is a top plan view of the semiconductor substrate and shows the first manufacturing process of the memory cell of the SRAM of the present invention.

Next, as shown in FIGS. 21 and 22, an Al alloy film having a thickness of about 300 nm is deposited on the interlayer insulating film 21 by sputtering and is patterned by etching using a photoresist as the mask to form the local wiring lines $L_1$ and $L_2$, the power voltage line 22A, the reference voltage line 22B and the pad layers 22C.

Figure 3:
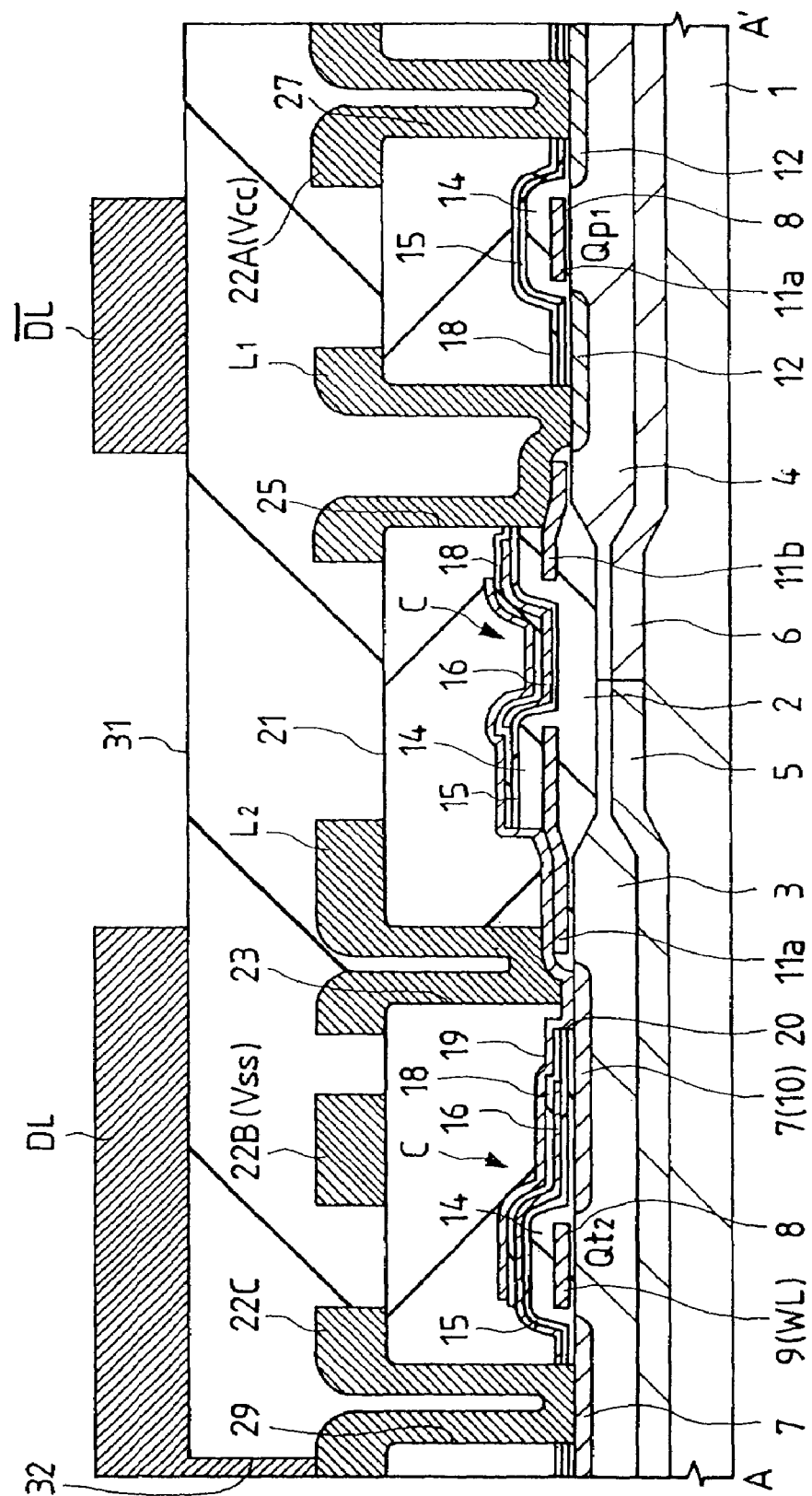
FIG. 3 is a section of an essential portion of a semiconductor substrate, taken along line A-A' of FIG. 1 and FIG. 2(a)

Next, the interlayer insulating film 31 of a silicon oxide film having a thickness of about 500 nm is deposited by a CVD method, and the contact holes 32 are made in the interlayer insulating film 31 by etching using a photoresist as the mask. After this, an Al alloy film is deposited on the interlayer insulating film 31 by sputtering and is patterned by etching using a photoresist as the mask to form the data lines DL and /DL to complete the memory cells, as shown in FIGS. 1 to 3.

Figure 23:
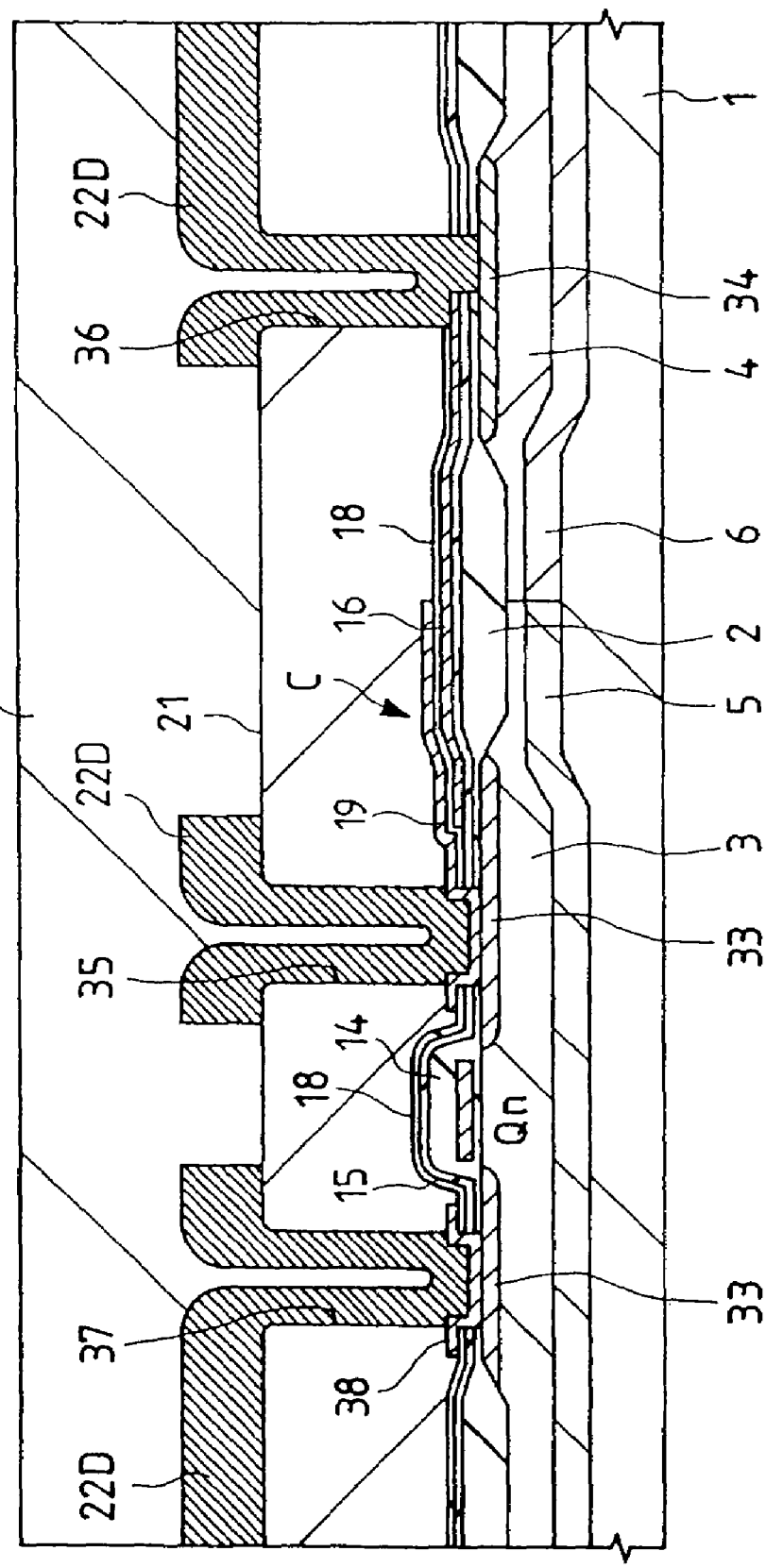
FIG. 23 is a section of an essential portion of the semiconductor substrate and shows a peripheral circuit of the SRAM of the present invention.

FIG. 23 is a section showing a portion of a peripheral circuit of the SRAM of the present embodiment. This peripheral circuit is, e.g., an input/output protective circuit which is equipped with a capacitor element C having substantially the same structure as the capacitor element C of the aforementioned memory cell. The lower electrode of the capacitor element C is composed of a second-level layer n-type polycrystalline silicon film at the same step as that of forming the lower electrode 16 of the capacitor element C of the memory cell. The capacitor insulating film 18 is composed of a silicon nitride film at the same step as that of forming the capacitor insulating film 18 of the capacitor element C of the memory cell. The upper electrode 19 is composed of the third-level layer n-type polycrystalline silicon film at the same step as that of forming the upper electrode 19 of the capacitor element C of the memory cell.

The upper electrode 19 of this capacitor element C is connected to an n-type semiconductor region 33 of an n-channel MISFET Qn constituting a part of the input/output protective circuit, and further to an overlying wiring line 22D through a contact hole 35 formed in the interlayer insulating film 21. The wiring line 22D is composed of an Al alloy film which is formed in the same layer as that of the local wiring lines $L_1$ and $L_2$, the power voltage line 22A, the reference voltage line 22B and pad layer 22C of the memory cell. The lower electrode 16 of the capacitor element C is connected to the wiring line 22D through a contact hole 36 made in the interlayer insulating film 21, and to a p-type semiconductor region 34 formed in the principal face of the n-type well 4 through the wiring line 22D. The lower electrode 16 is composed of an n-type polycrystalline silicon film, so that it is connected indirectly to the p-type semiconductor region 34 through the wiring line 22D.

Thus, in the present embodiment, the capacitor element C of the peripheral circuit is composed of the two-layered polycrystalline silicon film which is deposited on the semiconductor substrate 1. As a result, the area occupied by the elements can be made smaller than that of the capacitor element which is composed of the diffused region (pn junction) formed in the semiconductor substrate, so that the area for the peripheral circuit can be reduced to raise the degree of integration of the SRAM. Moreover, this capacitor element C has a feature that its capacitance can be arbitrarily controlled compared to capacitor elements using diffused layer (pn junction).

Another n-type semiconductor region 33 of the n-channel type MISFET Qn is connected to the wiring line 22D through a pad layer 38 which is composed of the same third-level layer n-type polycrystalline silicon film as that of the upper electrode 19 of the capacitor element C. The pad layer 38 is formed in the same step as that of the upper electrode 19 of the capacitor element C. Since the n-type semiconductor region 33 and the wiring line 22D are connected through the pad layer 38, the mask alignment margin at the time of making a contact hole 37 over the n-type semiconductor region 33 by etching using a photoresist as the mask can be reduced to reduce the area of the n-channel type MISFET Qn and thereby to raise the degree of integration of the SRAM. Incidentally, the pad layer 37 may be composed of the second-level layer n-type polycrystalline silicon film which is formed in the same layer as that of the lower electrode 16 of the capacitor element C.

Embodiment 2

A process for manufacturing the memory cells of the SRAM of the present embodiment will be described with reference to FIGS. 24 to 38. Incidentally, of the individual Figures showing the memory cell manufacturing process, the top plan views show only the conductive films and the contact holes but not the insulating films.

<Step of Forming Element Isolation-Well and Step of Forming First-Level Layer Gate>

First of all, as shown in FIG. 24, there are formed on the principal faces of the active regions of the p-type well 3 and the n-type well 4: the gate electrode 9 (the word line WL) of the transfer MISFETs $Qt_1$ ant $Qt_2$; the gate electrode 11a common to the load MISFET $Qp_1$ and the driver MISFET $Qd_1$; and the gate electrode 11b common to the load MISFET $Qp_2$ and the driver MISFET $Qd_2$. The steps up to this are identical to those of the foregoing Embodiment 1.

Next, in the present embodiment, the silicon oxide film 14 over the gate electrodes 11a and 11b is partially etched and thinned by using a photoresist as the mask. The portions thus tinned are the regions where contact holes 43 and 44 for connecting the local wiring lines $L_1$ and $L_2$ and the gate electrodes 11a and 11b are to be made in a later step.

There are two methods for reducing the thickness of the silicon oxide film 14 partially. By one (first) method, the silicon oxide film 14 and the polycrystalline silicon film are patterned to form the gate electrode 9 (or the word line WL) and the gate electrodes 11a and 11b by using a first photoresist as the mask; and thereafter the silicon oxide film 14 is partially etched by using a second photoresist as the mask. By the other (second) method, the silicon oxide film 14 is deposited on the first-level layer polycrystalline silicon film and is then partially edged by using a first photoresist as the mask; next, the silicon oxide film 14 and the polycrystalline silicon film are patterned to form the gate electrode 9 (the word line WL) and the gate electrodes 11a and 11b by using a second photoresist as the mask.

By the first method, when the silicon oxide film 14 is partially etched, after the gate electrodes have been formed, by using the second photoresist as the mask, this mask may be misaligned and thereby the field insulating film 2 at the end portions of the gate electrodes may be eroded if the portions to be thinned come to the field insulating film 2 at the gate electrode end portions. By the second method, on the other hand, this trouble is avoided because the lower polycrystalline silicon film acts as the etching stopper even if the mask for etching the silicon oxide film 14 partially is misaligned.

When the first method is adopted, a material such as silicon nitride having an etching rate different from that of the field insulating film 2 is deposited on the first-level layer polycrystalline silicon film and is patterned together with the polycrystalline silicon film to form the gate electrodes by using the first photoresist as the mask. After this, the silicon nitride film is partially etched by using the second photoresist as the mask so that the field insulating film 2 can be prevented from being eroded. Alternatively, the erosion of the field insulating film 2 of the gate electrode end portions can also be prevented by partially etching the insulating film over the gate electrode, after the side wall spacer (13) has been formed on the side wall of the gate electrodes.

<Step of Forming Diffused Layer>

Next, as shown in FIG. 26, the side wall spacers 13 are formed on the side walls of the gate electrode 9 (the word line WL) and the gate electrodes 11a and 11b. After this, by ion implantation using a photoresist as the mask, the n-type semiconductor region 7 (the source and drain regions of the MISFETs $Qt_1$ and $Qt_2$) and the n-type semiconductor region 10 (the source and drain regions of the driver MISFETs $Qd_1$ and $Qd_2$) are formed in the p-type well 3, and the p-type semiconductor region 12 (the source and drain regions of the load MISFETs $Qp_1$ and $Qp_2$) is formed in the n-type well 4.

<Step of Forming Second Level Layer of Gate Electrode>

Figure 29:
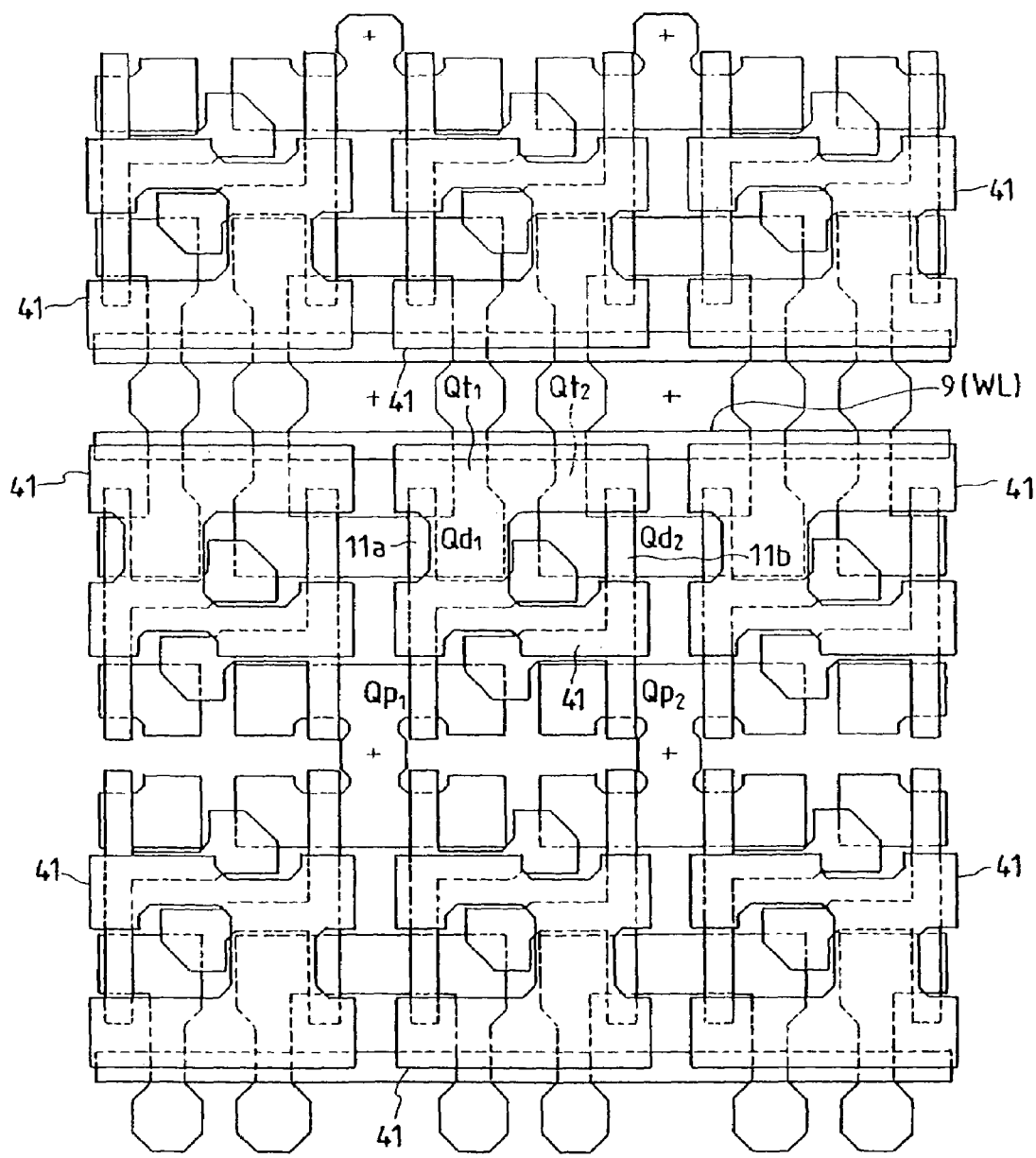
FIG. 29 is a top plan view of the semiconductor substrate and shows the second manufacturing process of the memory cell of the SRAM of the present invention.

Next, as shown in FIG. 27, the silicon nitride film 40 is deposited on the semiconductor substrate 1 by a CVD method. After this, the n-type polycrystalline silicon film, deposited by the CVD method, is patterned to form the lower electrode 41 of the capacitor element C, as shown in FIGS. 28 and 29. In the foregoing Embodiment 1, prior to the step of forming the lower electrode 41, there is made the contact hole (17) which reaches the drain region (the n-type semiconductor region 10) of the driver MISFET $Qd_1$. In the present embodiment, however, this step (the step of forming the contract holes for the second-level layer gate) is omitted.

<Step of Forming Capacitor Insulating Film and Step of Forming Third-Level Layer Gate>

Figure 31:
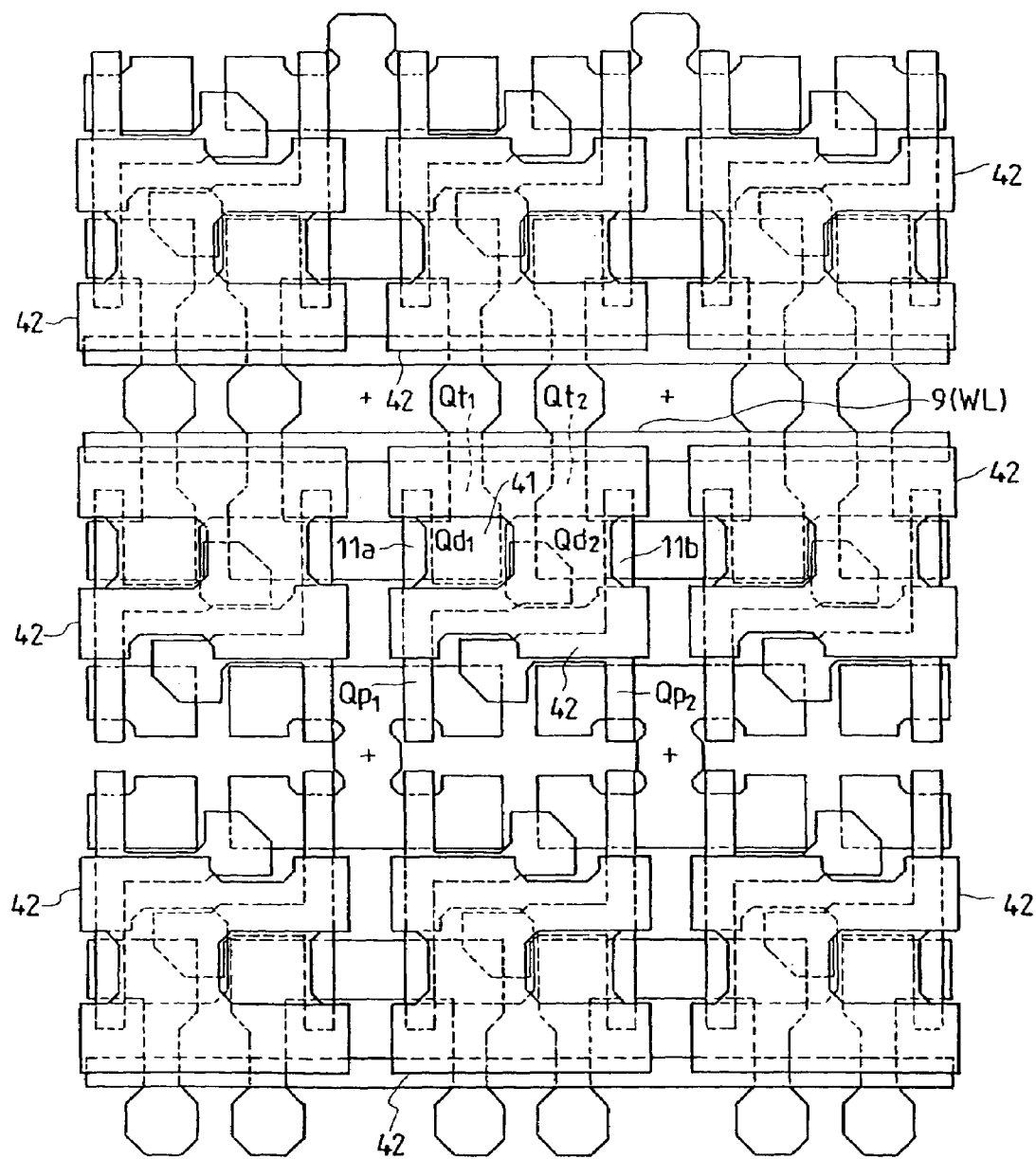
FIG. 31 is a top plan view of the semiconductor substrate and shows the second manufacturing process of the memory cell of the SRAM of the present invention.
Figure 32:
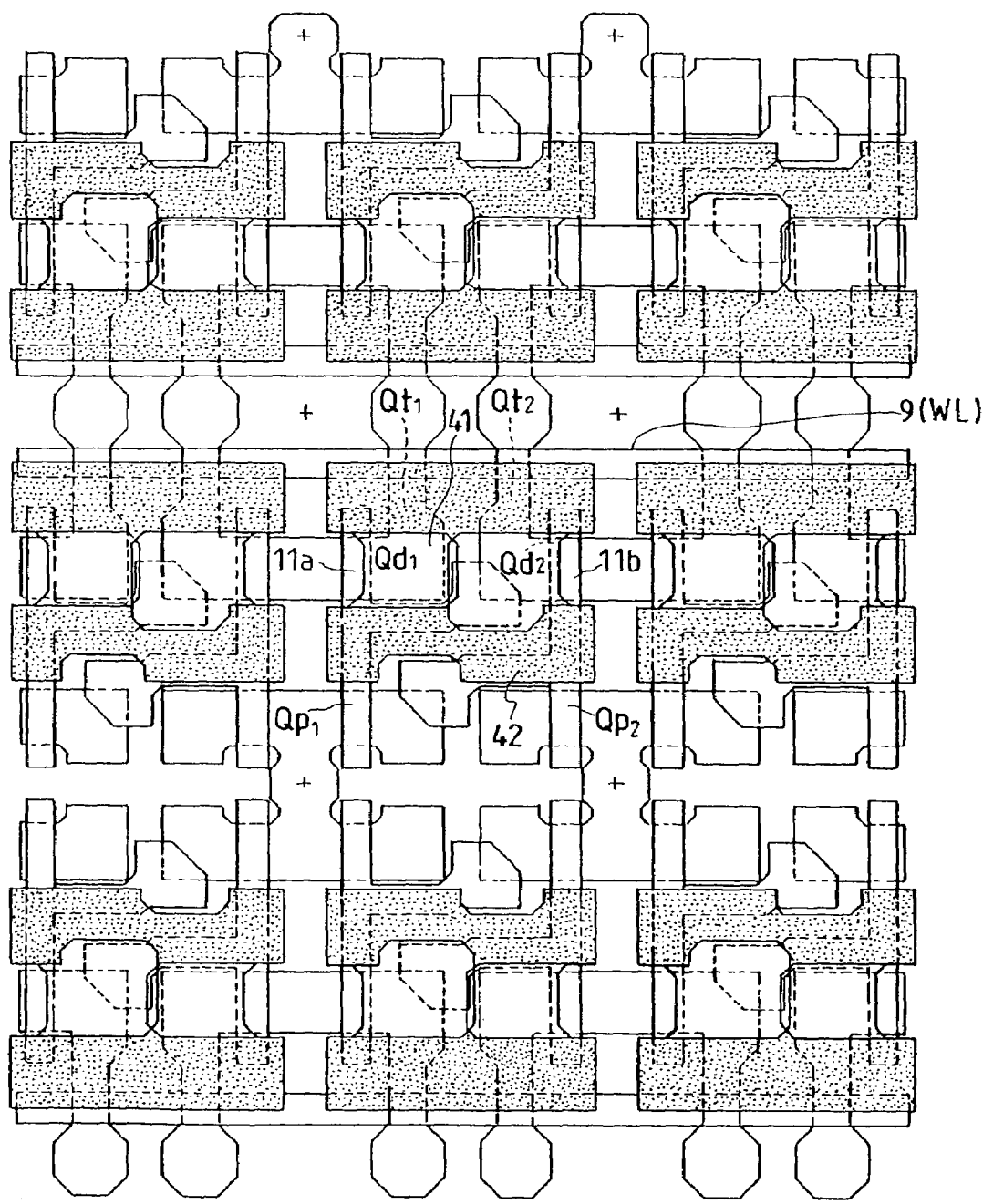
FIG. 32 is a top plan view of the semiconductor substrate and shows the second manufacturing process of the memory cell of the SRAM of the present invention.

Next, as shown in FIGS. 30 and 31, the capacitor insulating film 18 of a silicon nitride film is deposited by a CVD method, and an n-type polycrystalline silicon film, deposited by the CVD method, is subsequently patterned to form the upper electrode 42 of the capacitor element C. Specifically, in the foregoing Embodiment 1, immediately after the deposition of the capacitor insulating film 18, there are made the contact holes (20) which reach the gate electrode 11a common to the load MISFET $Qp_1$ and the driver MISFET $Qd_1$ and the drain region (the n-type semiconductor region 10) of the driver MISFET $Qd_2$. In the present embodiment, on the other hand, this step (the step of forming the contact holes for the third-level layer gate) is omitted, and the deposition of the polycrystalline silicon film for the upper electrode 42 is executed continuously after the deposition of the capacitor element insulating film 18. The regions indicated by the gray patterns of FIG. 32 are the ones (where the capacitor element C of the embodiment is to be formed) where the lower electrodes 41 and the upper electrodes 42 overlap with each other.

<Step of Forming Contact Holes for First-Level Layer Wiring Line>

Figure 33:
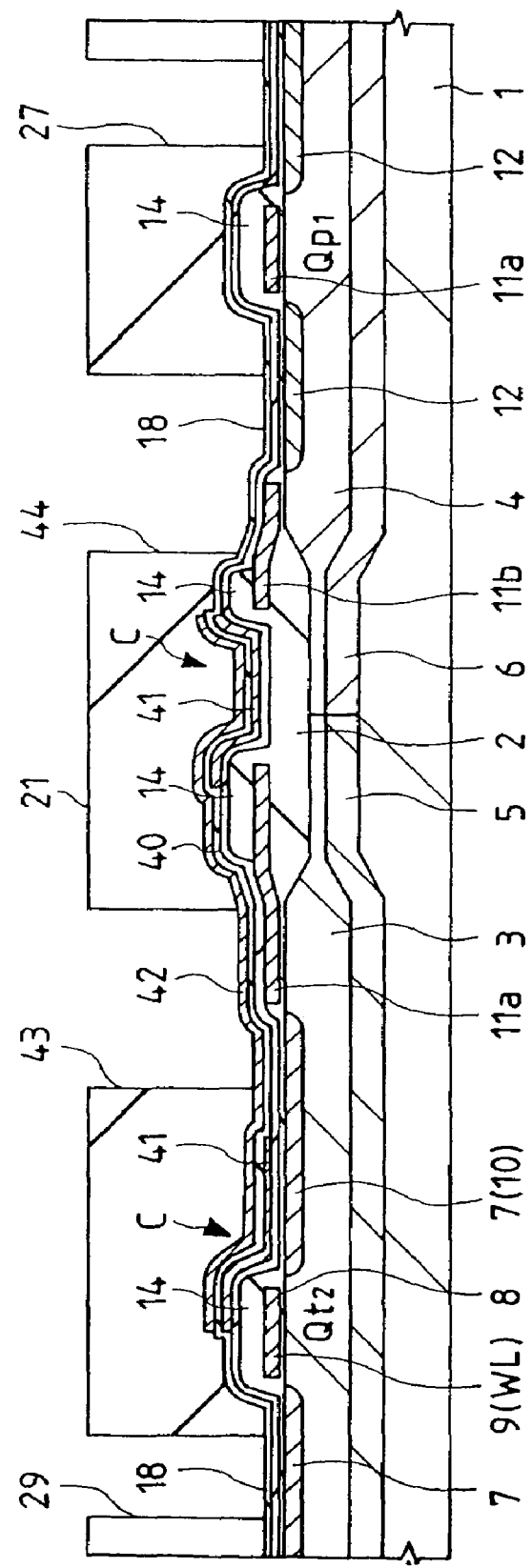
FIG. 33 is a section of an essential portion of the semiconductor substrate and shows the second manufacturing process of the memory cell of the SRAM of the present invention.
Figure 34:
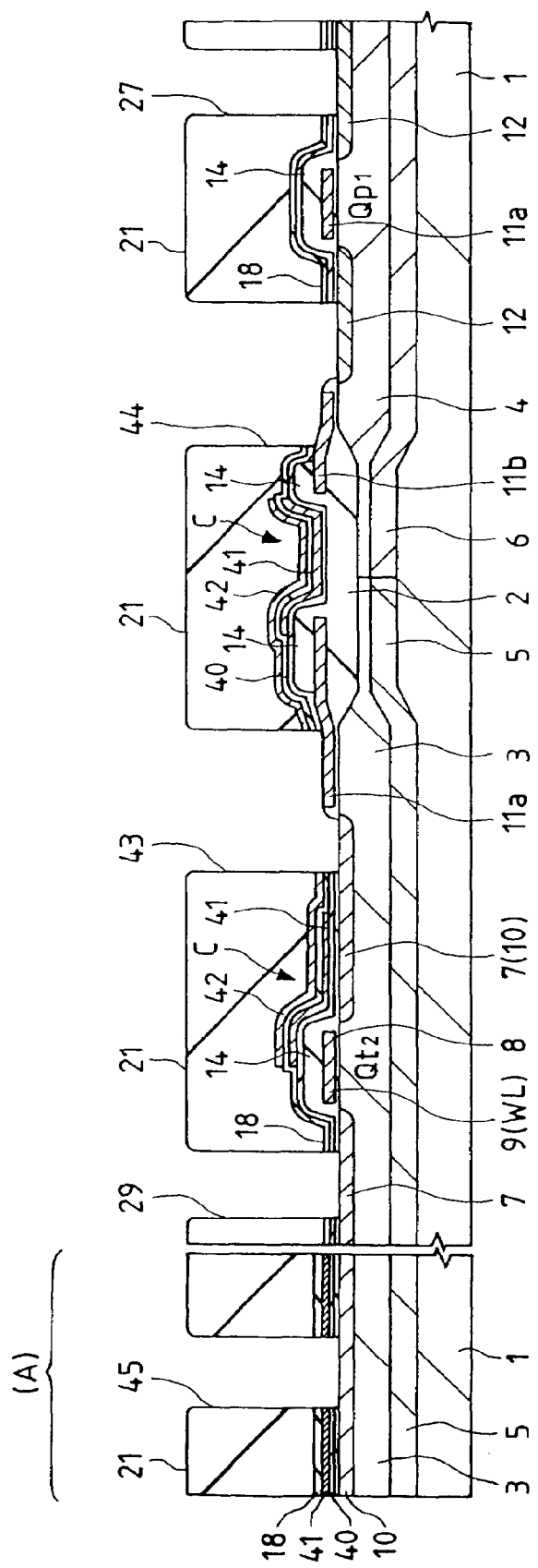
FIG. 34 is a section of an essential portion of the semiconductor substrate and shows the second manufacturing process of the memory cell of the SRAM of the present invention.
Figure 35:
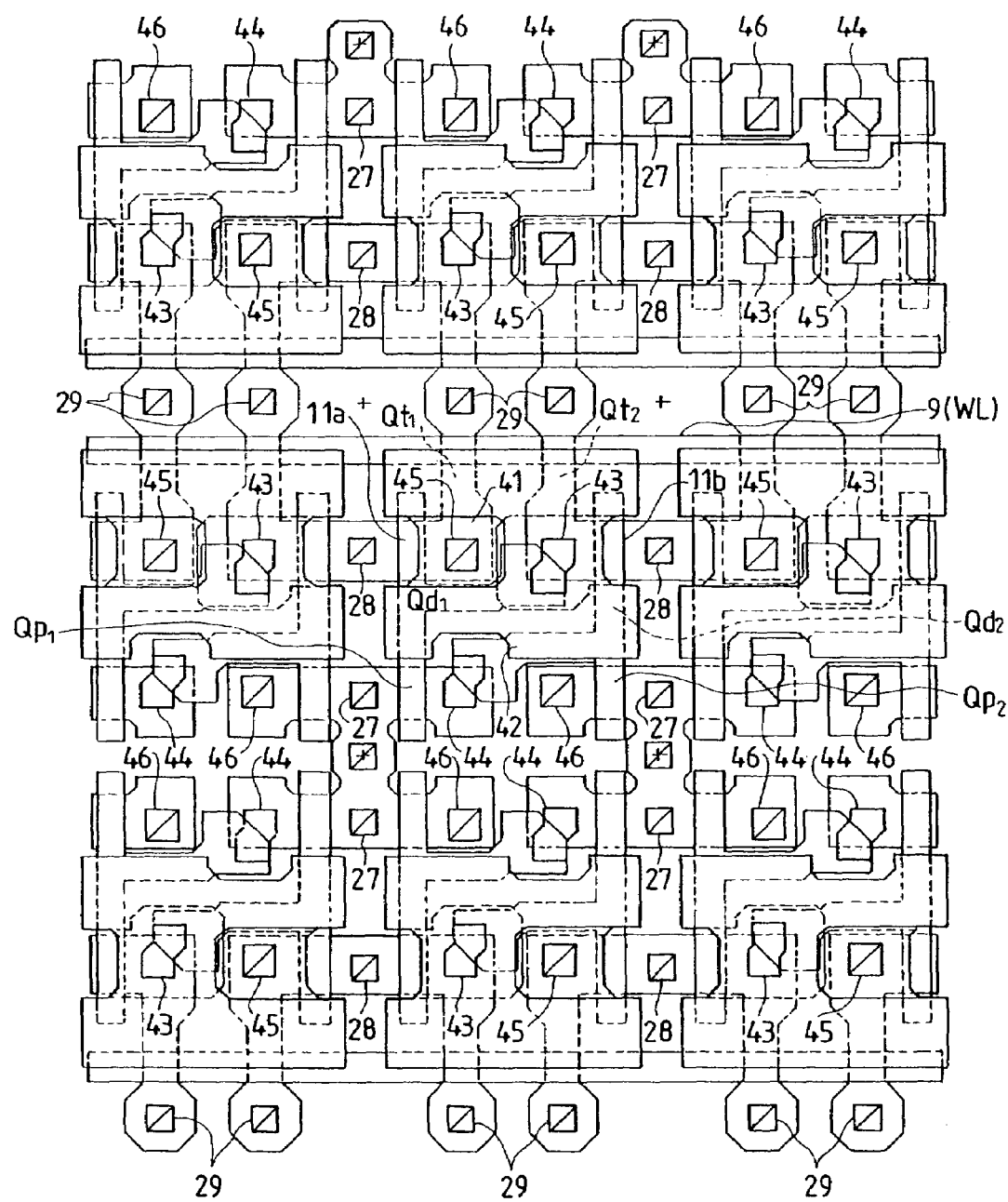
FIG. 35 is a top plan view of the semiconductor substrate and shows the second manufacturing process of the memory cell of the SRAM of the present invention.

Next, as shown in FIGS. 33 to 35, the interlayer insulating film 21 of a BPSG film is deposited by a CVD method, and its surface is flattened by reflow. After this, the interlayer insulating film 21 is etched by using a photoresist by the mask. At this time, only the interlayer insulating film 21 is etched (FIG. 33) by using either the capacitor insulating film 18 (silicon nitride film) below the interlayer insulating film 21 or the upper electrode 42 (polycrystalline silicon film) as the etching stopper.

Next, either the capacitor element insulating film 18 below the interlayer insulating film 21 or the upper electrode 42, the underlying lower electrode 41, the silicon nitride film 40, the silicon oxide film 14 and the insulating film (in the same layer as that of the gate insulating film 9) are etched to make: the contact hole 27 reaching the source region (the p-type semiconductor region 12) of the load MISFETs $Qp_1$ and $Qp_2$; the contact hole 28 reaching the source region (the n-type semiconductor region 10) of the driver MISFETs $Qd_1$ and $Qd_2$; the contact hole 29 reaching the source region (the n-type semiconductor region 7) of the transfer MISFETs $Qt_1$ and $Qt_2$; the contact hole 43 reaching the gate electrode 11a common to the load MISFET $Qp_1$ and the driver MISFET $Qd_1$ and the drain region (the n-type semiconductor region 10) of the driver MISFET $Qd_2$; the contact hole 44 reaching the gate electrode 11b common to the load MISFET $Qp_2$ and the driver MISFET $Qd_2$ and the drain region (or the p-type semiconductor region 12) of the load MISFET $Qp_1$; a contact hole 45 reaching the drain region (the n-type semiconductor region 10) of the driver MISFET $Qd_1$; and a contact hole 46 reaching the drain region (the p-type semiconductor region 12) of the load MISFET $Qp_2$.

The contact hole 43 extends through a portion of the upper electrode 42 and reaches the gate electrode 11a and the drain region (the n-type semiconductor region 10), so that the upper electrode 42 is partially exposed from the side wall of the contact hole 43, as shown in FIG. 34. As shown at portion (A) in FIG. 34, on the other hand, the contact hole 45 extends through a portion of the lower electrode 41 and reaches the drain region (the n-type semiconductor region 10), so that the lower electrode 41 is partially exposed from the side wall of the contact hole 45. The portion (A) of FIG. 34 shows a section of the portion of the contact hole 45.

By the etching treatment after the step shown in FIG. 33, the gate electrode 11a is partially exposed from the bottom of the contact hole 43, and the gate electrode 11b is partially exposed from the bottom of the contact hole 44. The silicon oxide film 14 over the gate electrodes 11a and 11b of this region are thinned in advance, as described hereinbefore, the gate electrodes 11a and 11b can be exposed by the etching treatment performed for a short time. If the silicon oxide film 14 at the bottoms of the contact holes 43 and 44 are not thinned, the silicon oxide film has to be etched for a long time. As a result, when the resist mask is misaligned and hence the contact holes 43 and 44 overlap with the field insulating film 2, this field insulating film 2 may be over-etched and eroded at the end portions of the gate electrodes 11a and 11b.

<Step of Forming First-Level Layer Wiring Line>

Figure 36:
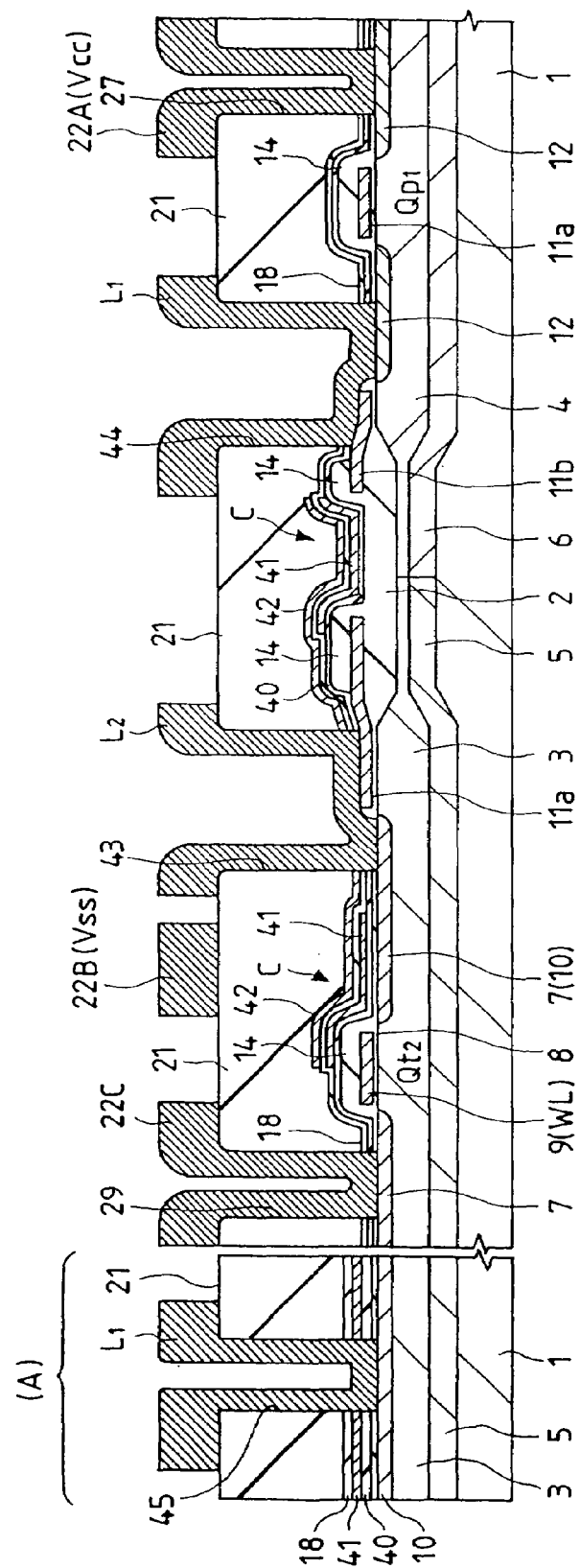
FIG. 36 is a section of an essential portion of the semiconductor substrate and shows the second manufacturing process of the memory cell of the SRAM of the present invention.
Figure 37:
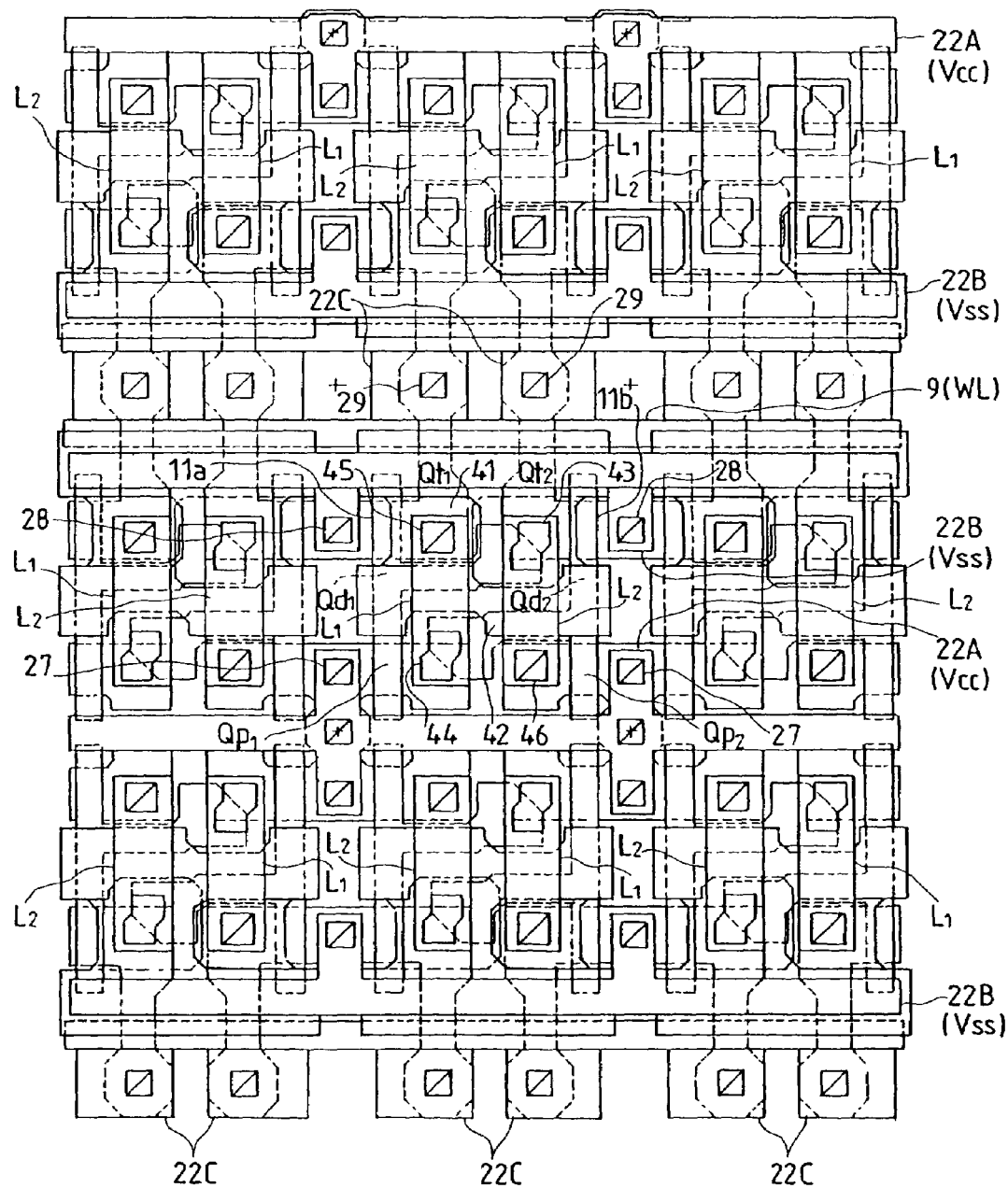
FIG. 37 is a top plan view of the semiconductor substrate and shows the second manufacturing process of the memory cell of the SRAM of the present invention.

Next, as shown in FIGS. 36 and 37, the Al alloy film, deposited on the interlayer insulating film 21 by sputtering, is patterned to form the local wiring lines $L_1$ and $L_2$, the power voltage line 22A, the reference voltage line 22B and the pad layers 22C.

As a result, one end portion of one local wiring line $L_2$ is connected at the side wall of the contact hole 43 to the upper electrode 42 of the capacitor element C, and further at the bottom of the contact hole 43 to the drain region (the n-type semiconductor region 10) of the driver MISFET $Qd_2$ and the gate electrode 11a common to the driver MISFET $Qd_1$ and the load MISFET $Qp_1$. The other end portion of the local wiring line $L_2$ is connected through the contact hole 46 to the drain region (the p-type semiconductor region 12) of the load MISFET $Qp_2$. In short, the drain region (the n-type semiconductor region 10 and the storage node B) of the driver MISFET $Qd_2$, the drain region (the p-type semiconductor region 12) of the load MISFET $Qp_2$, and the gate electrode 11a common to the driver MISFET $Qd_1$ and the load MISFET $Qp_1$ are connected to each other through the local wiring line $L_2$ and the upper electrode 42.

One end portion of the other local wiring line $L_1$ is connected at the side wall of the contact hole 45 to the lower electrode 41 of the capacitor element C, and further at the bottom of the contact hole 45 to the drain region (the n-type semiconductor region 10) of the driver MISFET $Qd_1$. The other end portion of the local wiring line $L_1$ is connected through the contact hole 44 to the drain region (the p-type semiconductor region 12) of the load MISFET $Qp_1$ and the gate electrode 11b common to the driver MISFET $Qd_2$ and the load MISFET $Qp_2$. In short, the drain region (the n-type semiconductor region 10 and the storage node A) of the driver MISFET $Qd_1$, the drain region (the p-type semiconductor region 12) of the load MISFET $Qp_1$ and the gate electrode 11b common to the driver MISFET $Qd_2$ and the load MISFET $Qp_2$ are connected to each other through the local wiring line $L_1$ and the lower electrode 41. Incidentally, the portion (A) of FIG. 36 is a section of the portion of the contact hole 45.

The power voltage line 22A is connected through the contact hole 27 to the source regions (the p-type semiconductor region 12) of the load MISFETs $Qp_1$ and $Qp_2$, and the reference voltage line 22B is connected through the contact hole 28 to the source regions (the n-type semiconductor region 10) of the driver MISFETs. $Qd_1$ and $Qd_2$. Moreover, one of the paired pad layers 2C is connected through the contact hole 29 to the drain region (the n-type semiconductor region 7) of the transfer MISFET $Qt_1$, and the other is connected through the contact hole 29 to the drain region (the n-type semiconductor region 7) of the transfer MISFET $Qt_2$.

Figure 38A:
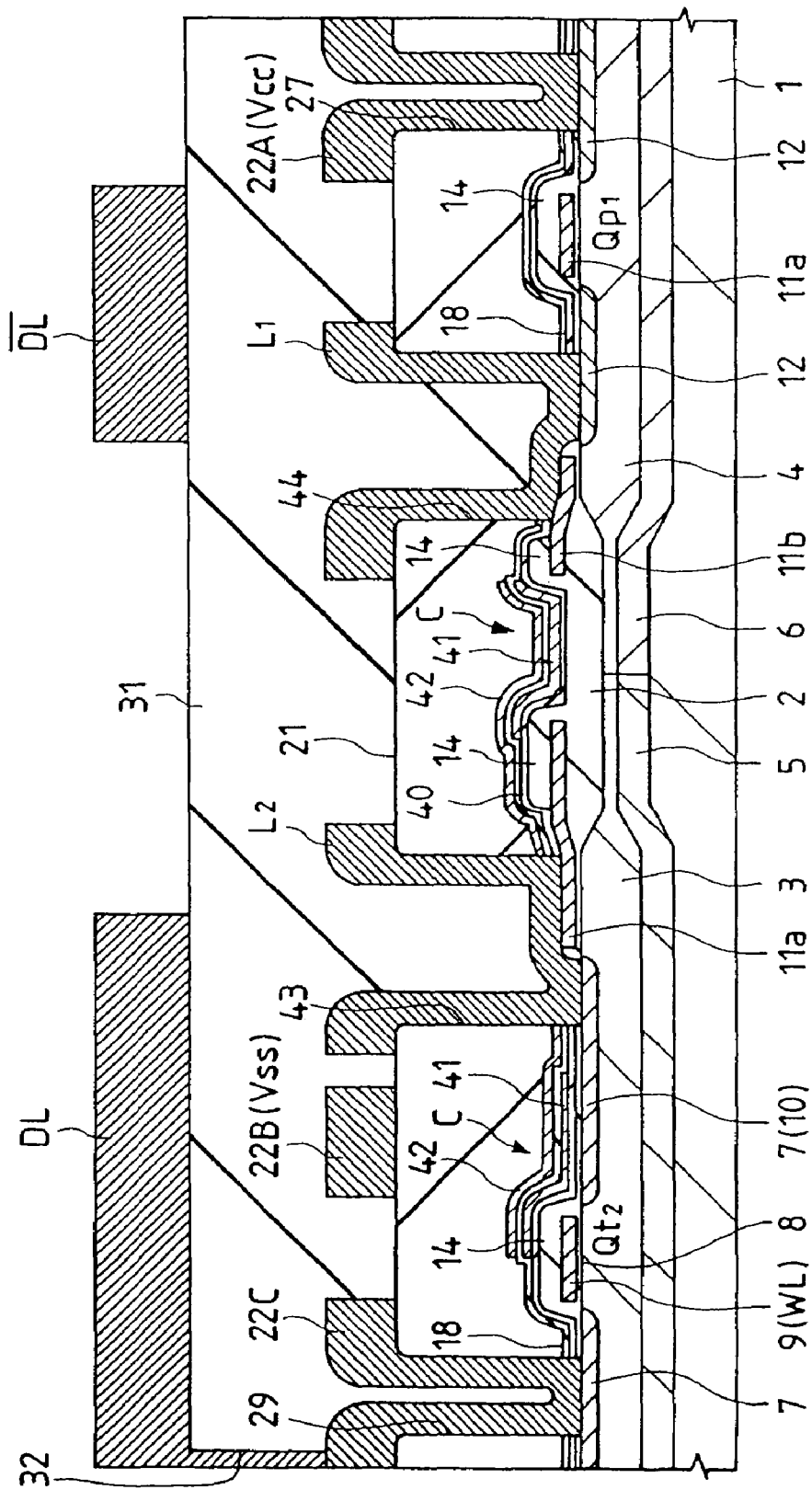
FIG. 38($a$) is a section of an essential portion of the semiconductor substrate and shows the second manufacturing process of the memory cell of the SRAM of the present invention.

After this, the contact hole 32 is made in the interlayer insulating film 31 which is composed of the silicon oxide film deposited by a CVD method, as shown in FIG. 38(a). After this, the Al alloy film, deposited on the interlayer insulating film 31 by sputtering, is patterned to form the data lines DL and /DL and to connect the data lines DL and /DL and the pad layers 22C through the contact hole 32.

Thus, in the manufacture method of the present embodiment, there are omitted from Embodiment 1: the step (the step of making the contact holes for second-level layer gate) of making the contact holes reaching the drain region (the n-type semiconductor region 10) of the driver MISFET $Qd_1$ prior to the step of forming the lower electrode 41 of the capacitor element C; and the step (the step of making the contact holes for the second-level layer gate) of making the contact holes reaching the gate electrode 11a common to the load MISFET $Qp_1$ and the driver MISFET $Qd_1$ and the drain region (the n-type semiconductor region 10) of the driver MISFET $Qd_2$ prior to the step of forming the upper electrode 42 after the deposition of the capacitor insulating film 18. As a result, the two etching steps using the photoresists as the masks can be eliminated to shorten the memory cell manufacturing process accordingly.

Figure 38B:
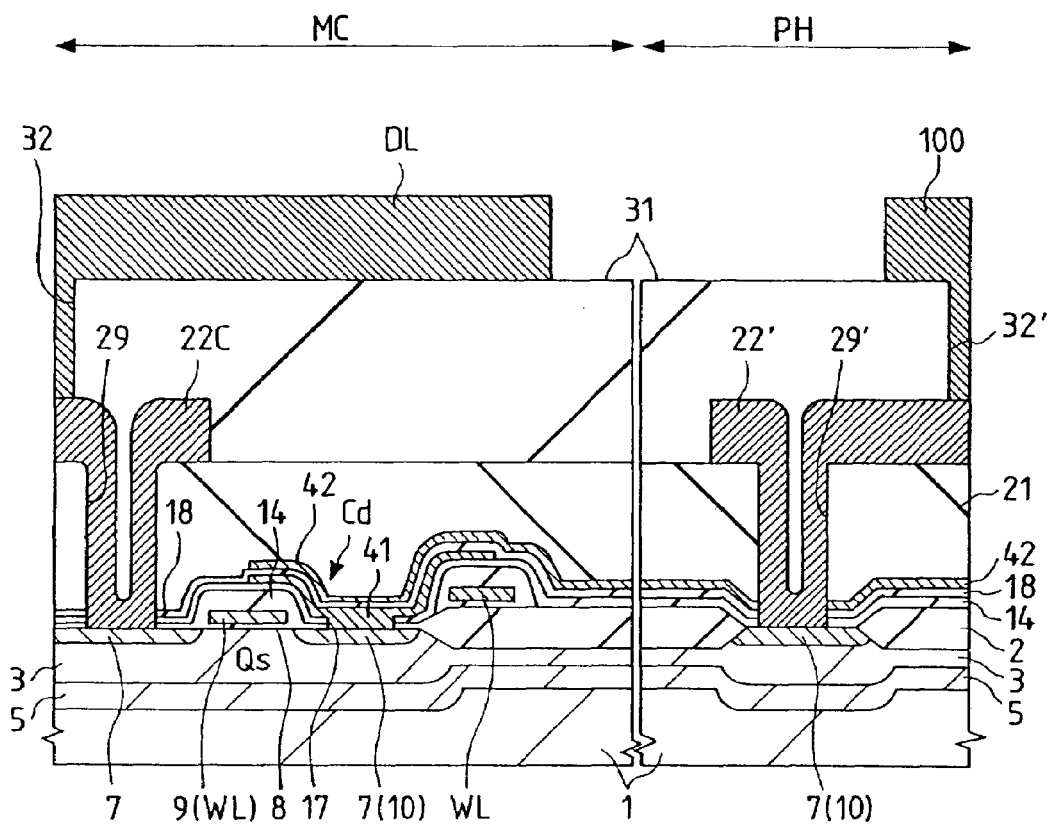
Figure 65:
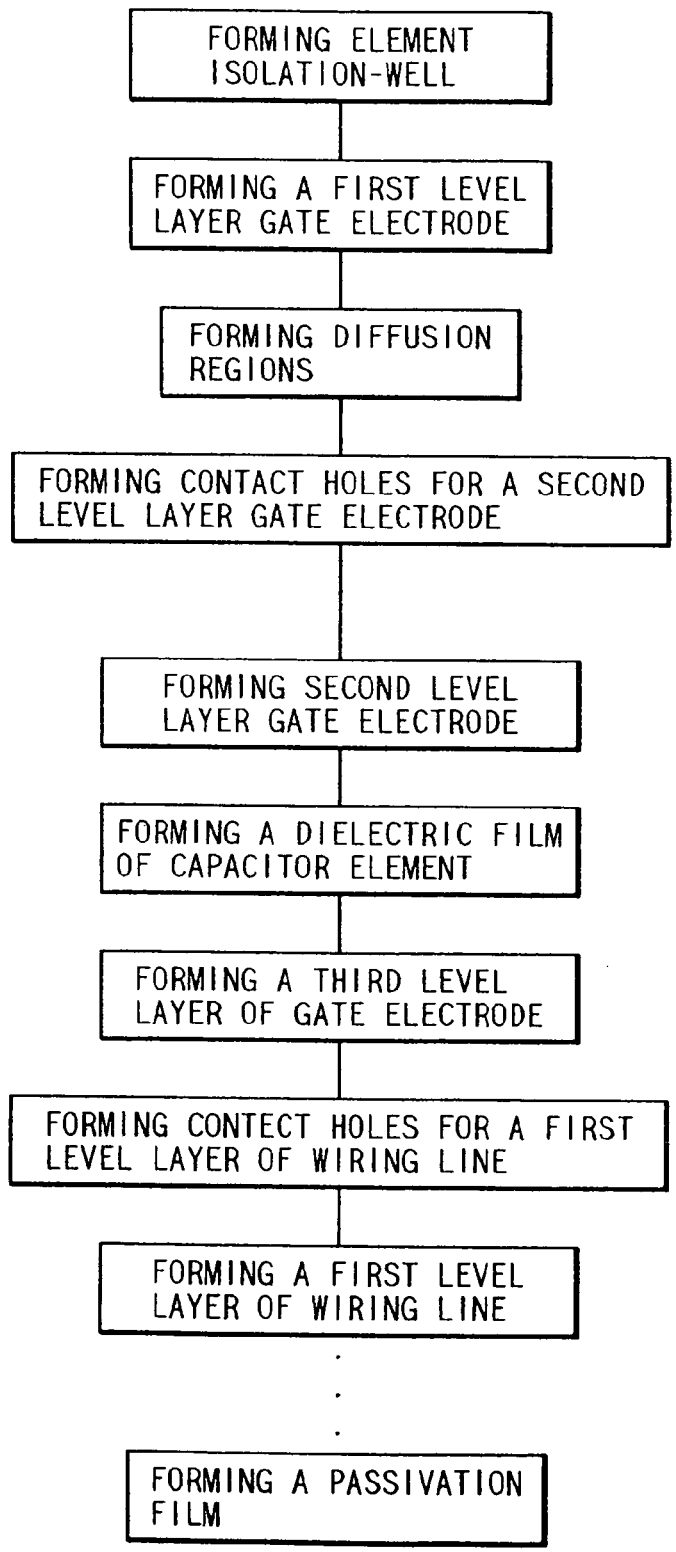
FIG. 65 is a flow chart of the process of the one-chip microcomputer in which the SRAM of the present invention and the DRAM are mixedly provided.

Incidentally, it is also possible to omit either of the aforementioned two contact hole making steps. If the contact hole 17 is made in the step (the step of making the contact holes for the second-level layer gate) of forming the lower electrode 41 of the capacitor element C, as shown in FIGS. 65 and 38(b), and if no contact hole is made at the step (the step of making the contact holes for the third-level layer gate) of making the upper electrode 42, it is possible to make common the process for forming an information storing capacitor element Cd having a stack structure over a memory cell selecting MISFET Qs of a DRAM (Dynamic Random Access Memory) and the process for forming the capacitor element C of the present invention. As a result, it is possible to shorten the process for manufacturing a one-chip microcomputer in which the DRAM and the SRAM are mixedly provided in one semiconductor chip.

Specifically, as shown in FIG. 38(b), the information storing capacitor element Cd of the DRAM is formed in the same step (the step of forming the lower electrode 41, the capacitor insulating film 18 and the upper electrode 42) as that of forming the capacitor element C of the SRAM, so that the capacitor element Cd of the DRAM can be formed simultaneously with the process for forming the capacitor element C of the SRAM. Incidentally, one electrode 41 of the information storing capacitor element Cd of the DRAM is electrically connected to one of the source/drain regions 7 (10) of the memory cell selecting MISFET Qs of the DRAM through the contact hole 17 which is made in the step of making the contact holes for the second-level layer gate. The other electrode 42 of the information storing capacitor element Cd of the DRAM is formed integrally with the plate electrode 42. This plate electrode 42 is formed to cover the memory cells of the DRAM and is fed with a plate voltage Vp. This plate voltage Vp is set at Vcc/2, for example. The other of the source/drain regions 7 (10) of the memory cell selecting MISFET Qs of the DRAM is electrically connected to the data line DL through the pad layers 22C.

Moreover, the DRAM can be formed simultaneously with the process for forming the SRAM by forming the memory cell selecting MISFET Qs of the DRAM in the same step as that of forming the driver MISFET Qd.

Moreover, the plate electrode 42 is electrically connected through the side wall of a contact hole 29' to a wiring line 22' composed of a first-level layer Al alloy film, and the wiring line 22' is electrically connected through the side wall of a contact hole 32' to a wiring line 100 formed of a second-level layer Al alloy film.

Figure 38C:
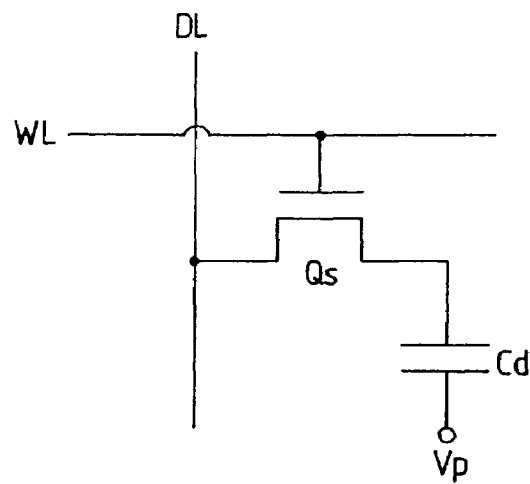

Incidentally, FIG. 38(b) shows the DRAM which is formed over the same substrate 1 in which is formed the SRAM shown in FIG. 38(a). In FIG. 38(b), reference symbol MC designates the region where a memory cell of the DRAM is formed, and symbol PG designates the region where a power feeder for feeding electric power to the plate electrode 42 is formed. FIG. 38(c) shows an equivalent circuit diagram of the memory cell of the DRAM. As shown in FIG. 38(c), the memory cell of the DRAM is composed of the memory cell selecting MISFET Qs and the information storing capacitor element Cd.

With reference to FIG. 38(b), here will be briefly described the process for manufacturing a semiconductor integrated circuit device which comprises: an SRAM including memory cells each having a flip-flop circuit composed of paired driver MISFETs Qd and paired load MISFETs Qp and paired transfer MISFETs Qt; and a DRAM including memory cells each composed of memory cell selecting MISFETs Qs and information storing capacitor elements Cd formed over the MISFETs Qs.

First of all, the gate electrodes 9 (WL) of the driver MISFETs Qd, the load MISFETs Qp, the transfer MISFETs Qt and the memory cell selecting MISFETs Qs are formed of the first conductive film 9 which is formed over the principal face of the semiconductor substrate 1.

Next, the capacitor element C is formed of the second conductive film 41 deposited on the first conductive film 9, the insulating film 18 of dielectric formed over the second conductive film 41 and the third conductive film 42 formed over the insulating film 18 over the memory cells of the SRAM, and the information storing capacitor element Cd is formed over the memory cell selecting MISFETs Qs of the DRAM.

Next, the first metal film formed over the third conductive film 42 is patterned to form the paired metal wiring lines $L_1$ and $L_2$, and one electrode 41 of the capacitor element of the SRAM is electrically connected to one of the storage nodes of the memory cells of the SRAM through one of the paired metal wiring lines, and the other electrode 42 of the capacitor element is electrically connected to the other storage node of the memory cell through the other of the paired metal wiring lines.

In the manufacturing process of the present embodiment, the deposition of the capacitor insulating film 18 and the deposition of the third-level layer polycrystalline silicon film are continuously performed. As a result, the surface of the capacitor insulating film 18 can be less contaminated, and consequently the capacitor element C of high quality can be formed.

In the manufacturing process of the present embodiment, moreover, prior to the step of etching the insulating film to make the contact hole 43 reaching the gate electrode 11a and the contact hole 44 reaching the gate electrode 11b, the insulating film (the silicon oxide film 14) over the gate electrodes 11a and 11b is thinned. This makes it possible to suppress the erosion of the field insulating film 2 due to misalignment of the resist mask used for making the contact holes 43 and 44, thereby improving the manufacturing yield and the reliability of the SRAM. As a result, the margin of misalignment of the contact holes 43 and 44, the gate electrodes 11a and 11b and the drain regions (the n-type semiconductor region 10) becomes unnecessary, and hence the area of the memory cells can be decreased and the packaging density can be increased. In the MISFETs constituting the peripheral circuit of the SRAM, still moreover, when the gate electrode 11 is composed of the first level layer of n-type polycrystalline silicon film (the polycide film) and connected to the first-level layer of the wiring line 22 of an aluminum (Al) alloy film, the insulating film 14 over the gate electrode is made so thin that similar effects can be attained, too, in the MISFETs constituting the peripheral circuit.

Figure 39:
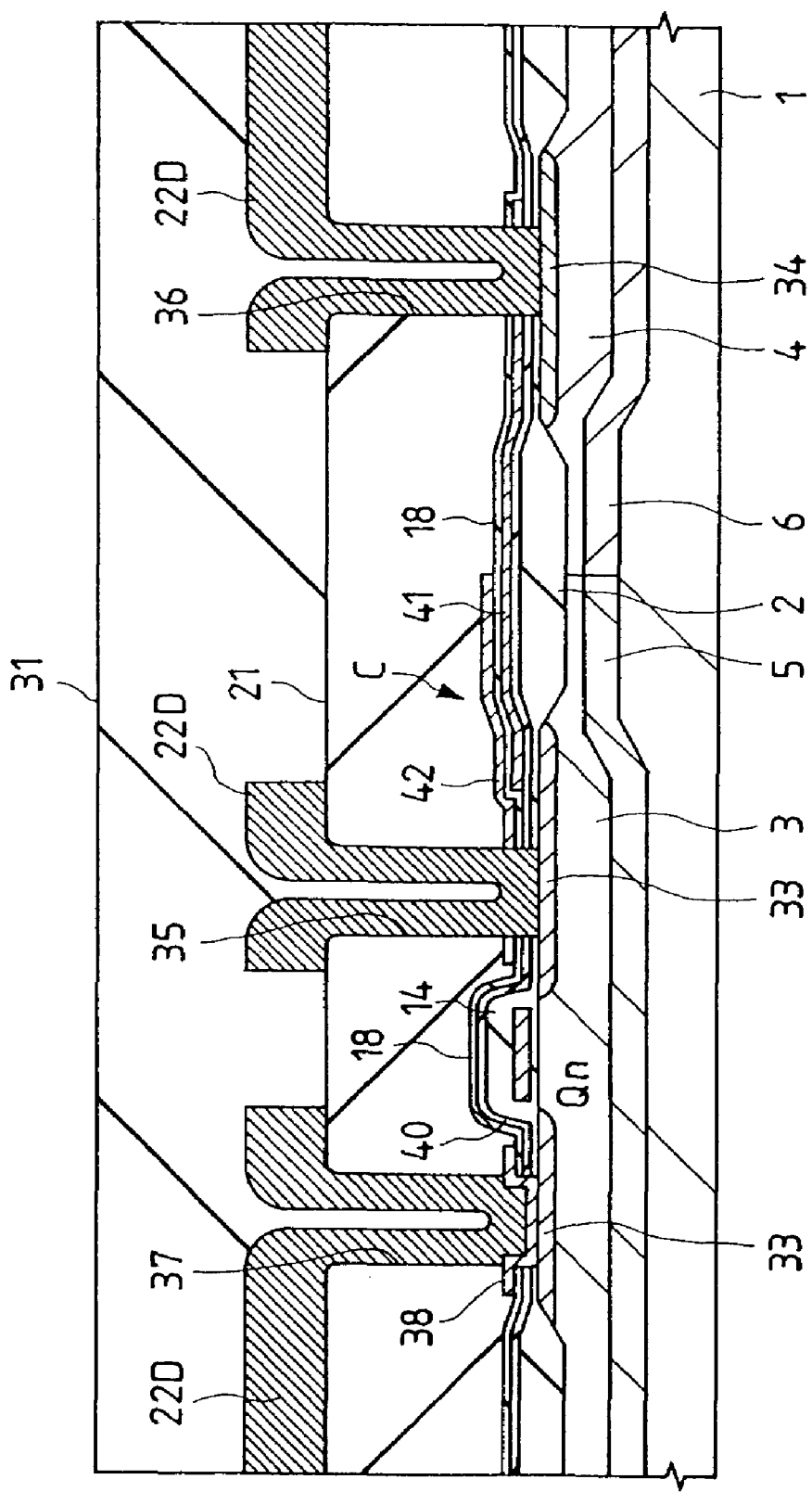
FIG. 39 is a section of an essential portion of the semiconductor substrate and shows the peripheral circuit of the SRAM of the present invention.

In the peripheral circuit such as the input/output protective circuit of the SRAM of the present embodiment, for example, as shown in FIG. 39, there is formed a capacitor element C which has substantially the same structure as that of the capacitor element C of the aforementioned memory cells. The lower electrode 41 of this capacitor element C is composed of the second-level layer n-type polycrystalline silicon film in the same step as that of the lower electrode 41 of the capacitor element C of the memory cells. The capacitor insulating film 18 is composed of the silicon nitride film in the same step as that of the capacitor insulating film of the capacitor element C of the memory cells. The upper electrode 42 is composed of the third-level layer n-type polycrystalline silicon film in the same step as that of the upper electrode 42 of the capacitor element C of the memory cells.

The lower electrode 41 of this capacitor element C is connected to the wiring line 22D at the side wall of the contact hole 36 made in the interlayer insulating film 21, and further to the p-type semiconductor region 34 of the n-type well 4 through the wiring line 22D. The upper electrode 42 is connected to the wiring line 22D at the side wall of the contact hole 35 made in the interlayer insulating film 21, and further to the n-type semiconductor region 33 of the n-channel type MISFET Qn through the wiring line 22D. The other n-type semiconductor region 33 of the n-channel MISFET Qn is connected to the wiring line 22D through the pad layer 38 composed of the same third-level layer n-type polycrystalline silicon film as that of the upper electrode 42 of the capacitor element C. The pad layer 38 may be composed of the same second-level layer n-type polycrystalline silicon film as that of the lower electrode 41 of the capacitor element C.

Embodiment 3

The process for manufacturing the memory cells of the SRAM of the present embodiment will be described with reference to FIGS. 40 to 52. Incidentally, of the individual Figures showing the memory cell manufacturing process, the top plan views show only the conductive films and the contact holes but not the insulating films.

First of all, as shown in FIG. 40, the first-level layer n-type polycrystalline silicon film is patterned to form the gate electrodes 9 (the word line WL) of the transfer MISFETs $Qt_1$ and $Qt_2$, the gate electrode 11a common to the load MISFET $Qp_1$ and the driver MISFET $Qd_1$, and the gate electrode 11b common to the load MISFET $Qp_2$ and the driver MISFET $Qd_2$ over the principal faces of the active regions of the p-type well 3 and the n-type well 4. Next, the silicon oxide 14 covering the gate electrodes 11a and 11b of the regions where the contact holes for connections of the local wiring lines set up in the later step are made is etched and thinned.

Next, the side wall spacer 13 is formed on the side walls of the gate electrode 9 (the word line WL) and the gate electrodes 11a and 11b. After this, the n-type semiconductor region 7 (the source and drain regions of the transfer MISFETs $Qt_1$ and $Qt_2$) and the n-type semiconductor region 10 (the source and drain regions of the driver MISFETs $Qd_1$ and $Qd_2$) are formed in the p-type well 3, and the p-type semiconductor region 12 (the source and drain regions of the load MISFETs $Qp_1$ and $Qp_2$) is formed in the n-type well 4. The steps up to this are identical to those of the foregoing Embodiment 2.

Figure 42:
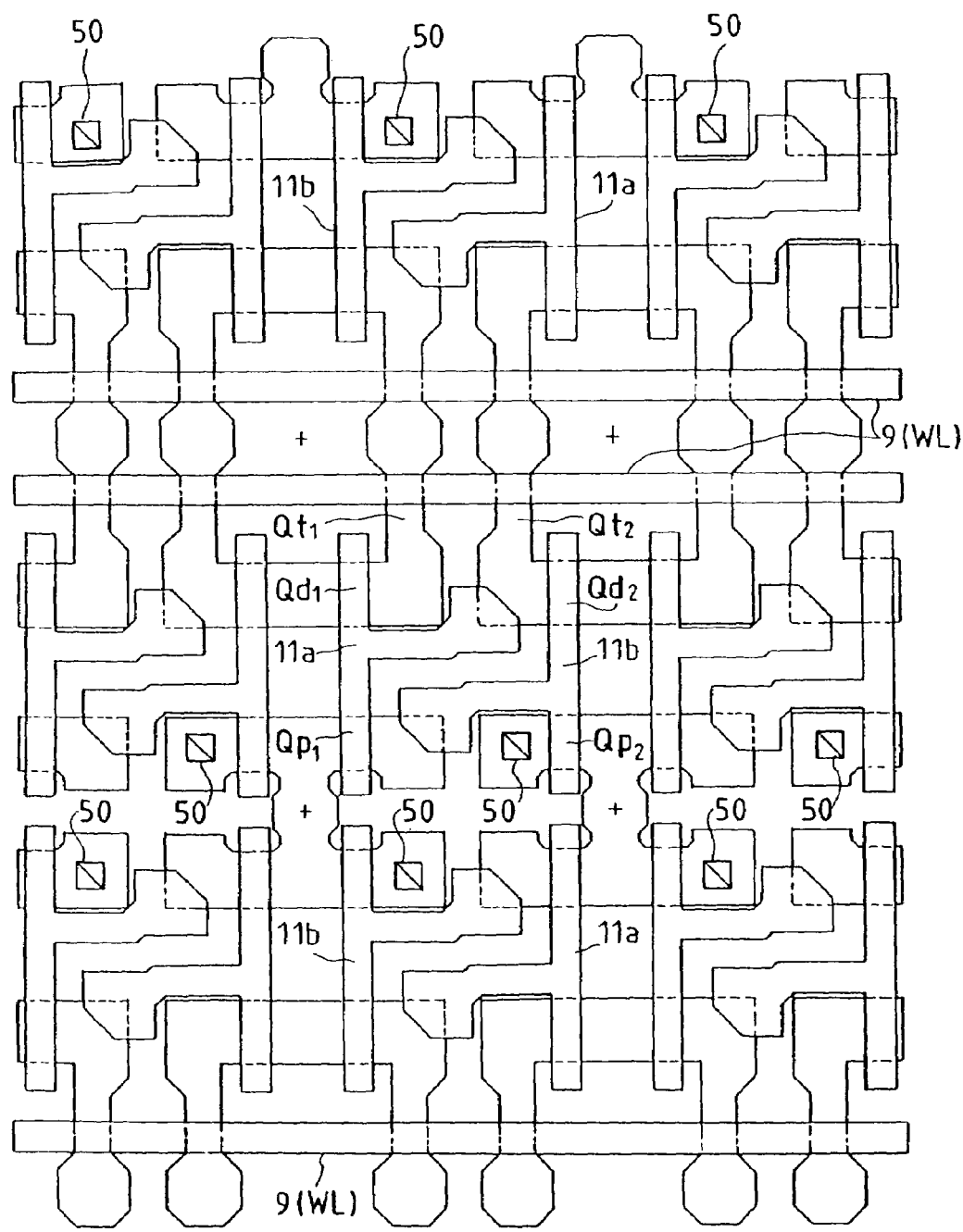
FIG. 42 is a top plan view of the semiconductor substrate and shows the third manufacturing process of the memory cell of the SRAM of the present invention.

Next, in the present embodiment, the silicon nitride film 40 is deposited on the semiconductor substrate 1 by a CVD method, as shown in FIG. 41. After this, the silicon nitride film 40 and the underlying insulating film (the insulating film formed in the same layer as that of the gate insulating film 9) are etched to make contact holes 50 reaching the drain region (the p-type semiconductor region 12) of the load MISFET $Qp_1$, as shown in FIG. 42.

Figure 43:
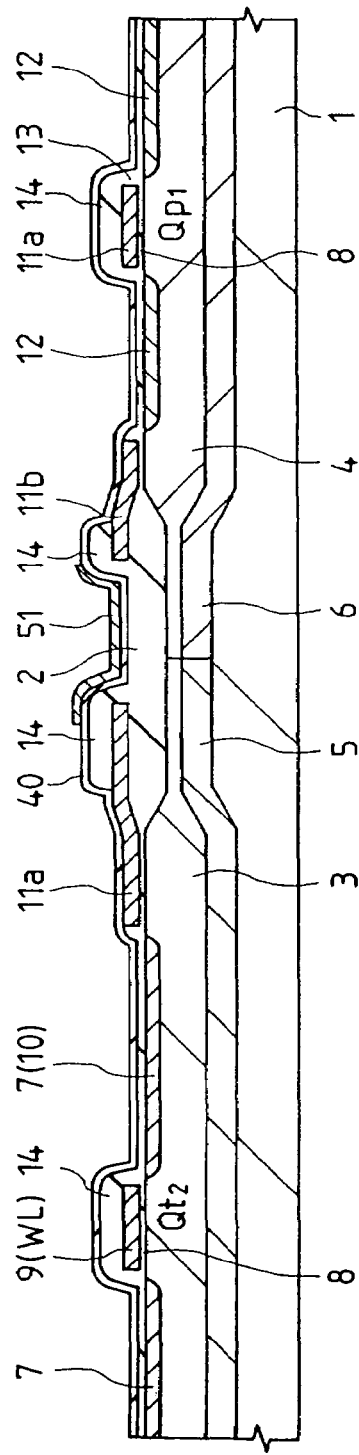
FIG. 43 is a section of an essential portion of the semiconductor substrate and shows the third manufacturing process of the memory cell of the SRAM of the present invention.
Figure 44:
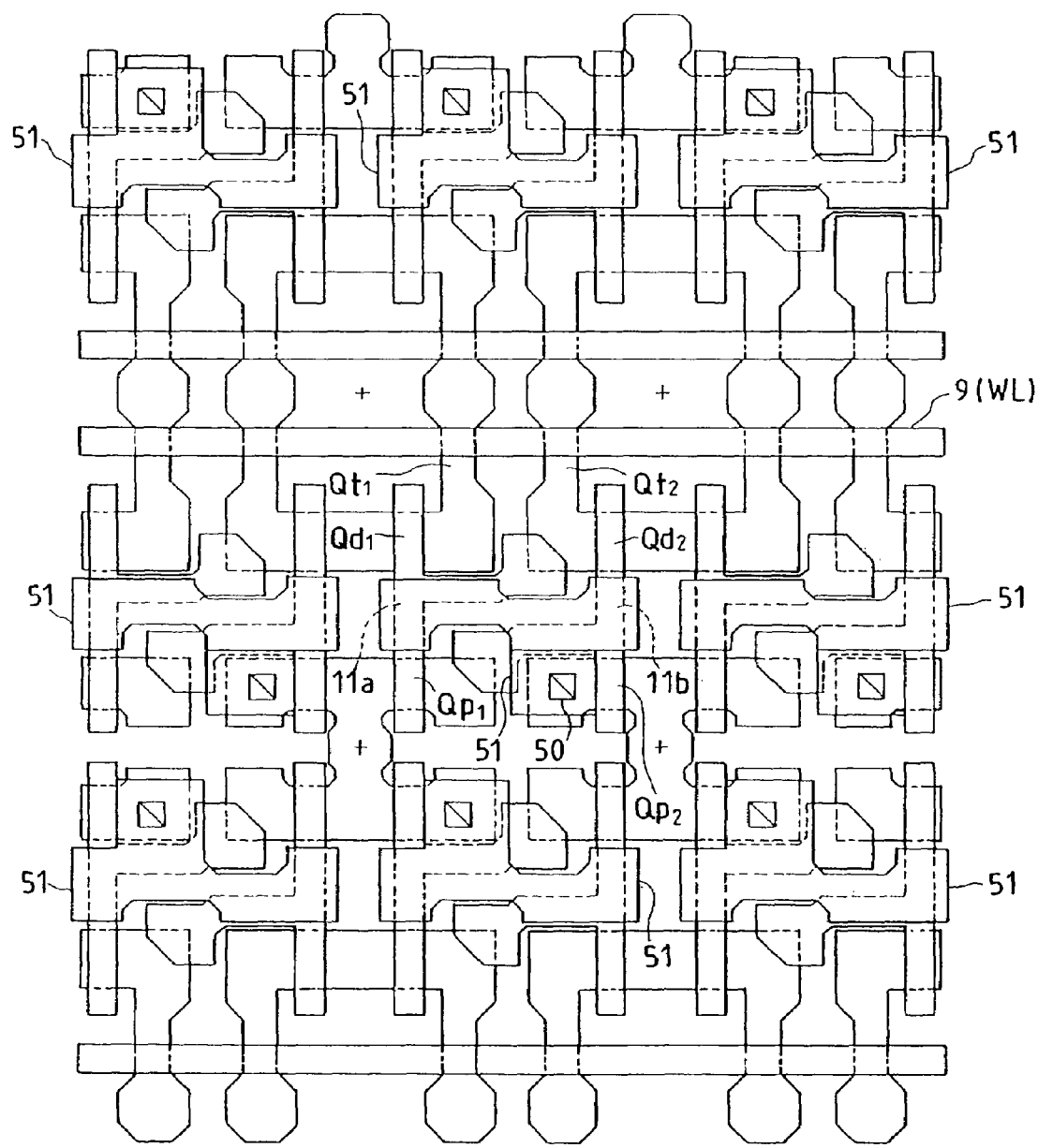
FIG. 44 is a top plan view of the semiconductor substrate and shows the third manufacturing process of the memory cell of the SRAM of the present invention.

Next, as shown in FIGS. 43 and 44, the polycrystalline silicon film, deposited by a CVD method, is patterned to form a lower electrode 51 of the capacitor element C. At this time, in the present embodiment, the lower electrode 51 is composed of a p-type polycrystalline silicon film and is connected directly to the drain region (the p-type semiconductor region 12) of the load MISFET $Qp_1$ through the contact hole 50.

Figure 46:
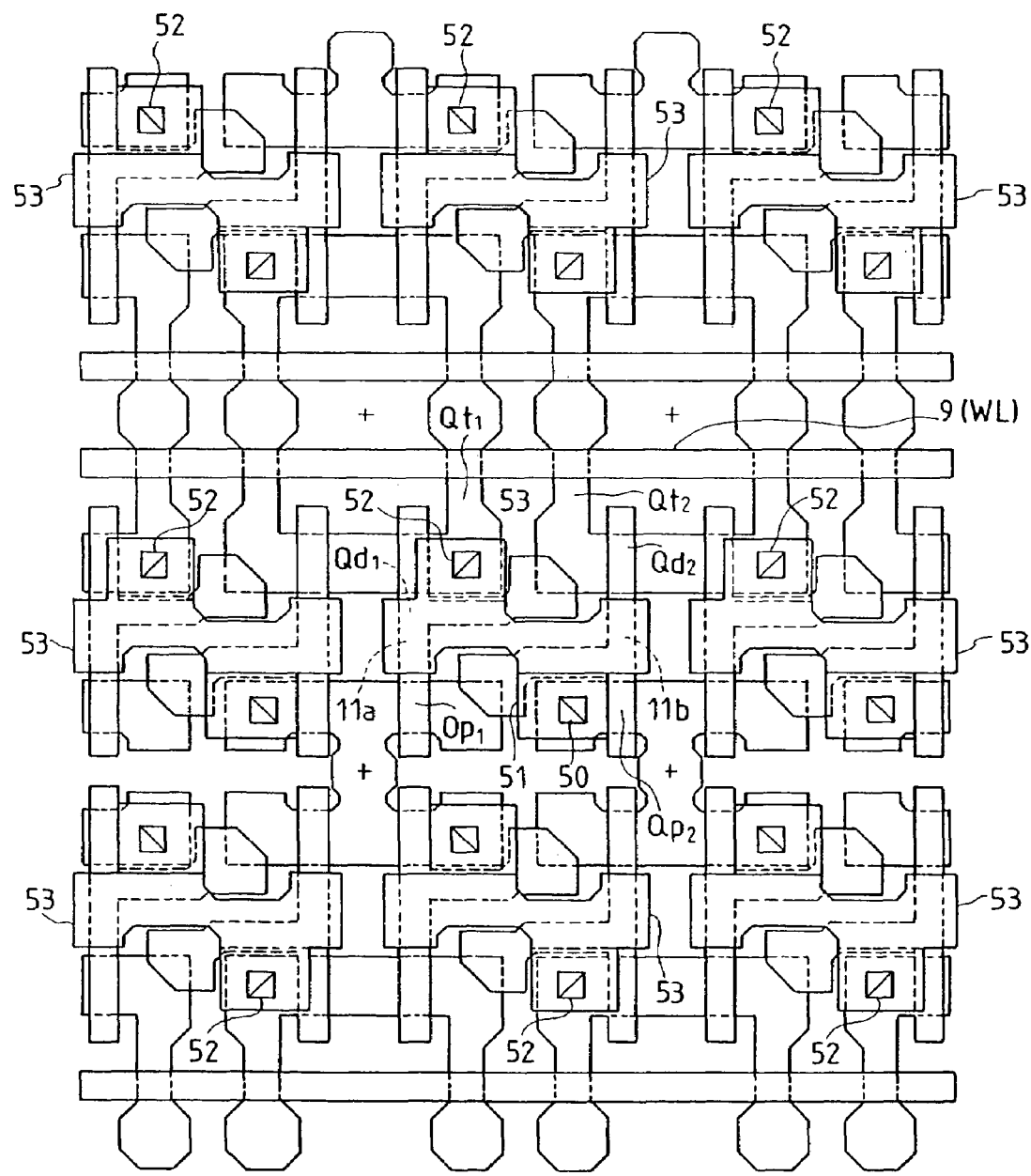
FIG. 46 is a top plan view of the semiconductor substrate and shows the third manufacturing process of the memory cell of the SRAM of the present invention.
Figure 47:
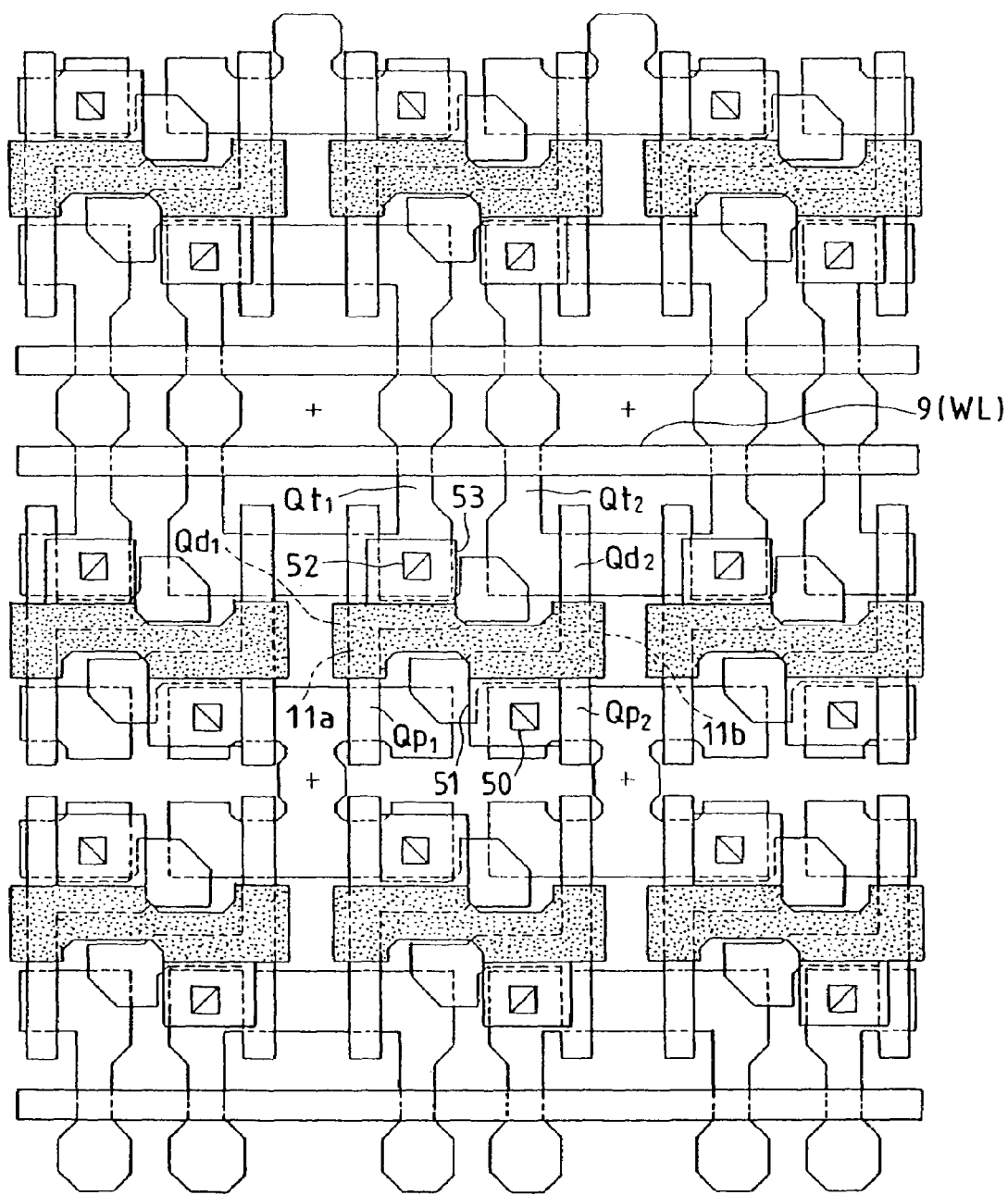
FIG. 47 is a top plan view of the semiconductor substrate and shows the third manufacturing process of the memory cell of the SRAM of the present invention.

Next, as shown in FIGS. 45 and 46, the capacitor insulating film 18, composed of the silicon nitride film deposited by a CVD method, and the underlying insulating film (formed in the same layer as that of the gate insulating film 9) are etched to make contact holes 52 reaching the drain region (the n-type semiconductor region 10) of the driver MISFET $Qd_1$. After this, the n-type polycrystalline silicon film, a deposited by a CVD method, is patterned to form an upper electrode 53 of the capacitor element C. This upper electrode 53 is connected through the contact hole 52 to the drain region (the n-type semiconductor region 10) of the driver MISFET $Qd_1$. The regions indicated by the gray patterns of FIG. 47 are the ones (where the capacitor element C of the embodiment is to be formed) where the lower electrodes 51 and the upper electrodes 53 overlap with each other.

Figure 48:
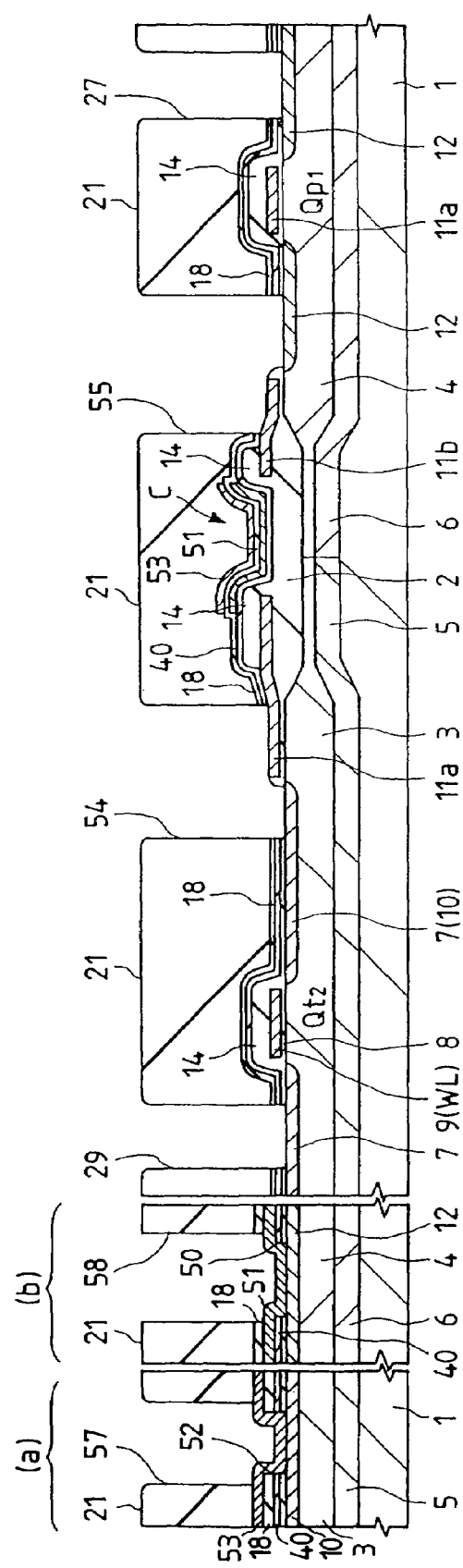
FIG. 48 is a section of an essential portion of the semiconductor substrate and shows the third manufacturing process of the memory cell of the SRAM of the present invention.
Figure 49:
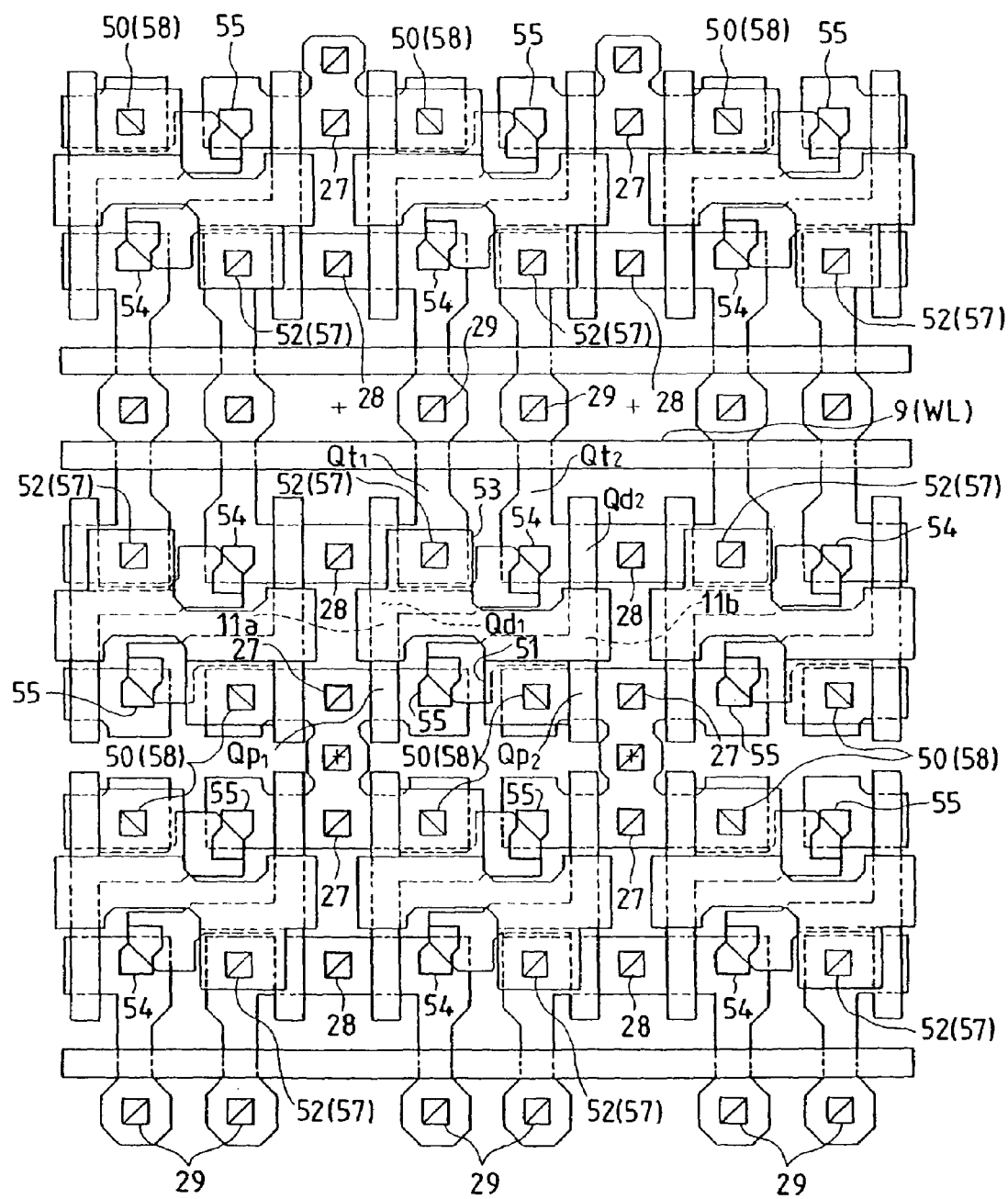
FIG. 49 is a top plan view of the semiconductor substrate and shows the third manufacturing process of the memory cell of the SRAM of the present invention.

Next, as shown in FIGS. 48 and 49, the interlayer insulating film 21 of the BPSG film is deposited by a CVD method, and its surface is flattened by reflow. After this, by using a photoresist as the mask, the interlayer insulating film 21 is etched at first. Subsequently, the capacitor insulating film 18 and the upper electrode 52 or the lower electrode 51 below the interlayer insulating film 21, and the underlying silicon nitride film 40, the silicon oxide film 14 and the insulating film (formed in the same insulating film as that of the gate insulating film 9) are etched to make the contact hole 27 reaching the source regions (the p-type semiconductor region 12) of the load MISFETs $Qp_1$ and $Qp_2$, the contact hole 28 reaching the source regions (the n-type semiconductor region 10) of the driver MISFETs $Qd_1$ and $Qd_2$, the contact hole 29 reaching the source regions (the n-type semiconductor region 7) of the transfer MISFETs $Qt_1$ and $Qt_2$, a contact hole 54 reaching the gate electrode 11a common to the load MISFET $Qp_1$ and the driver MISFET $Qd_1$ and the drain region (the n-type semiconductor region 10) of the driver MISFET $Qd_2$, a contact hole 55 reaching the gate electrode 11b common to the load MISFET $Qp_2$ and the driver MISFET $Qd_2$ and the drain region (the p-type semiconductor region 12) of the load MISFET $Qp_1$, a contact hole 57 reaching the upper electrode 53 over the drain region (the n-type semiconductor region 10) of the MISFET $Qd_1$, and a contact hole 58 reaching the lower electrode 51 over the drain region (the p-type semiconductor region 12) of the load MISFET $Qp_2$. Incidentally, portion (a) of FIG. 48 shows a section of the portion of the contact hole 57, and portion (b) of FIG. 48 shows a section of the portion of the contact hole 58.

The gate electrode 11a is partially exposed from the bottom of the contact hole 54 after this contact hole 54 is made, and the gate electrode 11b is partially exposed for the bottom of the contact hole 55 after this contact hole 55 is made. Since the silicon oxide film 14 over the gate electrodes 11a and 11b in that region is thinned in advance, as described hereinbefore, the erosion of the field insulating film 2 due to the misalignment of the resist masks used for making the contact holes 54 and 55, can be suppressed, providing effects similar to those of the foregoing Embodiment 2.

Figure 50:
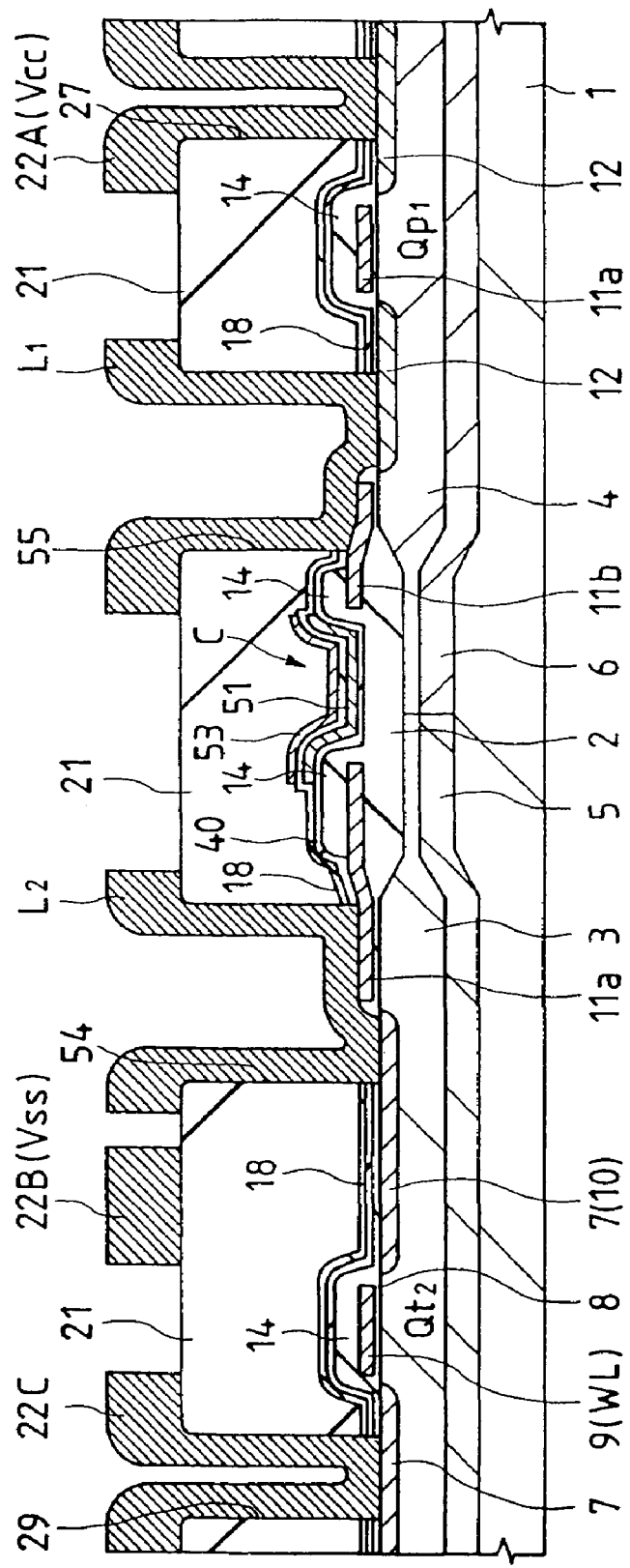
FIG. 50 is a section of an essential portion of the semiconductor substrate and shows the third manufacturing process of the memory cell of the SRAM of the present invention.
Figure 51:
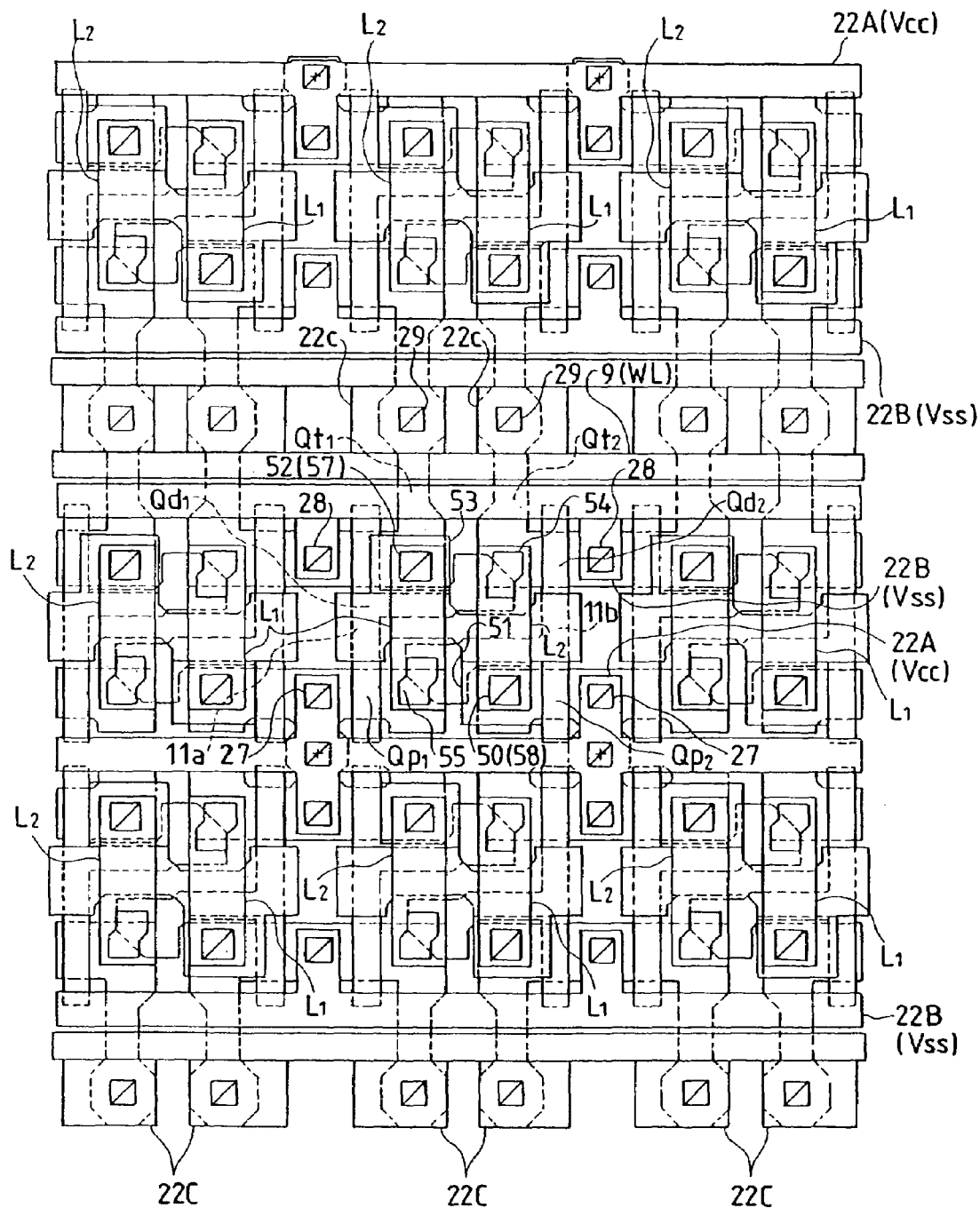
FIG. 51 is a section of an essential portion of the semiconductor substrate and shows the third manufacturing process of the memory cell of the SRAM of the present invention.

Next, as shown in FIGS. 50 and 51, the Al alloy film deposited on the interlayer insulating film 21 by sputtering is patterned to form the local wiring lines $L_1$ and $L_2$, the power voltage line 22A, the reference voltage line 22B and the pad layers 22C.

As a result, one end portion of one local wiring line $L_2$ is connected through the contact hole 54 to the gate electrode 11a common to the driver MISFET $Qd_1$ and the load MISFET $Qp_1$ and the drain region (the n-type semiconductor region 10 and the storage node B) of the driver MISFET $Qd_2$, and the other end portion of the local wiring line $L_2$ is connected through the contact hole 58 to the lower electrode 51 and through the contact hole 50 to the drain region (the p-type semiconductor region 12) of the load MISFET $Qp_2$. In other words, the drain region (the n-type semiconductor region 10 and the storage node B) of the driver MISFET $Qd_2$, the drain region (the p-type semiconductor region 12) of the load MISFET $Qp_2$, and the gate electrode 11a common to the driver MISFET $Qd_1$ and the load MISFET $Qp_1$ are connected to each other through the local wiring line $L_2$ and the lower electrode 51.

One end portion of the other local wiring line $L_1$ is connected through the contact hole 55 to the gate electrode 11b common to the driver MISFET $Qd_2$ and the load MISFET $Qp_2$ and the drain region (the p-type semiconductor region 12) of the load MISFET $Qp_1$, and the other end portion of the local wiring line $L_1$ is connected through the contact hole 57 to the upper electrode 53, and further connected through the contact hole 52 to the drain region (the n-type semiconductor region 10 and the storage node A) of the driver MISFET $Qd_1$. In other words, the drain region (the n-type semiconductor region 10 and the storage node A) of the driver MISFET $Qd_1$, the drain region (the p-type semiconductor region 12) of the load MISFET $Qp_1$, and the gate electrode 11b common to the driver MISFET $Qd_2$ and the load MISFET $Qp_2$ are connected to each other through the local wiring line $L_1$ and the upper electrode 53.

The power voltage line 22A is connected through the contact hole 27 to the source regions (the p-type semiconductor region 12) of the load MISFETs $Qp_1$ and $Qp_2$, and the reference voltage line 22B is connected through the contact hole 28 to the source regions (the n-type semiconductor region 10) of the driver MISFETs $Qd_1$ and $Qd_2$. Moreover, one of the paired pad layers 22C is connected through the contact hole 29 with the drain region (or the n-type semiconductor region 7) of the transfer MISFET $Qt_1$, whereas the other is connected through the contact hole 29 with the drain region (or the n-type semiconductor region 7) of the transfer MISFET $Qt_2$.

Figure 52:
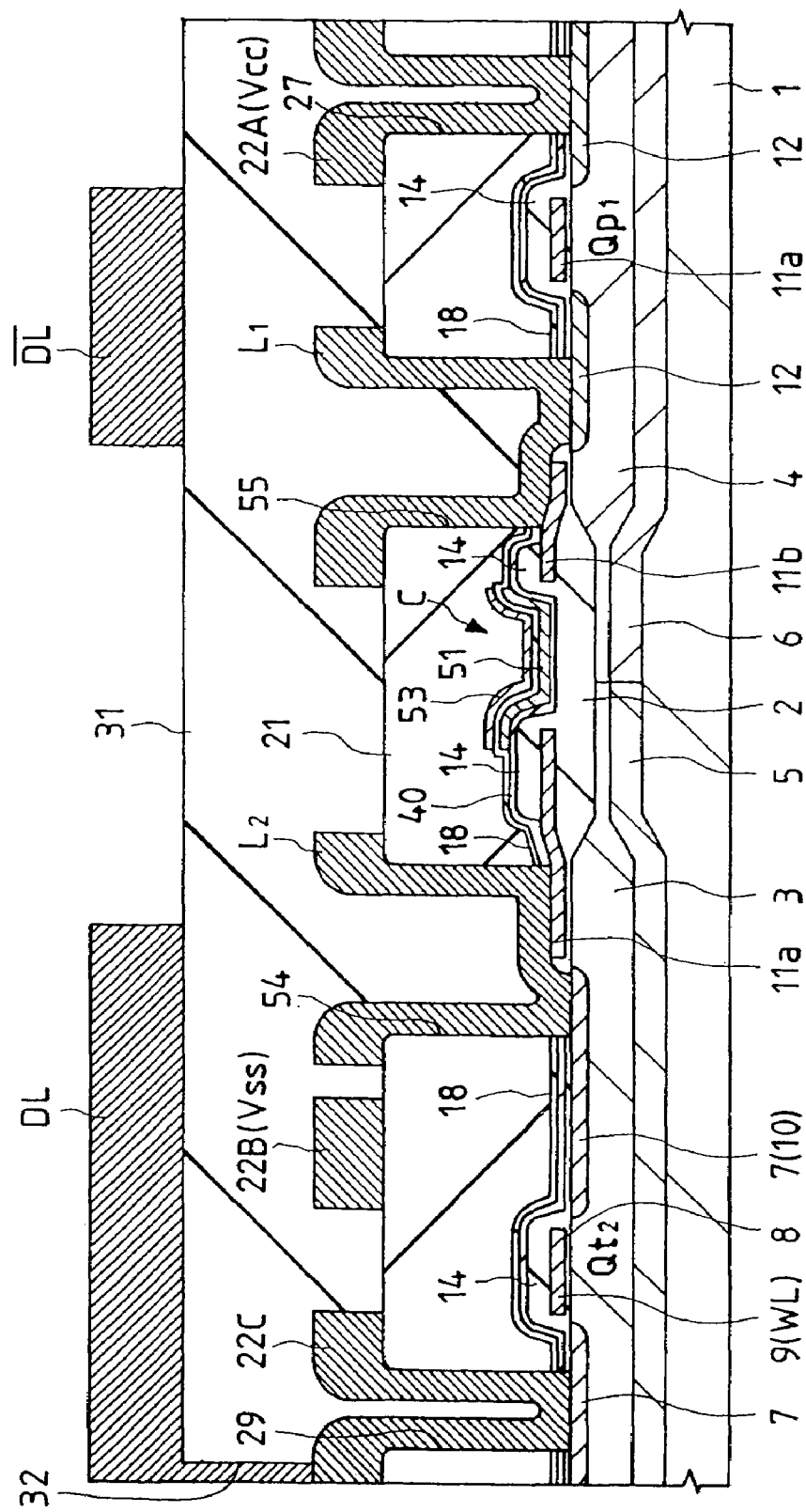
FIG. 52 is a top plan view of the semiconductor substrate and shows the third manufacturing process of the memory cell of the SRAM of the present invention.

After this, as shown in FIG. 52, the contact hole 32 is made in the interlayer insulating film 31 which is composed of a silicon oxide film deposited by a CVD method. After this, the Al alloy film deposited on the interlayer insulating film 31 by sputtering is patterned to form the data lines DL and /DL, which are connected to the pad layers 22C through the contact hole 32.

Figure 53:
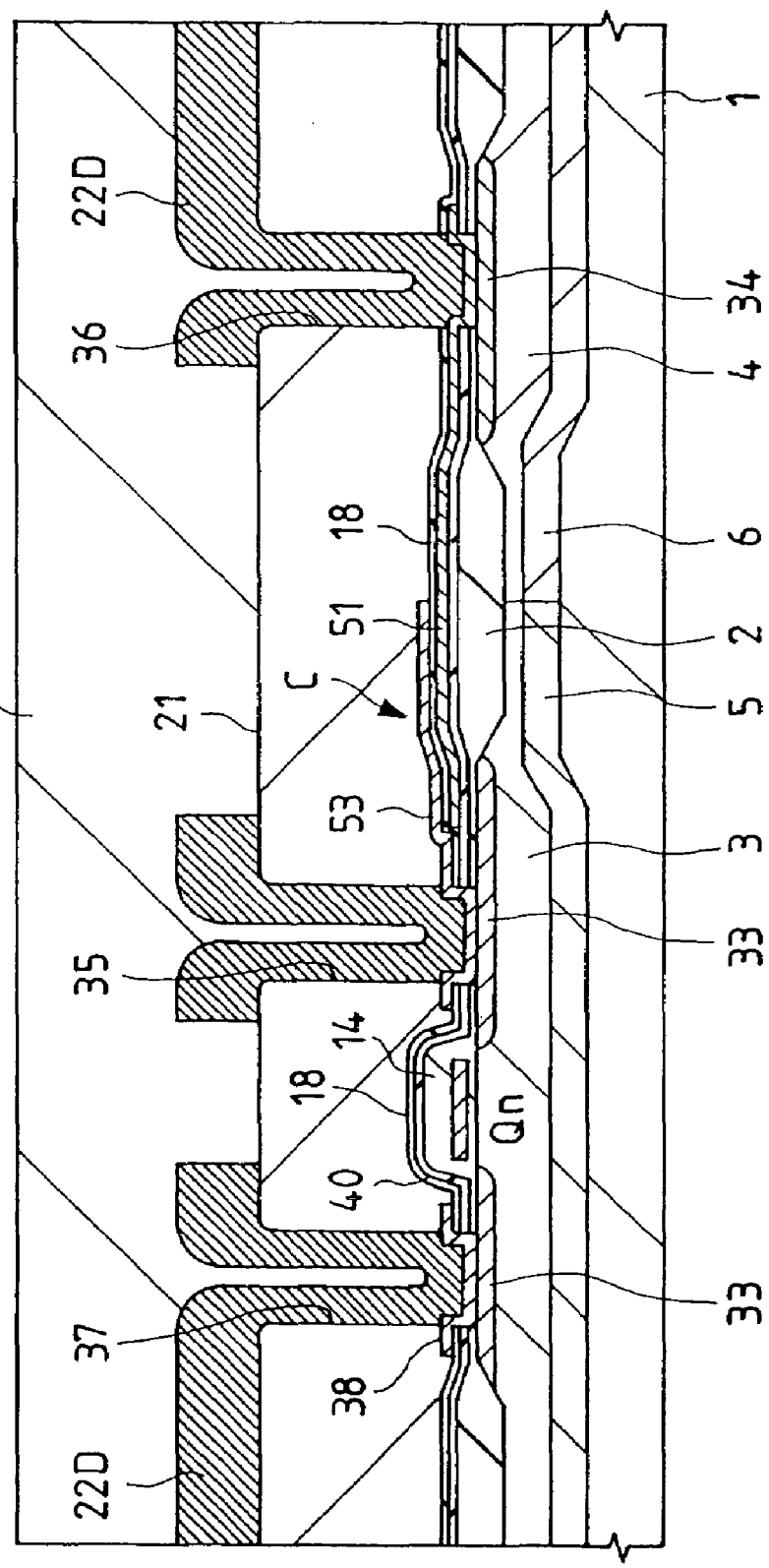
FIG. 53 is a section of an essential portion of the semiconductor substrate and shows of the periphery circuit of the SRAM of the present invention.

In the peripheral circuit such as the input/output protective circuit of the SRAM of the present embodiment, as shown in FIG. 53, there is formed the capacitor element C which has substantially the same structure as that of the capacitor element C of the aforementioned memory cells. The lower electrode 51 of this capacitor element C is composed of the second-level layer p-type polycrystalline silicon film in the same step as that of the lower electrode 51 of the capacitor element C of the memory cells. The capacitor insulating film 18 is composed of a silicon nitride film in the same step as that of the capacitor insulating film 18 of the capacitor element C of the memory cells. The upper electrode 53 is composed of the third-level layer n-type polycrystalline silicon film in the same step as that of the upper electrode 53 of the capacitor element C of the memory cells.

The lower electrode 51 of this capacitor element C is connected to the p-type semiconductor region 34 of the n-type well 4, and further to the wiring line 22D through the contact hole 36 made in the interlayer insulating film 21. The upper electrode 53 is connected to the n-type semiconductor region 33 of the n-channel type MISFETs Qn, and further to the wiring line 22D through the contact hole 35 made in the interlayer insulating film 21. Another n-type semiconductor region 33 of the n-channel type MISFETs Qn is connected to the wiring line 22D through the same third-level layer n-type polycrystalline silicon film as that of the upper electrode 53 of the capacitor element C. In the present embodiment, the second-level layer polycrystalline silicon film is of p-type, so that the p-type semiconductor region of the p-channel type MISFETs of the peripheral circuit (not shown), and the wiring lines can be connected through the pad layers which are composed of that p-type polycrystalline silicon film.

Although the invention has been specifically described in connection with its embodiments, it should not be limited thereto but can naturally be modified in various manners without departing from the gist thereof.

Embodiment 4

The process for manufacturing the memory cells of the SRAM of the present embodiment will be described with reference to FIGS. 54 to 64. Incidentally, of the individual Figures showing the memory cell manufacturing process, the top plan views show only the conductive films and the contact holes but not the insulating films.

First of all, as shown in FIG. 54, the driver MISFETs $Qd_1$ and $Qd_2$, the load MISFETs $Qp_1$ and $Qp_2$ and the transfer MISFETs $Qt_1$ and $Qt_2$ are formed, and a silicon nitride film 40 is deposited thereon.

Specifically, the gate electrodes (the word line WL) of the transfer MISFETs $Qt_1$ and $Qt_2$, the gate electrode 11a common to the load. MISFET $Qp_1$ and the driver MISFET $Qd_1$, and the gate electrode 11b common to the load MIS- FET $Qp_2$ and the driver MISFET $Qd_2$ are formed on the principal faces of the active regions of the p-type well 3 and the n-type well 4. After this, the silicon oxide film 14 over the gate electrodes 11a and 11b is partially etched and thinned by using a photoresist as the mask. Subsequently, the side wall spacers 13 are formed on the side walls of the gate electrode 9 (the word line WL) and the gate electrodes 11a and 11b. After this, by ion implantation using a photoresist as the mask, the n-type semiconductor region 7 (the source and drain regions of the transfer MISFETs $Qt_1$, and $Qt_2$) and the n-type semiconductor region 10 (the source and drain regions of the driver MISFETs $Qd_1$ and $Qd_2$) are formed in the p-type well 3, and the p-type semiconductor region 12 (the source and drain regions of the load MISFETs $Qp_1$ and $Qp_2$) is formed in the n-type well 4. After this, the silicon nitride film 40 is deposited on the semiconductor substrate 1 by a CVD method.

Figure 56:
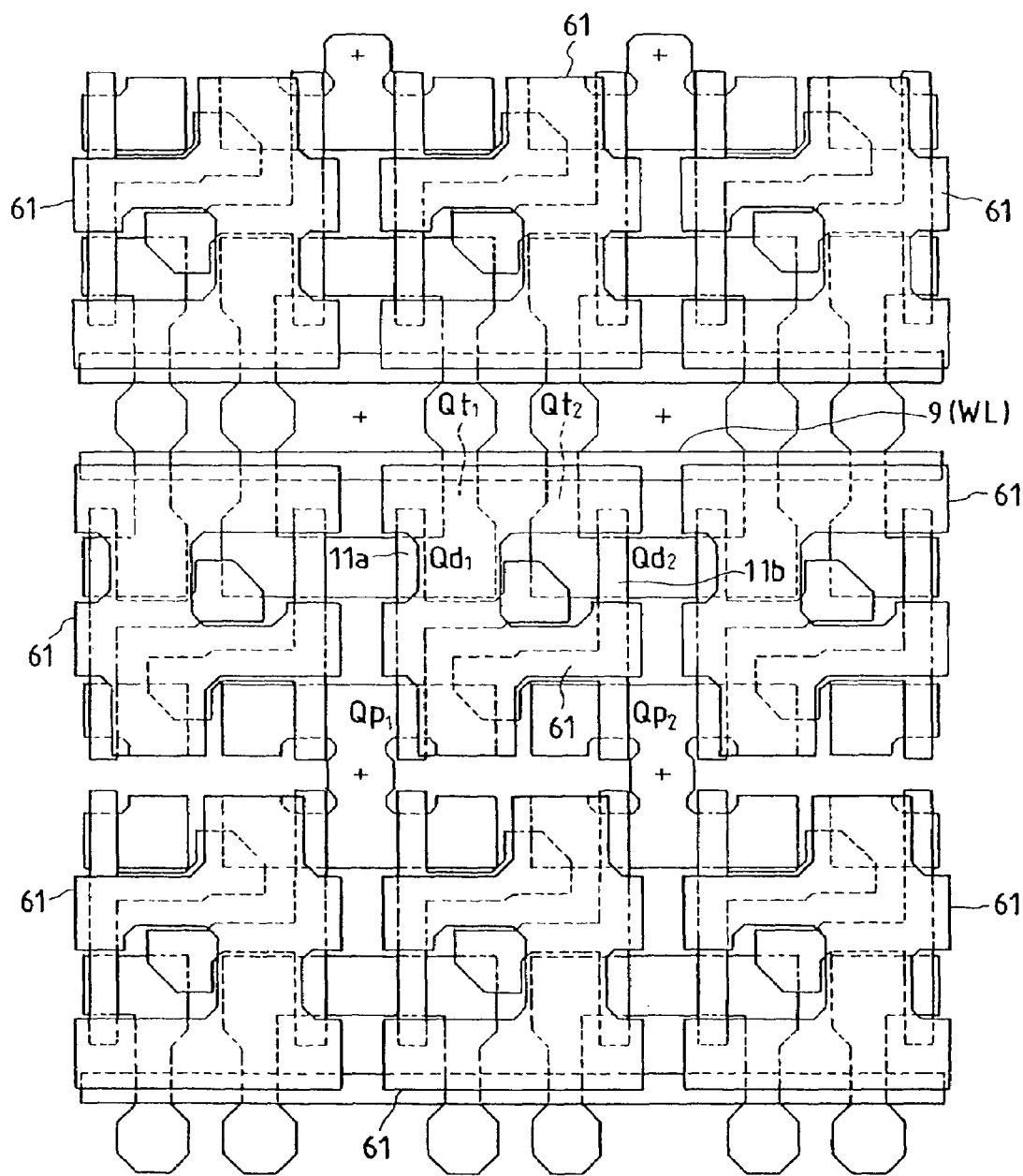
FIG. 56 is a top plan view of the semiconductor substrate and shows the fourth manufacturing process of the memory cell of the SRAM of the present invention.

Next, as shown in FIGS. 55 and 56, the n-type polycrystalline silicon film deposited over the silicon nitride film 40 by the CVD method is patterned to form the lower electrode 61 of the capacitor element C. This lower electrode 61 is different in pattern from the lower electrode 41 of the foregoing Embodiment 2, and part of the lower electrode 61 covers the drain region (the n-type semiconductor region 10) of the driver MISFET $Qd_1$ and the drain region (the p-type semiconductor region 12) of the load MISFET $Qp_1$, as shown in FIG. 56.

Figure 57:
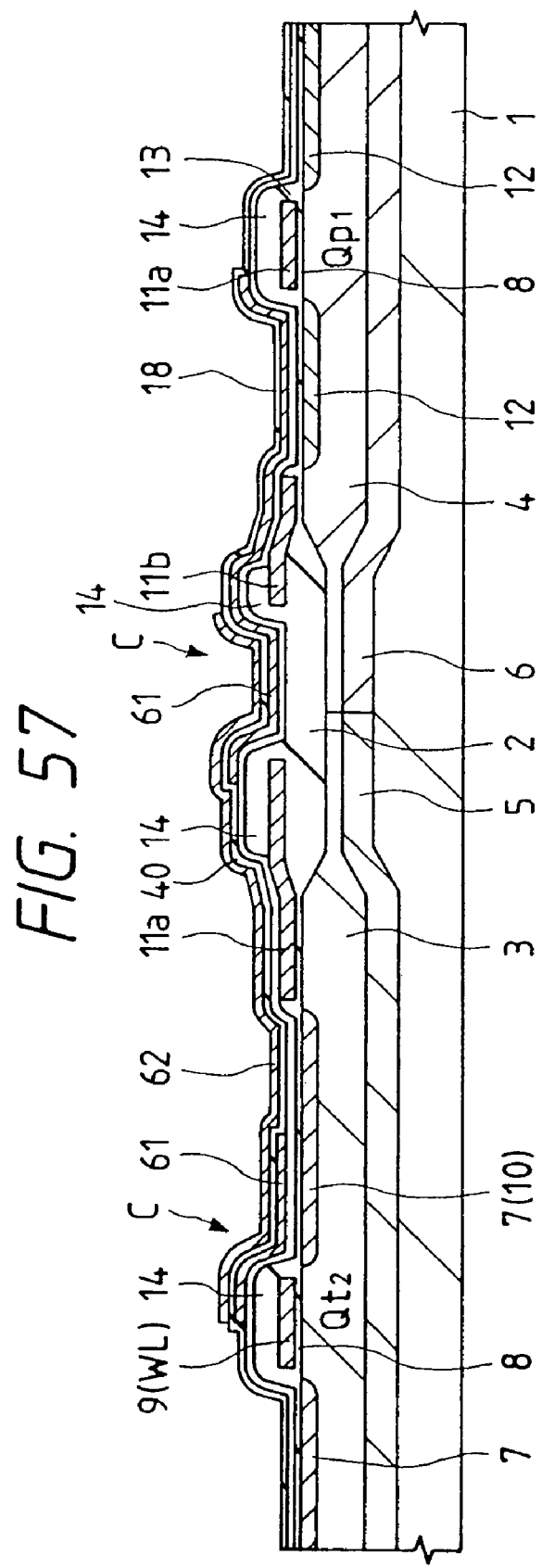
FIG. 57 is a section of an essential portion of the semiconductor substrate and shows the fourth manufacturing process of the memory cell of the SRAM of the present invention.
Figure 58:
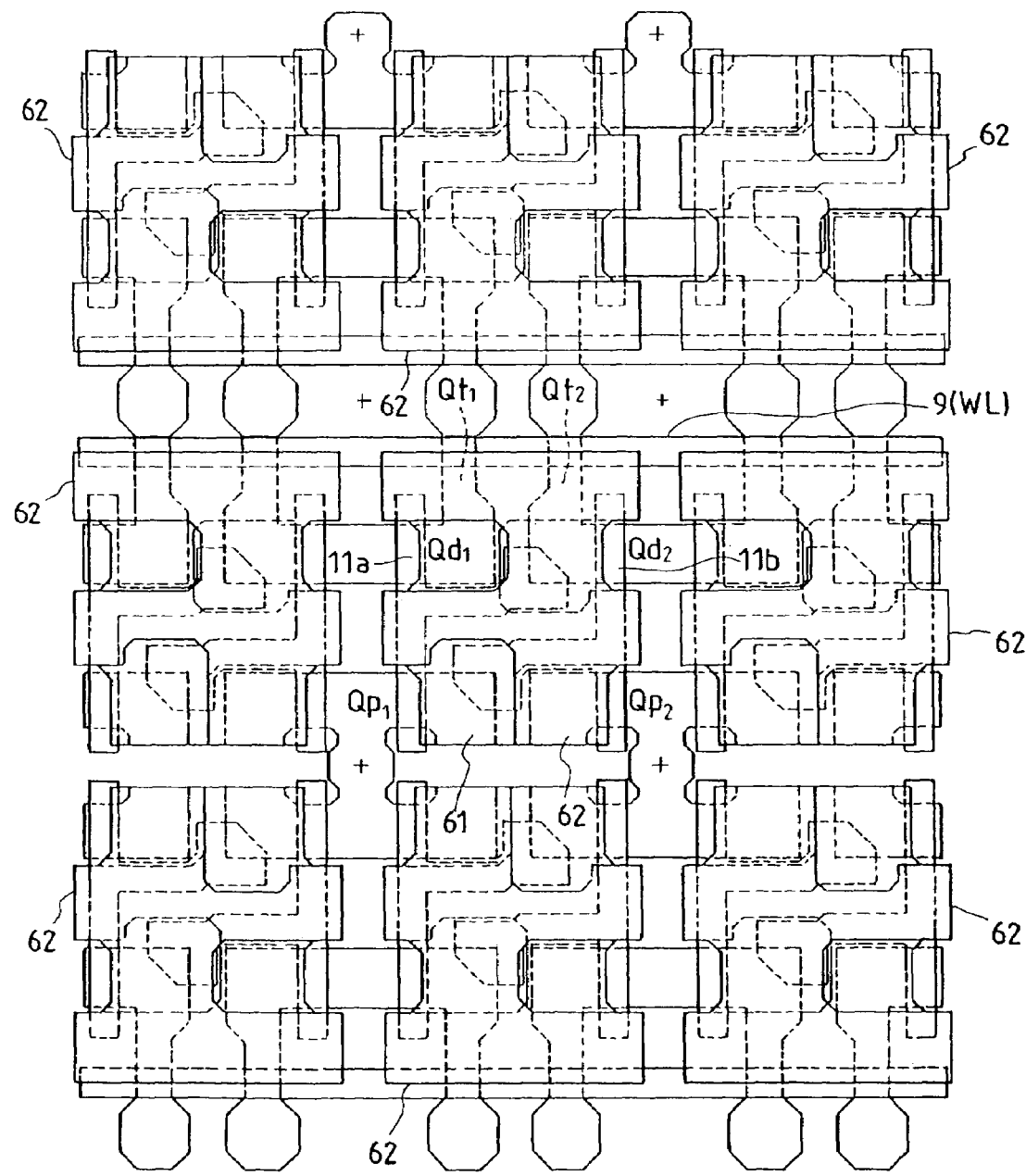
FIG. 58 is a top plan view of the semiconductor substrate and shows the fourth manufacturing process of the memory cell of the SRAM of the present invention.
Figure 59:
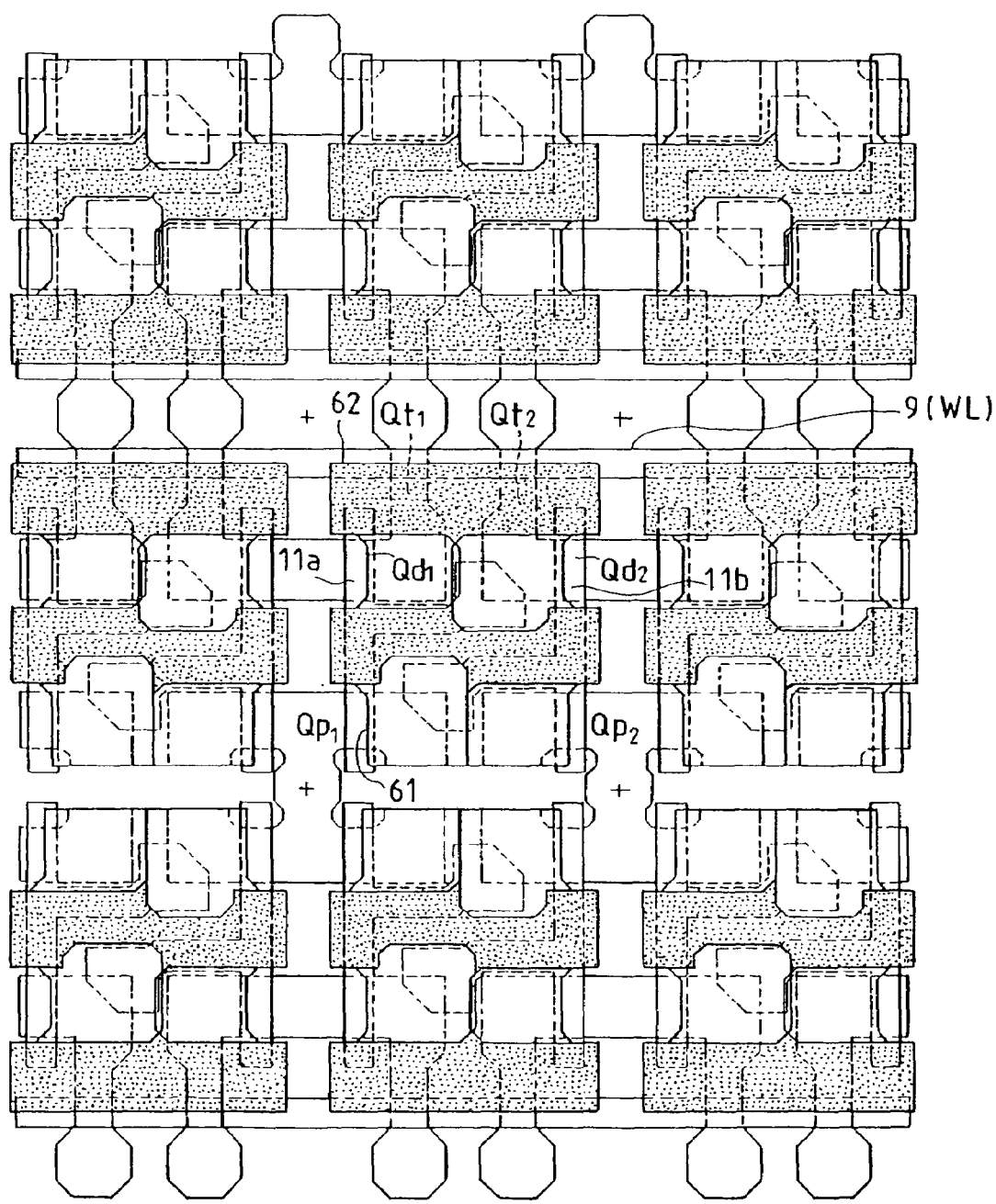
FIG. 59 is a top plan view of the semiconductor substrate and shows the fourth manufacturing process of the memory cell of the SRAM of the present invention.

Next, as shown in FIGS. 57 and 58, the capacitor insulating film 18 of a silicon nitride film is deposited by a CVD method. The n-type polycrystalline silicon film deposited on the capacitor insulating film 18 by the CVD method is patterned to form the upper electrode 62 of the capacitor element C. This upper electrode 62 is different in pattern from the upper electrode 42 of the foregoing embodiment, and part of the upper electrode 62 covers the drain region (the n-type semiconductor region 10) of the driver MISFET $Qd_2$ and the drain region (the p-type semiconductor region 12) of the load MISFET $Qp_2$, as shown in FIG. 58. The regions indicated by the gray patterns of FIG. 59 are the ones (where the capacitor element C of the embodiment is to be formed) where the lower electrodes 61 and the upper electrodes 62 overlap with each other.

Figure 60:
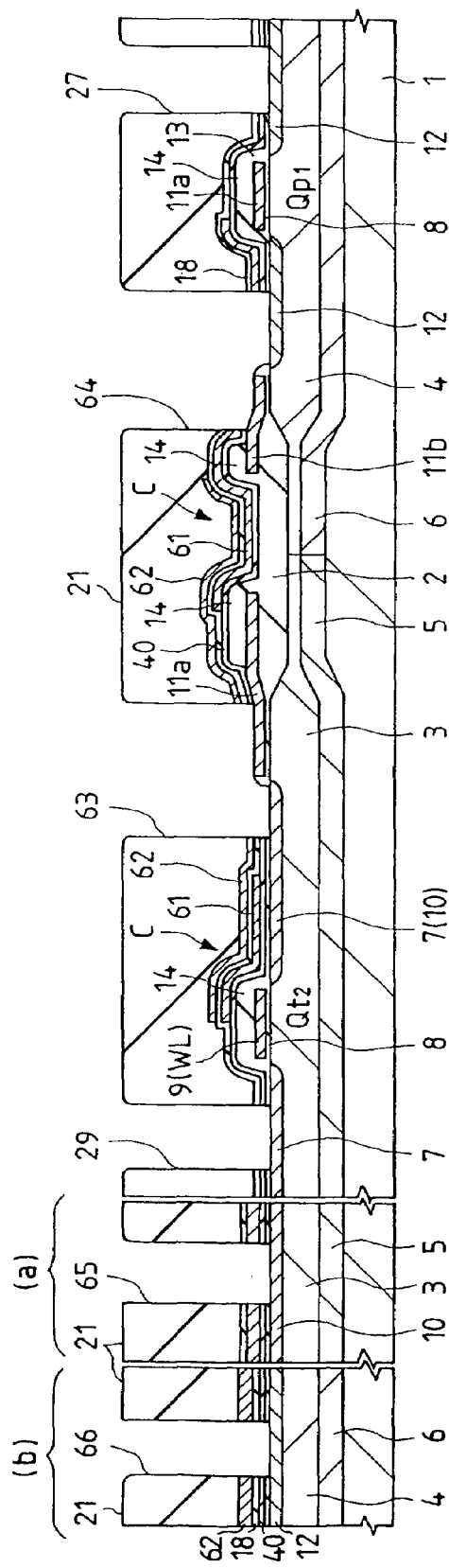
FIG. 60 is a section of an essential portion of the semiconductor substrate and shows the fourth manufacturing process of the memory cell of the SRAM of the present invention.
Figure 61:
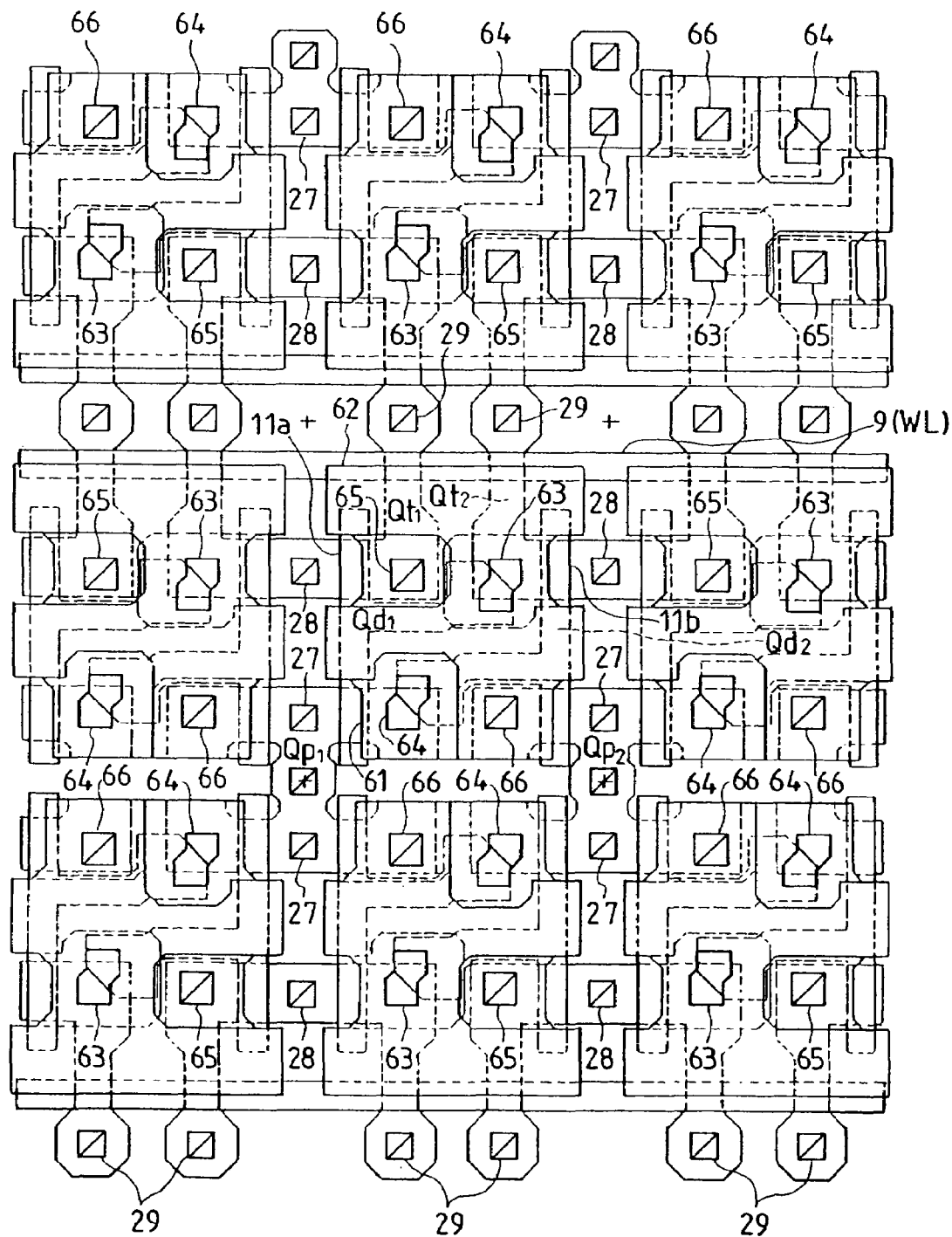
FIG. 61 is a top plan view of the semiconductor substrate and shows the fourth manufacturing process of the memory cell of the SRAM of the present invention.

Next, as shown in FIGS. 60 and 61, the interlayer insulating film 21 of a BPSG film is deposited by a CVD method, and its surface is flattened by reflow. After this, using a photoresist as a mask, the interlayer insulating film 21 is etched, and then the upper electrode 62 underlying the interlayer insulating film 21, the capacitor insulating film 18, the lower electrode 61, the silicon nitride film 40, the silicon oxide film 14 and the insulating film (insulating film in the same layer as that of the gate insulating film 9) is etched, to make the contact hole 27 reaching the source regions (or the p-type semiconductor region 12) of the load MISFETs $Qp_1$ and $Qp_2$, the contact hole 28 reaching the source regions (the n-type semiconductor region 10) of the driver MISFETs $Qd_1$ and $Qd_2$, the contact hole 29 reaching the source regions (the n-type semiconductor region 7) of the transfer MISFETs $Qt_1$ and $Qt_2$, a contact hole 63 reaching the gate electrode 11a common to the load MISFET $Qp_1$ and the driver MISFET $Qd_1$ and the drain region (the n-type semiconductor region 10) of the driver MISFET $Qd_2$, a contact hole 64 reaching the gate electrode 11b common to the load MISFET $Qp_2$ and the driver MISFET $Qd_2$ and the drain region (the p-type semiconductor region 12) of the load MISFET $Qp_1$, a contact hole 65 reaching the drain region (the n-type semiconductor region 10) of the driver MISFET $Qd_1$, and a contact hole 66 reaching the drain region (the p-type semiconductor region 12) of the load MISFET $Qp_2$. Portion (a) of FIG. 60 shows a section of the portion of the contact hole 65, and portion (b) of FIG. 60 shows a section of the portion of the contact hole 66.

The aforementioned contact hole 63 extends through a portion of the upper electrode 62 and reaches the gate electrode 11a and the drain region (the n-type semiconductor region 10), so that the upper electrode 62 is partially exposed from the side wall of the contact hole 63, as shown in FIG. 60. Moreover, the contact hole 66 also extends through a portion of the upper electrode 62 and reaches the drain region (the n-type semiconductor region 12), so that the upper electrode 62 is partially exposed from the side wall of the contact hole 63. Moreover, the contact hole 64 extends through a portion of the lower electrode 61 and reaches the gate electrode 11 and the drain region (the n-type semiconductor region 12), so that the lower electrode 61 is partially exposed from the side wall of the contact hole 64, as shown in FIG. 60. Moreover, the contact hole 65 also extends through a portion of the lower electrode 61 and reaches the drain region (the n-type semiconductor region 10), so that the lower electrode 61 is partially exposed from the side wall of the contact hole 65.

Incidentally, the gate electrode 11a is partially exposed from the bottom of the contact hole 63, and the gate electrode 11b is partially exposed from the bottom of the contact hole 64. Since, however, the silicon oxide film 14 over the gate electrodes 11a and 11b in this region is thinned in advance, as described hereinbefore, the gate electrodes 11a and 11b can be exposed by etching for a short time, providing effects similar to those of the foregoing Embodiment 2.

Figure 62:
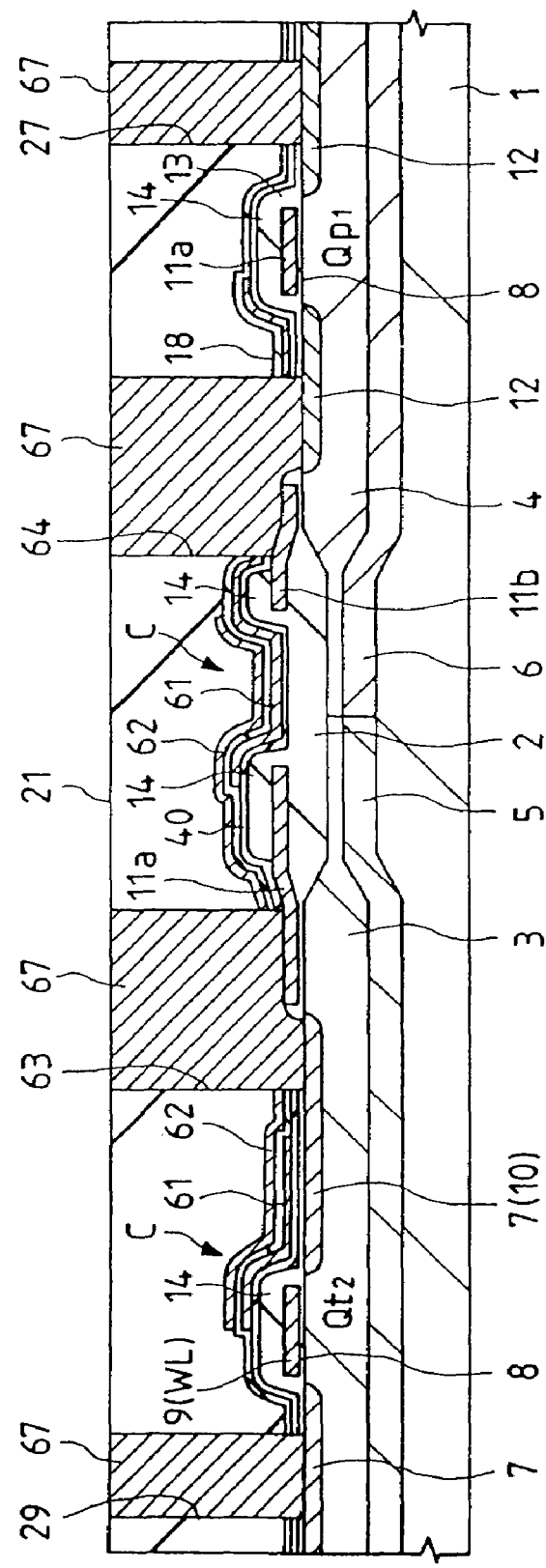
FIG. 62 is a section of an essential portion of the semiconductor substrate and shows the fourth manufacturing process of the memory cell of the SRAM of the present invention.

Next, as shown in FIG. 62, a tungsten (W) film deposited on the interlayer insulating film 21 by sputtering or by a CVD method is etched back to bury a W film 67 in the aforementioned contact holes 63 to 66.

Since the upper electrode 62 is partially exposed from the side wall of the contact hole 62 and the side wall of the contact hole 66, as described hereinbefore, the drain region (the n-type semiconductor region 10 and the storage node B) of the driver MISFET $Qd_2$, the drain region (the p-type semiconductor region 12) of the load MISFET $Qp_2$, and the gate electrode 11a common to the driver MISFET $Qd_1$ and the load MISFET $Qp_1$ are connected to each other through the W film buried in the contact holes 63 and 66 and the upper electrode 62.

Since, moreover, the lower electrode 61 is partially exposed from the side wall of the contact hole 64 and the side wall of the contact hole 65, the drain region (the n-type semiconductor region 10 and the storage node A) of the driver MISFET $Qd_1$, the drain region (the p-type semiconductor region 12) of the load MISFET $Qp_1$, and the gate electrode 11b common to the driver MISFET $Qd_2$ and the load MISFET $Qp_2$ are connected to each other through the W film 67 which are buried in the contact holes 64 and 65 and the lower electrode 61.

Figure 63:
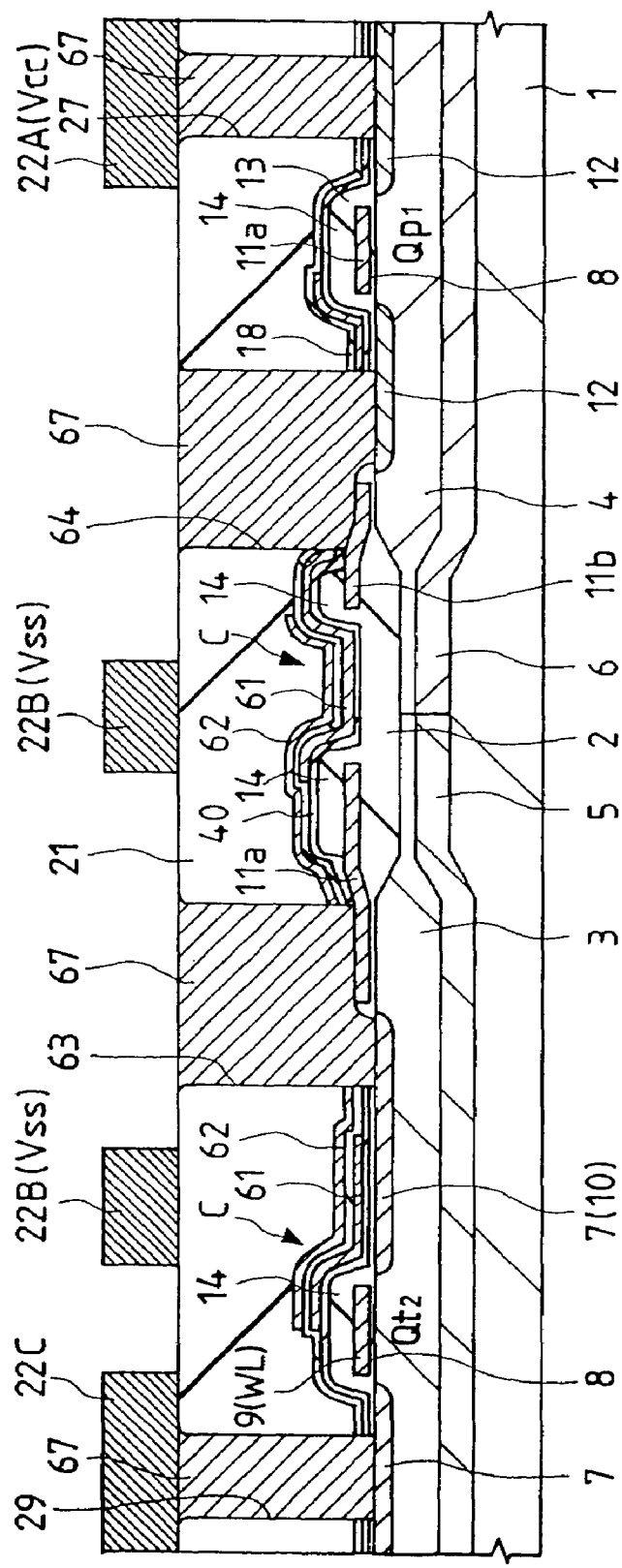
FIG. 63 is a section of an essential portion of the semiconductor substrate and shows the fourth manufacturing process of the memory cell of the SRAM of the present invention.

Thus, in the foregoing Embodiments 1 to 3, the local wiring lines ($L_1$ and $L_2$) are composed of the Al alloy film which is deposited on the interlayer insulating film 21 by sputtering. In the present embodiment, on the other hand, the W film 67 buried in the contact holes 63 to 66, and the upper electrode 62 and the lower electrode 61 of the capacitor element C are utilized as the local wiring lines. As a result, when the power voltage line 22A, the reference voltage line 22B and the pad layers 22C are formed of the Al alloy film which is deposited on the interlayer insulating film 21, as shown in FIG. 63, other wiring lines (e.g., the wiring lines for reinforcing the reference voltage line and the power voltage line, and the divided word lines) can be arranged in the regions, in which the local wiring lines are arranged in the foregoing Embodiments 1 to 3, improving the operation reliability of the memory cells and the degree of freedom of designing the wiring lines.

Figure 64:
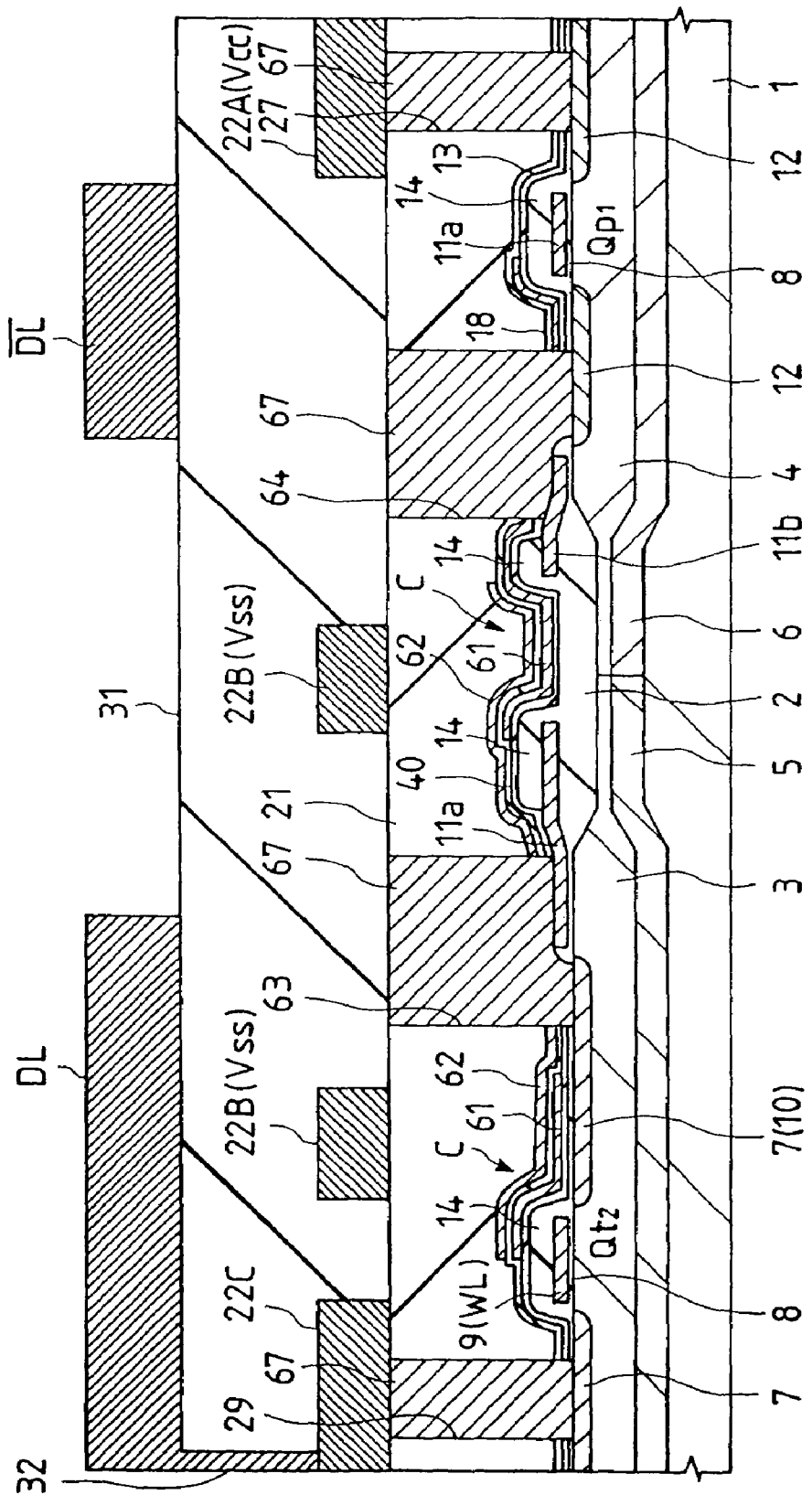
FIG. 64 is a section of an essential portion of the semiconductor substrate and shows the fourth manufacturing process of the memory cell of the SRAM of the present invention.

After this, the contact hole 32 is made in the interlayer insulating film 31 which is composed of a silicon oxide film deposited by the CVD method, as shown in FIG. 64. After this, The Al alloy film deposited on the interlayer insulating film 31 by sputtering is patterned to form the data lines DL and /DL and to connect the data lines DL and /DL and the pad layers 22C through the contact hole 32.

Incidentally, in the present embodiment, the W film is buried in the contact holes 63 to 66, but a metallic material other than W may also be buried. The metal to be buried at this time in the contact holes 63 to 66 has to be selected from those which are hard to erode by the dry etching treatment when the Al alloy film deposited on the interlayer insulating film 21 is patterned to form the power voltage line 22A, the reference voltage line 22B and the pad layers 22C. Since, moreover, the bottoms of the contact holes 63 to 66 are in contact with the semiconductor region (the n-type semiconductor region 10 or the p-type semiconductor region 12), the metal to be buried in the contact holes 63 to 66 has to be selected from those in which impurities in the semiconductor region are hard to diffuse. However, these requirement are ignored when a metal silicide layer in which the rate of diffusion of impurities is low is formed on the surface of the semiconductor region.

By using the upper electrode and the lower electrode of the capacitor element as the local wiring lines, according to the present invention, it is unnecessary to provide local wiring lines additionally and consequently other wiring lines can be arranged in the region where local wiring lines are provided, thereby improving the operation reliability of the memory cells and the degree of freedom of designing the wiring lines.

Although the invention made by the inventors has been specifically described in connection with its embodiments, it should not be limited thereto but can naturally be modified in various manners without departing from the gist thereof.

The effects obtained from a representative of the invention disclosed herein will be briefly described in the following.

According to the present invention, one of the electrodes of the capacitor element formed over the memory cell is connected to one storage node, whereas the other electrode is connected to the other storage node, so that sufficient charge is fed to the storage nodes through the capacitor element. As a result, even when the memory cell is miniaturized or even when the operation voltage is lowered, the potential fluctuation of the storage nodes due to alpha rays is suppressed, improving the soft error resistance of the memory cell.

By constructing the capacitor element of the peripheral circuit using the two-layered conductive film deposited on the semiconductor substrate, according to the present invention, the area occupied by the elements can be made smaller than that of the capacitor element using the diffusion layer (the pn junction) formed over the semiconductor substrate, so that the area of the peripheral circuit can be reduced and the degree of integration of the SRAM can be raised.

By connecting the semiconductor regions of the MISFETs and the wiring lines through the pad layers which are formed in the same step as that of the electrodes of the capacitor element, according to the present invention, the mask alignment margin at the time when the connection is made over the semiconductor region can be reduced by etching using a photoresist as the mask. Thus the area of the MISFETs can be reduced, and the degree of integration of the SRAM can be raised.

By thinning a portion of the insulating film covering the gate electrodes prior to the step of making contact holes reaching the gate electrodes, according to the present invention, the gate electrodes can be exposed by performing etching for a short time, so that the other regions can be prevented from being over-etched to prevent the erosion of the field insulating film. This makes it possible to improve the manufacturing yield and the reliability of the semiconductor integrated circuit device having the SRAM.

What is claimed is:

1. A semiconductor integrated circuit device comprising:
    a memory cell including a first n-channel MISFET, a second n-channel MISFET, a first p-channel MISFET, a second p-channel MISFET and a capacitor element,
    each of said first n-channel MISFET and said second n-channel MISFET having a gate electrode formed over a semiconductor substrate and extending over a channel forming region thereof,
    each of said first p-channel MISFET and said second p-channel MISFET having a gate electrode formed over said substrate and extending over a channel forming region thereof,
    a drain region of said first n-channel MISFET, a drain region of said first p-channel MISFET, said gate electrode of said second n-channel MISFET, and said gate electrode of said second p-channel MISFET being electrically connected to each other so as to form a first storage node, and
    a drain region of said second n-channel MISFET, a drain region of said second p-channel MISFET, said gate electrode of said first n-channel MISFET, and said gate electrode of said first p-channel MISFET being electrically connected to each other so as to form to a second storage node; and
    a first insulating film formed over said drain regions of said first and second n-channel MISFETs, said drain regions of said first and second p-channel MISFETs, said gate electrodes of said first and second n-channel MISFETs, and said gate electrodes of said first and second p-channel MISFETs so as to cover said drain regions of said first and second n-channel MISFETs, said drain regions of said first and second p-channel MISFETs, said gate electrodes of said first and second n-channel MISFETs, and said gate electrodes of said first and second p-channel MISFETs,
    wherein a first capacitor electrode of said capacitor element is formed over said first insulating film,
    wherein a second capacitor electrode of said capacitor element is formed over said first capacitor electrode,
    wherein a capacitor insulating film of said capacitor element is formed between said first capacitor electrode and said second capacitor electrode,
    wherein said first capacitor electrode is electrically connected to said first storage node, and
    wherein said second capacitor electrode is electrically connected to said second storage node.

2. A semiconductor integrated circuit device according to claim 1, wherein said memory cell is a memory cell of a static random access memory.

3. A semiconductor integrated circuit device comprising:
a memory cell including a first n-channel MISFET, a second n-channel MISFET, a first p-channel MISFET, a second p-channel MISFET and a capacitor element,
each of said first n-channel MISFET and said second n-channel MISFET having a gate electrode formed over a semiconductor substrate and extending over a channel forming region thereof,
each of said first p-channel MISFET and said second p-channel MISFET having a gate electrode formed over said substrate and extending over a channel forming region thereof,
a drain region of said first n-channel MISFET, one of a drain region and a source region of said first p-channel MISFET, and said gate electrode of said second n-channel MISFET being electrically connected to each other so as to form a first storage node, and
a drain region of said second n-channel MISFET, one of a drain region and a source region of said second p-channel MISFET, and said gate electrode of said first n-channel MISFET being electrically connected to each other so as to form to a second storage node; and
a first insulating film formed over said drain regions of said first and second n-channel MISFETs, said drain regions of said first and second p-channel MISFETs, said gate electrodes of said first and second n-channel MISFETs, and said gate electrodes of said first and second p-channel MISFETs so as to cover said drain regions of said first and second n-channel MISFETs, said drain regions of said first and second p-channel MISFETs, said gate electrodes of said first and second n-channel MISFETs, and said gate electrodes of said first and second p-channel MISFETs,
wherein a first capacitor electrode of said capacitor element is formed over said first insulating film,
wherein a second capacitor electrode of said capacitor element is formed over said first capacitor electrode,
wherein a capacitor insulating film of said capacitor element is formed between said first capacitor electrode and said second capacitor electrode,
wherein said first capacitor electrode is electrically connected to one of said first storage node and said second storage node, and
wherein said second capacitor electrode is electrically connected to the other of said first storage node and said second storage node.

4. A semiconductor integrated circuit device according to claim 3, wherein said memory cell is a memory cell of a static random access memory.

5. A semiconductor integrated circuit device, comprising:
a first n-channel MISFET and a second n-channel MISFET, each having a gate electrode formed over a main surface of a semiconductor substrate;
a first p-channel MISFET and a second p-channel MISFET, each having a gate electrode formed over said main surface;
a first insulating film formed over said gate electrodes of said first and second n-channel MISFETs and said gate electrodes of said first and second p-channel MISFETs; and
a capacitor element formed over said first insulating film,
wherein said capacitor element is comprised of a first conductive film formed over said first insulating film, a second conducive film formed over said first conductive film and an insulating film formed between said first conductive film and said second conductive film,
wherein said first conductive film is electrically connected to a source-drain path of said first n-channel MISFET, a source-drain path of said first p-channel MISFET and said gate electrodes of both said second n-channel MISFET and said second p-channel MISFET to form a first storage node,
wherein said second conductive film is electrically connected to a source-drain path of said second n-channel MISFET, a source-drain path of said second p-channel MISFET and said gate electrodes of both said first n-channel MISFET and said first p-channel MISFET to form a second storage node, and
wherein a memory cell of a static random access memory includes said first n-channel MISFET, said second n-channel MISFET, said first p-channel MISFET and said second p-channel MISFET.

6. A semiconductor integrated circuit device, comprising:
a memory cell of a static random access memory including a first n-channel MISFET, a second n-channel MISFET, a first p-channel MISFET, a second p-channel MISFET and a capacitor element,
each of said first and second n-channel MISFETs having a gate electrode formed over a semiconductor substrate and extending over a channel forming region thereof,
each of said first and second p-channel MISFETs having a gate electrode formed over said substrate and extending over a channel forming region thereof,
a drain region of said first n-channel MISFET, a drain region of said first p-channel MISFET, said gate electrode of said second n-channel MISFET, and said gate electrode of said second p-channel MISFET being electrically connected to each other so as to form to a first storage node,
a drain region of said second n-channel MISFET, a drain region of said second p-channel MISFET, said gate electrode of said first n-channel MISFET, and said gate electrode of said first p-channel MISFET being electrically connected to each other so as to form to a second storage node; and
a first insulating film formed over said drain regions of said first and second n-channel MISFETs, said drain regions of said first and second p-channel MISFETs, said gate electrodes of said first and second n-channel MISFETs, and said gate electrodes of said first and second p-channel MISFETs so as to cover said drain regions of said first and second n-channel MISFETs, said drain regions of said first and second p-channel MISFETs, said gate electrodes of said first and second n-channel MISFETs, and said gate electrodes of said first and second p-channel MISFETs,
wherein a first capacitor electrode of said capacitor element is formed over said first insulating film,
wherein a second capacitor electrode of said capacitor element is formed over said first capacitor electrode so as to cover said first capacitor electrode,
wherein a capacitor insulating film of said capacitor element is formed between said first capacitor electrode and said second capacitor electrode,
wherein said first capacitor electrode is electrically connected to said first storage node, and
wherein said second capacitor electrode is electrically connected to said second storage node.

* * * * *